(12) United States Patent
MacPherson et al.

(10) Patent No.: US 7,469,638 B2
(45) Date of Patent: Dec. 30, 2008

(54) ELECTRONIC DEVICES AND PROCESSES FOR FORMING THE SAME

(75) Inventors: Charles Douglas MacPherson, Santa Barbara, CA (US); Dennis Damon Walker, Santa Barbara, CA (US); Matthew Stainer, Goleta, CA (US); Christopher Todd Knudson, Santa Barbara, CA (US); Gang Yu, Santa Barbara, CA (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 236 days.

(21) Appl. No.: 11/027,133

(22) Filed: Dec. 30, 2004

(65) Prior Publication Data

US 2006/0144276 A1 Jul. 6, 2006

(51) Int. Cl.
*B41L 39/00* (2006.01)
*H05L 51/30* (2006.01)

(52) U.S. Cl. .................. 101/483; 257/40; 396/428; 430/22; 428/99

(58) Field of Classification Search .................. 101/438, 101/487, 488, 32, 41; 438/29, 99
See application file for complete search history.

(56) References Cited

U.S. PATENT DOCUMENTS

| 4,356,429 | A | 10/1982 | Tang |
| 4,539,507 | A | 9/1985 | VanSlyke et al. |
| 5,247,190 | A | 9/1993 | Friend et al. |
| 5,317,169 | A | 5/1994 | Nakano et al. |
| 5,408,109 | A | 4/1995 | Heeger et al. |
| 6,440,877 | B1 | 8/2002 | Yamazaki et al. |
| 6,459,199 | B1 | 10/2002 | Kido et al. |
| 6,951,173 | B1 * | 10/2005 | Meissl et al. ............ 101/483 |
| 7,115,434 | B2 * | 10/2006 | Yamazaki et al. ......... 438/35 |
| 2001/0019782 | A1 | 9/2001 | Igarashi et al. |
| 2002/0121638 | A1 | 9/2002 | Grushin et al. |
| 2004/0119066 | A1 | 6/2004 | Han et al. |

FOREIGN PATENT DOCUMENTS

| EP | 1 191 612 A2 | 3/2002 |
| EP | 1 191 614 A2 | 3/2002 |
| JP | 2002-75640 | 3/2002 |
| JP | 2004-55159 | 2/2004 |
| JP | 2004-74076 | 3/2004 |
| WO | WO 02/02714 A2 | 1/2002 |
| WO | WO 02/15645 A1 | 2/2002 |
| WO | WO 02/31896 A2 | 4/2002 |

\* cited by examiner

*Primary Examiner*—Daniel J. Colilla
*Assistant Examiner*—Marissa Ferguson-Samreth
(74) *Attorney, Agent, or Firm*—John H. Lamming

(57) ABSTRACT

An electronic device includes an array. In one embodiment, a process for forming an electronic device includes the array, which includes electronic components, can include printing one or more layers as a series of segments onto a workpiece. In one embodiment, a process includes printing a layer onto the workpiece and at least one exposed portion of the chuck. In still another embodiment, a printing head is greater than 0.5 mm from the workpiece. In a further embodiment, "hybrid" printing can be used to help form a thicker layer having a relatively thinner width. In a further embodiment, processes can be used to reduce the likelihood of a stitching defect, nonuniformity of a layer across an array, or a combination thereof. A printing apparatus can be modified to achieve more flexibility in liquid compositions, temperatures or other conditions used in printing a layer.

29 Claims, 18 Drawing Sheets

ELECTRONIC DEVICES AND PROCESSES FOR FORMING THE SAME

BACKGROUND OF THE INVENTION

1. Field of the Invention

The invention relates generally to electronic devices and processes for forming the same, and more specifically, to electronic devices and processes for printing at least one layer for the electronic devices.

2. Description of the Related Art

Electronic devices, including organic electronic devices, continue to be more extensively used in everyday life. Examples of organic electronic devices include Organic Light-Emitting Diodes ("OLEDs"). A variety of deposition techniques can be used in forming layers used in OLEDs. Techniques for printing layers include ink-jet printing and continuous printing.

Ink-jet printing has been used extensively in the formation of full-color OLED displays due to its ability to dispense precise amounts of liquid. However, ink-jet printers may not be capable of printing the narrowest of lines. Ink-jet printers dispense liquids as drops. A 40 pL drop can be used, but has a diameter of approximately 41 microns. Even when using state-of-the-art ink-jet technology, a 10 pL drop has a diameter of approximately 26 microns. In addition to having a limited ability to print fine lines, a printing head for an ink-jet printer moves at a rate no greater than approximately 0.1 m/s. A typical printing speed is approximately 0.064 m/s. As a result, ink-jet printing is time consuming, leading to limited throughput of devices.

Additionally, ink-jet printers are limited in their ability to print a wide variety of liquid compositions. For example, the solid concentration of a liquid composition is typically in a range of 0.5 to 1.5 weight percent, with viscosities between 5 and 15 centipoise within a printing head. At higher concentrations (e.g., viscosities at 15 centipoise and higher), the nozzle for the ink-jet printer has an increased likelihood of clogging or not flowing properly. At lower solids concentrations, too much volume needs to be dispensed resulting in poor line width control.

Continuous printing is just starting to become used in printing layers for electronic devices. Continuous printing can be performed using a printing head having a nozzle. The diameter of the nozzle can be in a range of approximately 10 to 50 microns. However, when a liquid composition is printed over a planar substrate at substantially ambient conditions (e.g., when the ambient temperature is 20° C.), the liquid composition can laterally spread to a width of 100 microns or more, as seen from a plan view of the substrate, before the viscosity of the liquid composition is high enough to restrict further lateral spreading.

Multi-nozzle printing may also produce fabrication artifacts called stitching defects. FIG. 1 includes an illustration of an array 100 that may correspond to a display or a sensor array. When lines are printed in sets, the lines at the edges of each set have different shapes or thicknesses compared to lines further within the set. The difference causes stitching defects 120 that are similar to seams seen with fabrics when they are sewn together. The stitching defects 120 may be visible at the time of fabrication, when the electronic device including the array 100 is used, or both. For displays in particular, the stitching defects 120 greatly diminish the visual appearance of the display. Alternatively, a complicated driving scheme may be used to reduce effects (i.e., visual appearance) of the stitching defects 120 when the display is in use. In an extreme situation, even the complicated driving scheme may not be able to fully counter the effects of the stitching defects 120.

SUMMARY OF THE INVENTION

An electronic device includes an array. A process for forming an electronic device includes the array, which includes electronic components, wherein the process includes placing a workpiece within a printing apparatus. The process also includes continuously printing a first layer as a series of first segments onto the workpiece. From a plan view within the array, each of the first segments has a first side and a second side opposite the first side. As each specific first segment is continuously printed, another first segment generates a significant amount of a first vapor and lies closer to the first side of the specific first segment compared to the second side of the specific first segment. For a first portion of the array lying along the second side of the specific first segment, the first portion does not include any other first segment that generates a significant amount of the first vapor.

In another embodiment, an electronic device includes an array that includes a first set of first electronic components lying closest to a first side of the array, and a second set of second electronic components lying closest to a second side of the array, wherein the second side is opposite the first side. The array also includes a first layer within at least some of the electronic components, wherein the first layer is in a form of a series of first segments, wherein at least one of the first segments extends continuously from one of the first electronic components to one of the second electronic components. The array is substantially free of a stitching defect.

In still another embodiment, a process for forming an electronic device includes printing a first segment onto a workpiece, and printing a second segment onto the first segment, wherein the first and second segments have substantially a same composition.

In a further embodiment, a process for forming an electronic device includes placing a workpiece onto a chuck, and printing a layer onto the workpiece and at least one exposed portion of the chuck.

In still a further embodiment, a process for forming an electronic device includes placing a workpiece onto a chuck, and printing a layer onto a workpiece while a printing head is greater than 0.5 mm from the workpiece.

In yet a further embodiment, a process for forming an electronic device includes forming at least one first electrode over a workpiece and depositing a first layer over the at least one first electrode. The first layer includes a buffer layer, a charge-injecting layer, a charge-transport layer, a charge-blocking layer, or a combination thereof. The process also includes placing the workpiece onto a chuck with a printing apparatus, and maintaining the chuck at a temperature in a range of approximately 5 to 80° C. The process further includes continuously printing a first liquid composition onto the first layer along a first segment while the chuck is at the temperature in the range of approximately 5 to 80° C. The process still further includes curing the first liquid composition to form a first organic active layer. The process yet further includes continuously printing a second liquid composition onto the first layer along a second segment while the chuck is at the temperature in the range of approximately 5 to 80° C. The second liquid composition is different from the first liquid composition, and the second segment is substantially parallel to the first segment. The process includes curing the second liquid composition to form a second organic active layer. The process also includes continuously printing a third liquid composition onto the first layer along a third segment while the chuck is at the temperature in the range of approximately 5 to 80° C. The third liquid composition is different from each of the first and second liquid compositions, and the third segment is substantially parallel to the first segment. The process further includes curing the third liquid composition to form a third organic active layer. The process still further includes forming at least one second electrode over the first, second, and third organic active layers and the at least one first electrode.

The foregoing general description and the following detailed description are exemplary and explanatory only and are not restrictive of the invention, as defined in the appended claims.

BRIEF DESCRIPTION OF THE FIGURES

The invention is illustrated by way of example and not limitation in the accompanying figures.

Figure 1:
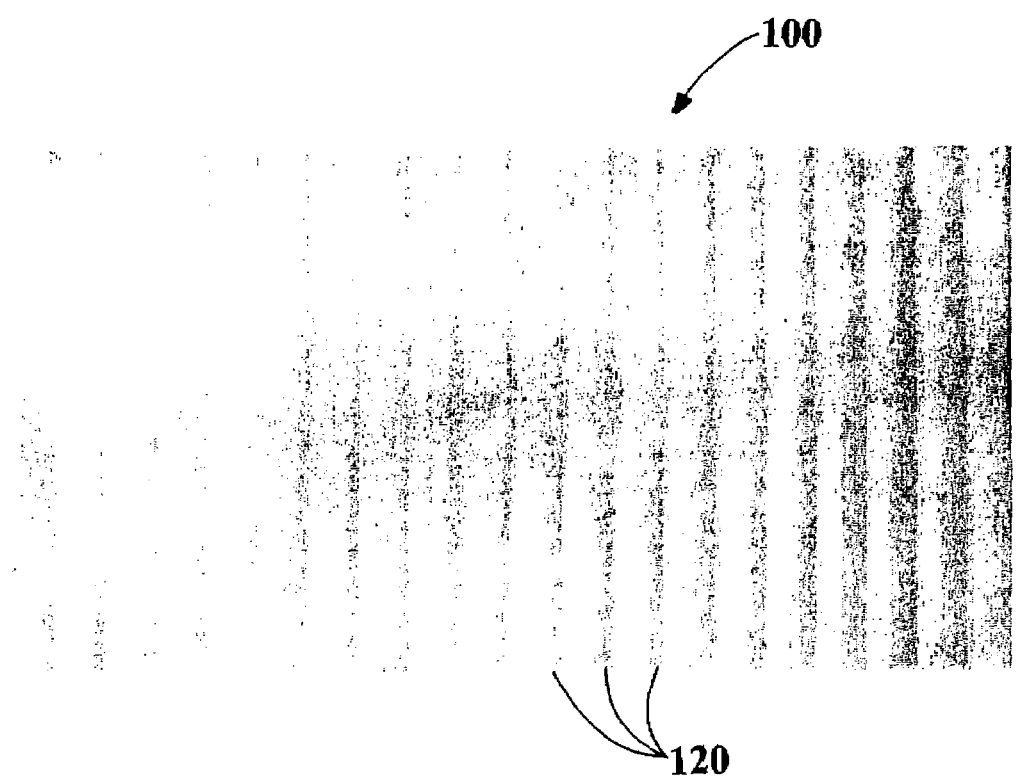
FIG. 1 includes an illustration of an example of stitching defects seen within an array of an electronic device.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

A process for forming an electronic device includes an array of electronic components, wherein the process includes placing a workpiece within a printing apparatus. The process also includes continuously printing a first layer as a series of first segments onto the workpiece. From a plan view within the array, each of the first segments has a first side and a second side opposite the first side. As each specific first segment is continuously printed, another first segment generates a significant amount of a first vapor and lies closer to the first side of the specific first segment compared to the second side of the specific first segment. For a first portion of the array lying along the second side of the specific first segment, the first portion does not include any other first segment that generates a significant amount of the first vapor.

In another embodiment, continuously printing is performed such that only one first segment is printed at a time.

In still another embodiment, the process further includes continuously printing a second layer as a series of second segments onto the workpiece, wherein the second layer has a different composition compared to the first layer. From a plan view within the array, each of the second segments has a first side and a second side opposite the first side. As each specific second segment is continuously printed, another second segment generates a significant amount of a second vapor and lies closer to the first side of the specific second segment compared to the second side of the specific second segment. For a second portion of the array lying along the second side of the specific second segment, the second portion does not include any other second segment that generates a significant amount of the second vapor. The process further includes continuously printing a third layer as a series of third segments onto the workpiece, wherein the third layer has a different composition compared to each of the first and second layers. From a plan view within the array, each of the third segments has a first side and a second side opposite the first side. As each specific third segment is continuously printed, another third segment generates a significant amount of a third vapor and lies closer to the first side of the specific third segment compared to the second side of the specific third segment, and for a third portion of the array lying on the second side of the specific third segment, the third portion does not include any other third segment that generates a significant amount of the third vapor.

In a specific embodiment, continuously printing is performed such that no more than only one first segment, only one second segment, and only one third segment are continuously printed simultaneously. In another specific embodiment, the first layer is a blue light-emitting layer, the second layer is a green light-emitting layer, and the third layer is a red light-emitting layer.

In a further embodiment, a set of the first segments is printed as dummy segments before reaching the array and after printing over the array. In still a further embodiment, the electronic device includes an electronic component, the electronic component includes an organic active layer, and the organic active layer includes the first layer.

In one embodiment, an electronic device includes an array that includes a first set of first electronic components lying closest to a first side of the array, and a second set of second electronic components lying closest to a second side of the array, wherein the second side is opposite the first side. The array also includes a first layer within at least some of the electronic components, wherein the first layer is in a form of a series of first segments, wherein at least one of the first segments extends continuously from one of the first electronic components to one of the second electronic components. The array is substantially free of a stitching defect.

In another embodiment, the electronic device further includes a second layer within at least some of the electronic components, wherein the second layer is in a form of a series of second segments, wherein at least one of the second segments extends continuously from one of the first electronic components to one of the second electronic components. The electronic device also includes a third layer within at least some of the electronic components, wherein the layer is in a form of a series of third segments, wherein at least one of the third segments extends continuously from one of the first electronic components to one of the second electronic components. In a specific embodiment, the first layer is a blue light-emitting layer, the second layer is a green light-emitting layer, and the third layer is a red light-emitting layer.

In still another embodiment, the electronic device further includes a well structure having openings, longitudinal portions and transverse portions. The longitudinal portions have lengths substantially parallel to the lengths of the first segments, and the transverse portions have lengths substantially perpendicular to the lengths of the first segments. The electronic device also includes a second layer lying within at least two openings and overlying at least one transverse portion lying between the at least two opening, wherein the first layer overlies the second layer. The electronic device further includes an electrode over the first and second layers, wherein the first layer substantially prevents the electrode from contacting the second layer over the at least one transverse portion.

In a further embodiment, the first layer is an organic active layer.

In one embodiment, a process for forming an electronic device includes printing a first segment onto a workpiece, and printing a second segment onto the first segment, wherein the first and second segments have substantially a same composition.

In another embodiment, as seen from a plan view, the first segment has a first length extending in a first direction, the second segment has a second length extending in a second direction, and the first and second directions are substantially a same direction. In a specific embodiment, the second segment is at least as thick as the first segment. In a more specific embodiment, from a plan view, a width of the second segment is narrower compared to a width of the first segment.

In another specific embodiment, the process further includes printing a third segment onto the second segment. The first, second, and third segments have substantially a same composition. A width of the second segment is narrower compared to a width of the first segment, and a width of the third segment is narrower compared to the width of the second segment.

In still another specific embodiment, the electronic device includes an electronic component. The electronic component includes an organic active layer, and the organic active layer includes the first segment.

In one embodiment, a process for forming an electronic device includes placing a workpiece onto a chuck, and printing a layer onto the workpiece and at least one exposed portion of the chuck.

In another embodiment, (1) the layer is printed onto the at least one exposed portion of the chuck before the layer is printed onto the workpiece, (2) the layer is printed onto the at least one exposed portion the chuck after the layer is printed onto the workpiece, or (3) the layer is printed onto the at least one exposed portion of the chuck before and after the layer is printed onto the workpiece.

In still another embodiment, the at least one exposed portion of the chuck and an exposed surface of the workpiece are at substantially a same elevation. In yet another embodiment, an elevation of the at least one exposed portion of the chuck is no more than approximately 2 mm from an elevation of an exposed surface of the workpiece. In yet another embodiment, the electronic device includes an electronic component. The electronic component includes an organic active layer, and the organic active layer includes the first layer.

In one embodiment, a process for forming an electronic device includes placing a workpiece onto a chuck, and printing a layer onto a workpiece while a printing head is greater than 0.5 mm from the workpiece.

In another embodiment, the printing head is no more than 0.9 mm from the workpiece. In still another embodiment, the printing head is no more than 2.0 mm from the workpiece. In yet another embodiment, the electronic device includes an electronic component. The electronic component includes an organic active layer, and the organic active layer includes the layer.

In one embodiment, a process for forming an electronic device includes forming at least one first electrode over a workpiece and depositing a first layer over the at least one first electrode. The first layer includes a buffer layer, a charge-injecting layer, a charge-transport layer, a charge-blocking layer, or a combination thereof. The process also includes placing the workpiece onto a chuck with a printing apparatus, and maintaining the chuck at a temperature in a range of approximately 5 to 80° C. The process further includes continuously printing a first liquid composition onto the first layer along a first segment while the chuck is at the temperature in the range of approximately 5 to 80° C. The process still further includes curing the first liquid composition to form a first organic active layer. The process yet further includes continuously printing a second liquid composition onto the first layer along a second segment while the chuck is at the temperature in the range of approximately 5 to 80° C. The second liquid composition is different from the first liquid composition, and the second segment is substantially parallel to the first segment. The process includes curing the second liquid composition to form a second organic active layer. The process also includes continuously printing a third liquid composition onto the first layer along a third segment while the chuck is at the temperature in the range of approximately 5 to 80° C. The third liquid composition is different from each of the first and second liquid compositions, and the third segment is substantially parallel to the first segment. The process further includes curing the third liquid composition to form a third organic active layer. The process still further includes forming at least one second electrode over the first, second, and third organic active layers and the at least one first electrode.

In another embodiment, the process further includes continuously printing the first liquid composition onto the first segment along a fourth segment while the chuck is at the temperature in the range of approximately 5 to 80° C., wherein the first and fourth segments have lengths that are substantially parallel to each other. In a specific embodiment, the first liquid composition has a solids content in a range of approximately 0.5 to 1.5 weight %. In another specific embodiment, the first segment has a thickness in a range of approximately 10 to 30 nm, and the fourth segment has a thickness equal to or greater than the thickness of the first segment.

In still another embodiment, the first liquid composition has a solids content of at least 2 weight %. In a specific embodiment, forming the first organic active layer consists essentially of the first segment.

In a further embodiment, the first liquid composition has a viscosity no greater than 5 centipoise. In still a further embodiment, the first liquid composition includes a liquid medium, wherein the liquid medium includes at least two solvents. In yet a further embodiment, the first liquid composition has a viscosity of at least 15 centipoise.

In another embodiment, the process further includes dispensing the first liquid composition through a nozzle having an opening with a diameter of at least 10 microns. In a specific embodiment, dispensing is performed at a volumetric flow rate in a range of approximately 50 to 300 microliters/min., and during continuously printing the first liquid composition, a printing head travels at a velocity of at least 2 m/s. In a more specific embodiment, during continuously printing the first liquid composition, the first liquid composition is at a pressure in a range of approximately 100 to 350 KPa within the printing head.

In still another embodiment, the printing apparatus has a printing head. During continuously printing the first liquid composition, a space between the printing head and the substrate is in a range of 0.9 micron to 2 mm. In a further embodiment, the printing apparatus further includes a printing head, wherein during continuously printing the first liquid composition, the printing head and the chuck are both moving. In still a further embodiment, the printing apparatus further includes a printing head, wherein during continuously printing the first liquid composition, the printing head, the chuck, or both are configured to allow motion along two different axes.

In another embodiment during continuously printing the first liquid composition, the workpiece does not include a liquid containment structure. In a specific embodiment, during continuously printing the first liquid composition, the workpiece includes a liquid containment structure. In a specific embodiment, the process further includes surface treating the liquid containment structure before during continuously printing the first liquid composition. In another specific embodiment, the liquid containment structures does not receive a surface treatment before during continuously printing the first liquid composition.

In still another embodiment, the process further includes continuously printing onto the chuck. In yet another embodiment, curing the first liquid composition, curing the second liquid composition, and curing the third liquid composition are performed at substantially a same time. In a further embodiment, depositing the first layer including depositing the first layer over substantially all of the workpiece. In still a further embodiment, depositing the first layer includes continuously printing the first layer.

In another embodiment, forming the at least one first electrode includes forming a plurality of first electrodes, wherein each electronic component within an array include one of the first electrodes. Forming the at least one second electrode including forming a common second electrode for the electronic components within the array. In still another embodiment, the first layer includes a conductive polymer.

In yet another embodiment, the process further includes forming a well structure over the workpiece after forming the at least one first electrode, wherein openings within the well structure expose portions of the at least one first electrode. Depositing the first layer includes depositing the first layer the first layer includes a conductive organic material within the openings and over portions of the well structure between the openings. Continuously printing the first, second, and third liquid compositions is performed such that the at least one second electrode does not contact the first layer.

In a further embodiment, the electronic device is a bottom emission electronic device. In a still a further embodiment, the electronic device is a top emission electronic device. In a specific embodiment, the process further includes forming power transmission lines that are connected to the at least first electrode, the at least one second electrode, or a combination thereof, wherein forming the power transmission lines is performed after forming the at least one first electrodes.

Other features and advantages of the invention will be apparent from the following detailed description, and from the claims. The detailed description first addresses Definitions and Clarification of Terms followed by, Continuous Printing Apparatus and Related Configurations, Liquid Compositions, Workpiece and Structures or Lack Thereof, Printing Lines, Considerations Involving More Than One Factor, Example, and Alternative Embodiments.

1. Definitions and Clarification of Terms

Before addressing details of embodiments described below, some terms are defined or clarified. The term "adjacent," does not necessarily mean that a layer, member or structure is immediately next to another layer, member or structure. A combination of layer(s), member(s) or structure(s) that directly contact each other are still adjacent to each other.

The term "air-sensitive," when referring to a layer or material, is intended to mean that such layer's performance or material's performance is reduced after being exposed to oxygen, moisture, or any combination thereof.

The term "ambient conditions" are intended to mean the conditions of a room in which humans are present. For example, the ambient conditions of a clean room within the microelectronics industry can include a temperature of approximately 20° C., relative humidity of approximately 40%, illumination using fluorescent light (with or without yellow filters), no sunlight (from outdoors), and laminar air flow.

The term "ambient temperature" is intended to mean a temperature of a room in which humans are present. For example, the ambient temperature of a clean room within the microelectronics industry is 20° C.

The term "ambient viscosity increase rate" is intended to mean a rate at which a viscosity of a liquid composition increases when exposed to ambient conditions.

The term "apparatus" is intended to mean a combination of one or more materials, equipment, system or subsystem, or any combination thereof designed for a particular use.

The terms "array," "peripheral circuitry" and "remote circuitry" are intended to mean different areas or components of the organic electronic device. For example, an array may include pixels, cells, or other structures within an orderly arrangement (usually designated by columns and rows). The pixels, cells, or other structures within the array may be controlled locally by peripheral circuitry, which may lie within the same organic electronic device as the array but outside the array itself. Remote circuitry typically lies away from the peripheral circuitry and can send signals to or receive signals from the array (typically via the peripheral circuitry). The remote circuitry may also perform functions unrelated to the array. The remote circuitry may or may not reside on the substrate having the array.

The term "bi-directional" is intended to refer to movement in both directions along a given axis.

The term "blanket," with respect to a layer, is intended to mean such layer covers or is deposited over substantially all of an exposed surface of an object (e.g., a substrate, a workpiece, etc.), a designated area (e.g., an array or a portion of substrate or workpiece underlying a showerhead, etc.), or a combination thereof.

The term "blue light-emitting layer" is intended to mean a layer capable of emitting radiation that has an emission maximum at a wavelength in a range of approximately 400 to 500 nm.

The term "bottom emission," when referring to a display or other electronic device, is intended to mean that (a) radiation from a radiation-emitting component is designed to be emitted through a substrate over which the radiation-emitting component is formed, (b) radiation to a radiation-responsive component is designed to be received through the substrate over which the radiation-responsive component is formed, or (c) any combination thereof.

The term "buffer layer" or "buffer material" is intended to mean one or more electrically conductive or semiconductive materials and may have one or more functions in an electronic device, including planarization of the underlying layer, a charge-transport or charge-injecting property, scavenging of one or more impurities, such as oxygen or metal ions, or another aspect to facilitate or to improve the performance of the electronic device. A buffer material may be a polymer, a solution, a dispersion, a suspension, an emulsion, a colloidal mixture, another composition, or any combination thereof.

The term "charge-blocking," when referring to a layer, material, member, or structure, is intended to mean such layer, material, member or structure significantly reduces the likelihood that a charge intermixes with another layer, material, member or structure.

The term "charge-injecting," when referring to a layer, material, member, or structure, is intended to mean such layer, material, member or structure promotes charge migration into an adjacent layer, material, member or structure.

The term "charge-transport," when referring to a layer, material, member or structure, is intended to mean such layer, material, member or structure facilitates migration of such charge through the thickness of such layer, material, member or structure with relative efficiency and small loss of charge.

The term "chuck" is intended to mean a mechanism for supporting, holding, or retaining a substrate or a workpiece. The chuck may include one or more pieces. In one embodiment, the chuck may include a combination of a stage and an insert, a platform, another similar component, or any combination thereof.

The term "conductive," when referring to a material, is intended to mean a material that allows a current to flow through the material. In one embodiment, a conductive material has a bulk resistivity no greater than approximately $10^{+6}$ ohm-cm.

The term "continuous" and its variants are intended to mean substantially unbroken. In one embodiment, continuously printing is printing using a substantially unbroken stream of a liquid or a liquid composition, as opposed to a depositing technique using drops. In another embodiment, extending continuously refers to a length of a layer, member, or structure in which no significant breaks in the layer, member, or structure lie along its length.

The term "cross linking" is intended to mean forming bonds that connect two adjacent chains of atoms in a complex molecule.

The term "cure" and its variants is intended to mean an act of exposing a layer, material, member, or structure to heat or radiation (e.g., UV radiation) to change the characteristics of such layer, material, member, or structure. In one embodiment, curing causes chemical bonds to form or break within a layer, material, member, or structure. In another embodiment, curing causes a liquid medium to evaporate while leaving a substantially solid layer, material, member, or structure The term "densifying," when referring to a layer, member, or structure is intended to mean rendering the layer, member, or structure into a state in which such layer, member, or structure is less susceptible to interactions with one or more materials that contacts or is otherwise exposed to such layer, member, or structure. Densification can include annealing, cross linking or other polymerization, curing, passivating (reducing the number of dangling bonds), or any combination thereof.

The term "dummy segment," when referring to a printed line, a segment, or a portion thereof, is intended to mean a segment that is present to compensate for proximity effects but is not part of an electronic component. Note that dummy segments may or may not be present within a substantially completed electronic device.

The term "electronic component" is intended to mean a lowest level unit of a circuit that performs an electrical or electro-radiative (e.g., electro-optic) function. An electronic component may include a transistor, a diode, a resistor, a capacitor, an inductor, a semiconductor laser, an optical switch, or the like. An electronic component does not include parasitic resistance (e.g., resistance of a wire) or parasitic capacitance (e.g., capacitive coupling between two conductors connected to different electronic components where a capacitor between the conductors is unintended or incidental).

The term "electronic device" is intended to mean a collection of circuits, electronic components, or combinations thereof that collectively, when properly connected and supplied with the appropriate potential(s), performs a function. An electronic device may include or be part of a system. An example of an electronic device include a display, a sensor array, a computer system, avionics, an automobile, a cellular phone, another consumer or industrial electronic product, or the like.

The term "elevation" is intended to mean a shortest distance to a reference plane. In one embodiment, the reference plane is the primary surface of a substrate.

The term "emission maximum" is intended to mean the highest intensity of radiation emitted. The emission maximum has a corresponding wavelength or spectrum of wavelengths (e.g. red light, green light, or blue light).

The term "filter" when referring to a layer, material, member, or structure is intended to mean a layer, material, member, or structure separate from a radiation-emitting or radiation-responsive layer, wherein the filter is used to limit the wavelength(s) of radiation transmitted through such layer, material, member, or structure. For example, a red filter layer may allow substantially only red light from the visible light spectrum to pass through the red filter layer. Therefore, the red filter layer filters out green light and blue light.

The term "green light-emitting layer" is intended to mean a layer capable of emitting radiation that has an emission maximum at a wavelength in a range of approximately 500 to 600 nm.

The term "guest material" is intended to mean a material, within a layer including a host material, that changes the electronic characteristic(s) or the targeted wavelength of radiation emission, reception, or filtering of the layer compared to the electronic characteristic(s) or the wavelength of radiation emission, reception, or filtering of the layer in the absence of such material. The terms "height," "length," and "width," when referring to a structure overlying a substrate, are intended to refer to dimensions substantially perpendicular to each other. "Height" is intended to refer to a distance above an underlying substrate. "Length" is intended to refer to a dimension within a plane substantially parallel to the substrate. "Width" is intended to refer to a dimension within a plane substantially parallel to the substrate and substantially perpendicular to the "length" dimension. In one embodiment, the "width" is shorter than the "length."

The term "host material" is intended to mean a material, usually in the form of a layer, to which a guest material may or may not be added. The host material may or may not have electronic characteristic(s) or the ability to emit, receive, or filter radiation.

The term "inert" is intended to refer to a material that does not significantly react with one or more other materials at the conditions under which such material and other material(s) are exposed to each other.

The term "intermix" and its variants are intended to be broadly construed as mixing a material with a layer, member, structure, or another material without the use of an external electrical field, and covers agitation, dissolution, diffusion, emulsifying, suspending (for a suspension), or a combination thereof. The material may enter the layer, member, structure, or the other material; the layer, member, structure, or other material may enter the material; or combination thereof. Therefore, the "direction" of movement is irrelevant to intermixing. Intermixing does not require achieving a homogeneous or substantially uniform concentration of the material within the layer, member, structure, or other material. Intermixing does not include ion implantation.

The term "line," when referring to printing over a substrate, is intended to mean an unbroken geometric element as seen by a plan view of the substrate. Note that a line may or may not have sharp angles.

The term "liquid composition" is intended to mean a material that is dissolved in a liquid medium to form a solution, dispersed in a liquid medium to form a dispersion, or suspended in a liquid medium to form a suspension or an emulsion.

The term "liquid containment structure" is intended to mean a structure within or on a workpiece, wherein such one or more structures, by itself or collectively, serve a principal function of constraining or guiding a liquid within an area or region as it flows over the workpiece. A liquid containment structure can include cathode separators or a well structure.

The term "liquid medium" is intended to a liquid within a solution, dispersion, suspension, or emulsion. Liquid medium is used regardless whether one or more solvents are present, and therefore, liquid medium is used as the singular or plural form (i.e., liquid media) of the term.

The term "longitudinal" is intended to mean extending along a length.

The term "maintaining" is intended to mean keeping a condition or a state of an object or collection of objects at or close to a setpoint or within a predetermined range.

The term "nozzle" is intended to mean a portion of an apparatus through which a liquid composition or liquid medium can be dispensed.

The term "organic active layer" is intended to mean one or more organic layers, wherein at least one of the organic layers, by itself, or when in contact with a dissimilar material is capable of forming a rectifying junction.

The term "organic electronic device" is intended to mean a device including one or more semiconductor layers or materials. An organic electronic device includes: (1) a device that converts electrical energy into radiation (e.g., a light-emitting diode, light emitting diode display, diode laser, or lighting panel), (2) a device that detects a signal using an electronic process (e.g., a photodetector, a photoconductive cell, a photoresistor, a photoswitch, a phototransistor, a phototube, an infrared ("IR") detector, or a biosensor), (3) a device that converts radiation into electrical energy (e.g., a photovoltaic device or solar cell), and (4) a device that includes one or more electronic components that include one or more organic semiconductor layers (e.g., a transistor or diode), or any combination of devices in items (1) through (4).

The term "overlying" does not necessarily mean that a layer, member, or structure is immediately next to or in contact with another layer, member, or structure.

The term "pass" is intended to mean one action or one complete set of actions to at least partially achieve a desired result. In one embodiment, a layer can be formed by printing a first line and then printing a second line on the first line, wherein the printing of the first and second lines occurs during different passes.

The term "pivoting mechanism" is intended to mean an apparatus or portion thereof for rotating an object or portion thereof about a fixed point.

The term "power transmission line" is intended to mean one or more conductive members within an electronic device designed to transmit a power supply signal. The one or more conductive members are at substantially the same voltage as the power supply signal. An example of a power transmission lines include a $V_{dd}$ line or a $V_{ss}$ line.

The term "precision deposition technique" is intended to mean a deposition technique that is capable of depositing one or more materials to a thickness no greater than approximately one millimeter. A stencil mask, frame, well structure, patterned layer or other structure(s) may be present during such deposition.

The term "primary surface" is intended to mean a surface of a substrate from which an electronic component is subsequently formed.

The term "printing" is intended to mean an act of selectively depositing a layer by using a printing head or other similar structure to dispense a liquid or liquid composition onto a workpiece.

The term "printing apparatus" is intended to mean a combination of one or more materials, equipment, assembly or subassembly designed for printing a layer onto a workpiece.

The term "printing head" is intended to mean a portion of a printing apparatus through which a liquid composition can be dispensed.

The term "rectifying junction" is intended to mean a junction within a semiconductor layer or a junction formed by an interface between a semiconductor layer and a dissimilar material, in which charge carriers of one type flow easier in one direction through the junction compared to the opposite direction. A pn junction is an example of a rectifying junction that can be used as a diode.

The term "red light-emitting layer" is intended to mean a layer capable of emitting radiation that has an emission maximum at a wavelength in a range of approximately 600 to 700 nm.

The term "segment" is intended to mean at least a portion of a line.

The term "solids" is intended to mean one or more materials, which in the absence of a liquid medium, are in a substantially solid state at approximately 20° C. Note that such one or more materials that are dissolved within a solution are still considered solids for the purpose of this specification.

The phrase "spectrum" is intended to mean more than one wavelength. Spectrum can correspond to one or more ranges of wavelengths. The ranges can be contiguous, overlapping, spaced apart, or any combination thereof.

The term "stitching defect" is intended to mean a fabrication artifact in an electronic device, wherein the fabrication artifact appears as a seam or other pattern within the electronic device that can be observed when the electronic device is fabricated, used, or a combination thereof.

The term "substantial amount" is intended to mean, on a mass basis, at least one third of an original amount. For example, when a substantial amount of a guest material lies within an organic layer, at least one third of the guest material in a volume of a stream or drop (original amount of guest material) that is placed over the organic layer lies within that organic layer.

The term "substantially parallel" is intended to mean that the orientations of a combination of one or more lines, one or more vectors, or one or more planes are parallel or almost parallel such that any skewness is considered to be insignificant to one of ordinary skill in the art.

The term "substantially perpendicular" is intended to mean that orientations of a combination of one or more lines, one or more vectors, or one or more planes are perpendicular or almost perpendicular such that any angular difference from perpendicular is considered to be insignificant to one of ordinary skill in the art.

The term "substrate" is intended to mean a base material that can be either rigid or flexible and may include one or more layers of one or more materials, which can include glass, polymer, a metal or ceramic material, or any combination thereof. The reference point for a substrate is the beginning point of a process sequence. The substrate may or may not include electronic components, circuits, or conductive members.

The term "substrate structure" is intended to mean a structure overlying a substrate, wherein the structure serves a principal function of separating an area or region into smaller areas or regions. A substrate structure can include a cathode separator or a well structure.

The term "surface treatment" is intended to mean an action performed to change a property of an exposed surface. In one embodiment, a surface treatment makes an exposed surface more hydrophobic or more hydrophilic. Each of fluorinating or adding a surfactant to an exposed surface is an example of a surface treatment.

The term "temperature adjusting element" is intended to mean one or more objects that are used to cool a different object, heat a different object, or maintain a different object at a substantially constant temperature. A temperature-adjusting element can include an evaporator, a combination of liquid or compressed gas and an expansion valve, a refrigeration unit, a heater, heating tape, a heating blanket, etc. One or more temperature sensors and a controller may be used with the temperature-adjusting element.

The term "thermal coupled" is intended to mean that a combination of one or more layers, one or more materials, one or more members, one or more structures, or any combination thereof contact each other or, if there are any intervening layer(s) material(s), member(s) or structure(s), all of such intervening layer(s), material(s), member(s) or structure(s) have low thermal resistance.

The term "top emission" is intended to mean an electronic device or a portion thereof including a radiation-emitting component, a radiation-responsive component or any combination thereof, wherein radiation from such radiation-emitting component, to such radiation-responsive component, or such combination is transmitted through a side of the electronic device or portion thereof opposite a substrate from which such radiation-emitting component, radiation-responsive component, or combination is fabricated.

The term "transverse" is intended to mean extending in a direction that intersects a length. In one embodiment, a transverse portion may intersect a longitudinal portion at an angle of approximately 90°, less than 90°, or more than 90°.

The term "vector" when associated with an array is intended to mean a row, column, or diagonal line.

The term "well structure" is intended to mean a structure overlying a substrate, wherein the structure serves a principal function of separating an object, a region, or any combination thereof within or overlying the substrate from contacting a different object or different region within or overlying the substrate.

The term "wet," when referring to a layer, line or segment is intended to mean that such layer, line, or segment has a liquid medium present that may or may not be removed.

The term "workpiece" is intended to mean a substrate at any particular point of a process sequence. Note that the substrate may not significantly change during a process sequence, whereas the workpiece significantly changes during the process sequence. For example, at a beginning of a process sequence, the substrate and workpiece are the same. After a layer is formed over the substrate, the substrate has not changed, but now the workpiece includes the substrate and the layer.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Group numbers corresponding to columns within the Periodic Table of the elements use the "New Notation" convention as seen in the CRC *Handbook of Chemistry and Physics*, 81$^{st}$ Edition (2000).

Unless otherwise defined, all technical and scientific terms used herein have the same meaning as commonly understood by one of ordinary skill in the art to which this invention belongs. Although suitable methods and materials are described herein for embodiments of the invention, or methods for making or using the same, other methods and materials similar or equivalent to those described can be used without departing from the scope of the invention. All publications, patent applications, patents, and other references mentioned herein are incorporated by reference in their entirety. In case of conflict, the present specification, including definitions, will control. In addition, the materials, methods, and examples are illustrative only and not intended to be limiting.

Other features and advantages of the invention will be apparent from the following detailed description, and from the claims.

To the extent not described herein, many details regarding specific materials, processing acts, and circuits are conventional and may be found in textbooks and other sources within the organic light-emitting diode display, photodetector, photovoltaic, and semiconductor arts.

2. Continuous Printing Apparatus and Related Configurations

Figure 2:
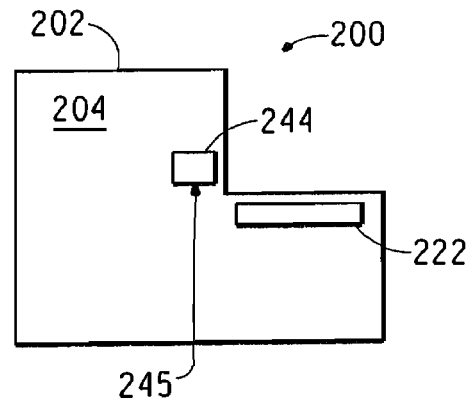
FIG. 2 includes a side view of a printing apparatus.

A printing apparatus can be used to print a layer over nearly any substrate during the formation of an electronic device. FIG. 2 includes a side view of a printing apparatus 200 that can be used to continuously print a layer that will be used within an electronic device. The printing apparatus 200 includes an enclosure 202, which encloses a space 204, a printing head 244 including a nozzle 245, and a chuck 222. The chuck 222 is configured to support, hold, or retain a workpiece (not illustrated in FIG. 2) on or within which electronic components can be formed.

Figure 3:
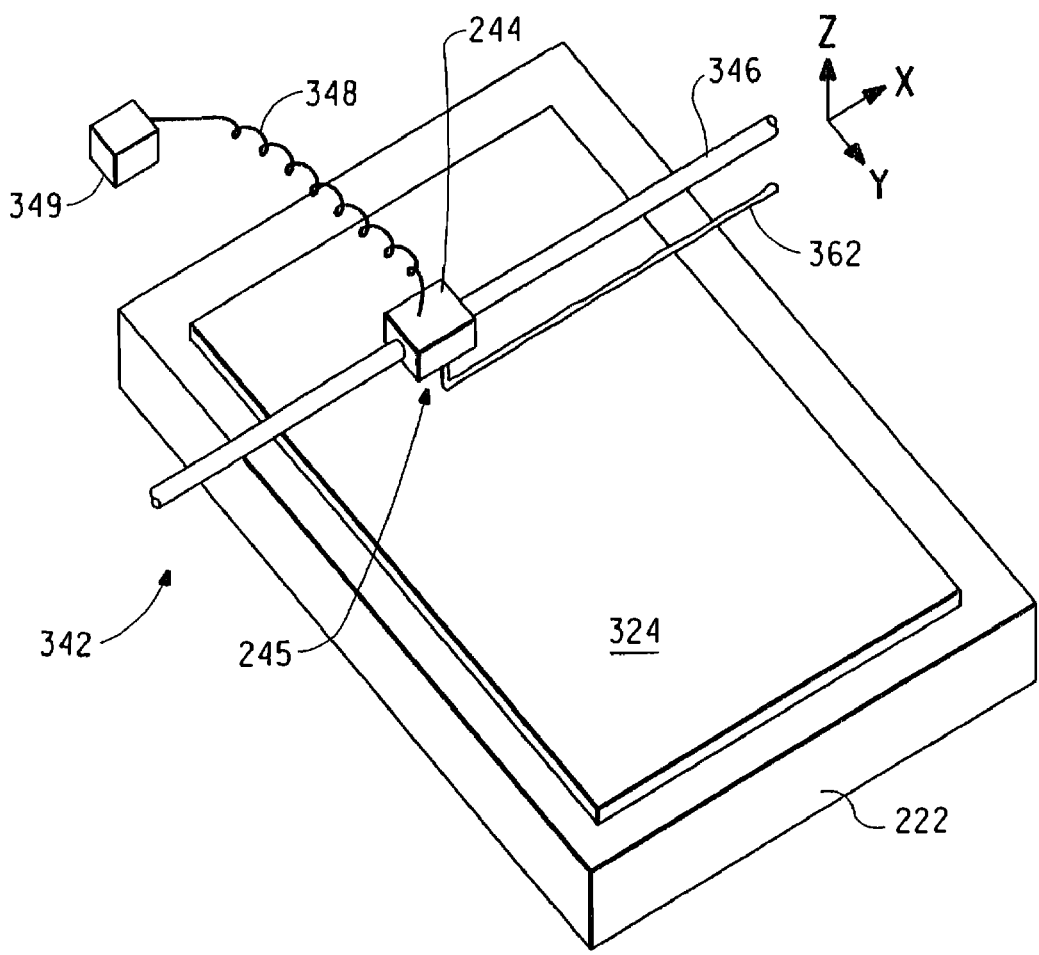
FIG. 3 includes an illustration of a perspective view of a portion of a printing apparatus, including a printing assembly and a chuck, while printing onto a workpiece.

FIG. 3 includes an illustration of a perspective view of the printing apparatus 200 and a workpiece 324 during a printing operation. The chuck 222 supports, holds, or retains the workpiece 324. The workpiece 324 can be held in place by clamps or pins, by one or more adhesive films, by vacuum, electrostatically, or any combination thereof. In one embodiment, the chuck 222 is configured to move in the y-direction as illustrated in FIG. 3. The printing apparatus 200 includes a printing assembly 342 including the printing head 244, an air bearing 346, and the nozzle 245. The printing head 244 may traverse the air bearing 346 in the x-direction as illustrated in FIG. 3. The printing apparatus 200 further includes a container 349 that is fluidly coupled to the printing head 244 via a feed line 348. The feed line 348 provides one or more liquids or liquid compositions from the container 349 to the printing head 244. In one embodiment, more than one feed line 348, more than one container 349, or any combination thereof can be connected to the printing head 244. Additional equipment may reside within or be used with the printing apparatus 200 but is not illustrated. Such other equipment can include any one or more stepper motors, pumps, filters, air handling equipment, control electronics, other electrical, mechanical, or electromechanical assemblies or subassemblies, facilities connections, or any combination thereof. A line 362 is printed on the workpiece 324 and a portion of the chuck 222 as illustrated in FIG. 3. The printing operation and options available during printing will be described later in this specification.

Many options are available for the movement of the chuck 222, the printing head 244, or both. The chuck 324 can move bi-directionally along one or more axes during printing. For example, the chuck 222 can move bi-directionally along the x-axis, y-axis, z-axis, or any combination thereof. The axis references are illustrated in FIG. 3. In one embodiment, each of the x-axis, y-axis, and z-axis is substantially perpendicular to the other two axes. The primary surface of the workpiece 222 is substantially parallel to a plane defined by the x-axis and y-axis. In one embodiment, the printing head 244, the chuck 222, or both are configured to allow motion along two different axes during continuously printing of a liquid composition. In one specific embodiment, printing the line 362 over the substrate is performed while the printing head moves at a rate in a range of 2 to 3 m/s.

The chuck 222 may also allow rotation about an axis or allow the workpiece 324 to be inclined, declined, or both compared to a reference plane, such as the floor of the room in which the printing apparatus 200 resides. The printing head 244 may or may not also move in any of those directions. When dispensing more than one liquid composition during a single printing action or when overlaying subsequent lines over the workpiece 324 during subsequent printing actions, the orientation of the nozzle 245, when printing, can affect the relative distance between the concurrently dispensed lines, the previously dispensed lines, or any combination thereof.

Figure 4:
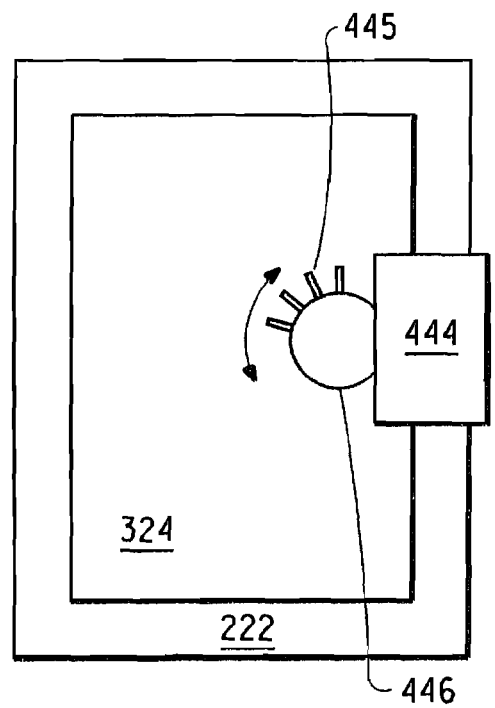
FIG. 4 includes an illustration of a printing assembly including a plurality of nozzles and a pivoting mechanism.

FIG. 4 includes an illustration of a top view of a printing apparatus that has a pivoting printing head 444. A printing head 444 includes one nozzle or a set of nozzles 445 for printing one or more liquid compositions over the workpiece 324, which is supported, held, or retained by the chuck 222. In this exemplary embodiment, the nozzles 445 are attached to a pivoting mechanism 446. In one embodiment, the pivoting mechanism 446 is configured to move or rotate the nozzles 445 such that the alignment of the nozzles 445 changes relative to a horizontal plane, such as an x-y plane substantially parallel to the primary surface of the workpiece 324. In one embodiment, the pivoting mechanism 446 can rotate the nozzles 445 before, during, or after printing lines on the workpiece 324.

Note that the printing assembly 342 may be modified so that other equipment may be used in place of or in conjunction with the air bearing 346 to allow such motion. For example, the printing assembly 342 may include a gantry to allow motion along the x-axis and y-axis. In one embodiment, the workpiece 324 remains stationary during printing. One or both of the printing head 244 and the chuck 222 may move before, during, or after printing. In one embodiment, the printing head 244 and chuck 222 can be moved simultaneously. Nearly any movement of the chuck 222 or the printing head 244, or nearly any relative motion between the chuck 222 and the printing head 244 is possible.

The nozzle 245 can be an orifice with nearly any shape (e.g., circular, rectangular, etc.). For simplicity, the orifice is typically circular. In theory, the orifice may be nearly any size. Practical considerations may limit the size of the orifice. For example, the narrowest dimension to be printed may limit the size of the orifice. In one embodiment, the orifice has a width no greater than the narrowest dimension to be printed. In another embodiment, the orifice has a diameter in a range of approximately 5 to 30 microns, such as in a range of approximately 10 to 20 microns.

In another embodiment, the nozzle 245 can be a slot. A slot-shaped opening can be used for one or more layers that may be blanket deposited over a substrate or a portion thereof (e.g., an array for the electronic device). In one embodiment, the slot has a width in a range of approximately 5 to 30 microns and a length substantially the same dimension or longer than the corresponding dimension of the substrate or the portion thereof printed using the nozzle 245 with the slot-shaped opening. Such an embodiment can be useful for depositing a buffer layer, a charge-blocking layer, a charge-injection layer, a charge-transport layer, or a combination thereof.

During printing, the pressure within the printing head 244 can be in a range of approximately 100 to 350 KPa. The flow rate of liquid or a liquid composition from the printing head 244 can be in a range of 50 to 600 microliters per minute. In other embodiments, a higher or lower pressure, a higher or lower flow rate, or any combination thereof can also be used. After reading the specification, skilled artisans will be able to adjust or modify the printing apparatus 200 to achieve pressures and flow rates for their particular applications.

The printing head 244, 444, or both can use a simpler design as compared to printing heads used for ink-jet printers. The simpler design allows a wider array of materials to be used within the printing head 244, 444, or both. For example, the printing head can use one or more plastic or polymer materials, such as polyetherketone, TEFLON® brand compound (E.I. DuPont de Nemours and Company) or other polyfluorocarbon compound, one or more metallic materials, such as stainless steel, copper, brass, MONEL™ brand (Cu—Ni) alloy, one or more ceramic materials, including glass, $Si_3N_4$, $Al_2O_3$, AlN, or any combination thereof. The printing head 244, 444, or both do not require the use of corrosive nickel-containing components, epoxy, or both, which are found in conventional ink-jet printing heads. After reading this specification, skilled artisans will be able to determine which material(s) based on the liquid composition that will be dispensed. For example, with an organic active layer, a nickel-containing compound may be avoided.

Any one or more of the chuck 224, the printing head 244, the feed line 348, the container 349, other part(s) of the printing apparatus 200, or any combination thereof can include one or more temperature adjusting elements to raise the temperature, lower the temperature, or maintain the temperature of a local or larger area within the printing apparatus 200.

The ability to use different temperatures allows a wider range of materials, properties, or both to be used. In one embodiment, the viscosity of the liquid composition can be raised or lowered within the printing head 244, the feed line 348, the container 349 or other part(s) of the printing apparatus 200, the viscosity of the liquid composition can be raised or lowered at the workpiece 324 by adjusting the temperature of the chuck 224, or any combination thereof. Additionally, boiling points for the liquid medium for the liquid composition can be outside the conventional limits seen with ink-jet printing. For example, cooling the liquid composition within the printing head 244, the feed line 348, the container 349, other part(s) of the printing apparatus 200 may allow a liquid medium to be used that would otherwise have too low of a boiling point. Alternatively, heating the liquid composition within the printing head 244, the feed line 348, the container 349, or other part(s) of the printing apparatus 200 may allow a liquid medium to be used that would otherwise have too high of a viscosity if at an ambient temperature. Heating or cooling the chuck 224 can affect viscosity directly or indirectly (by changing the evaporation rate of the liquid medium of the liquid composition) to allow a wider variety of liquid compositions (including liquid medium) to be used.

In one embodiment, a temperature difference can be created or maintained between a liquid composition, which is dispensed through the printing head 244, and the workpiece 324. In one embodiment, the workpiece 324 is hotter than the liquid composition just before reaching the workpiece 324, or vice versa. In another embodiment, the temperature difference can be used to allow a viscosity of a liquid composition to increase quicker than under ambient conditions. In another embodiment, the temperature difference can allow the printed lines to dry more quickly, such that the liquid composition has a viscosity that increases relatively quickly and keeps the width of the line being printed smaller than can otherwise be obtained without the temperature difference. In still another embodiment, the temperature difference may allow the chuck to be relatively cooler than the liquid composition. In this embodiment, the vapor pressure from the printed segments can allow for a more uniform layer of vapor to reside above the printed segments and may allow for more uniform drying conditions between segments. In other embodiments, the temperature difference can be used for any one or more other reasons or for any combination of reasons.

Figure 5:
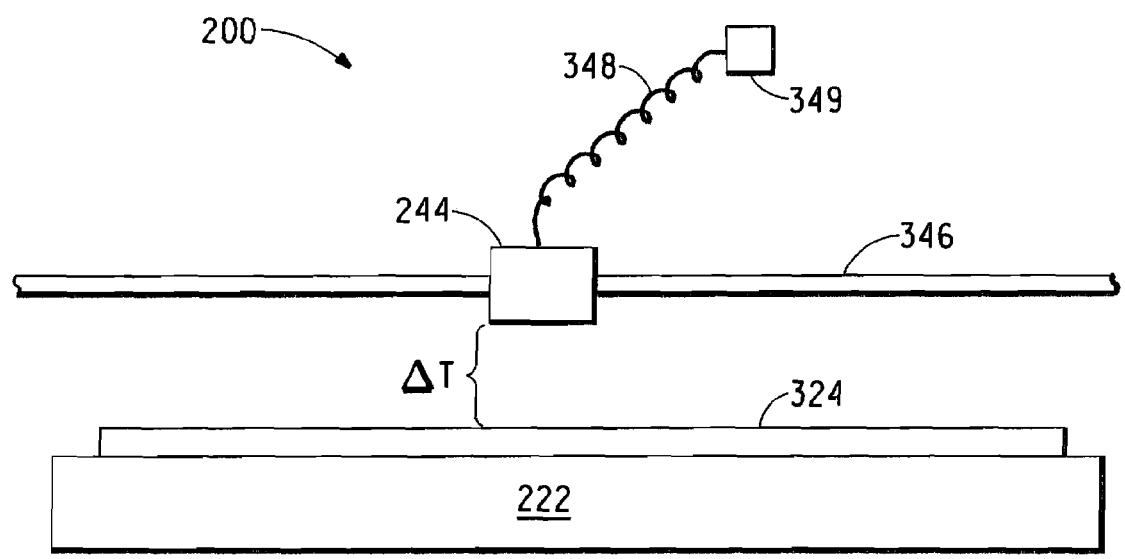
FIG. 5 includes an illustration of a side view of a printing apparatus including a workpiece.

FIG. 5 includes an illustration of a side view of a portion of the printing apparatus 200. In one embodiment, the temperature difference (ΔT) can be achieved by having the liquid composition within the printing head 244, the feed line 348, the container 349, or a combination thereof at a temperature higher or lower with respect to the workpiece 324. In one embodiment, the temperature of the workpiece 324 can be controlled by controlling the temperature of the chuck 222. The actual temperature of the exposed surface of workpiece 324 can be approximated from the temperature of the chuck 222. In another embodiment, the temperature of the liquid composition just before reaching the workpiece 324 can be printing head 244, the feed line 348, the container 349, or any combination thereof.

In one embodiment, the temperature of the workpiece 324 may be maintained at a lower temperature compared to the liquid composition when in the printing head 244. The relatively lower temperature increases the viscosity of the liquid medium within the liquid composition. Note that the liquid composition does not need to be converted to a gel or a solid in order for the lateral movement of the liquid composition to be constrained. In another embodiment, the cooler workpiece 324 can slow the evaporation rate of a liquid medium of a liquid composition printed onto the workpiece.

In another embodiment, the temperature of the workpiece 324 may be maintained at a higher temperature compared to the liquid composition when in the printing head 244. The relatively higher temperature allows liquid medium to evaporate at a higher rate thereby increasing the viscosity of a liquid composition because the amount of solids within the liquid composition remains substantially the same; however, the volume of the liquid medium is smaller. Again, the liquid composition does not need to be converted to a gel or a solid in order for the lateral movement of the liquid composition to be constrained.

In still other embodiments, the entire enclosed space 204 may be taken to a temperature different from the ambient temperature. The space 204 may be maintained at the desired temperature for the workpiece 324.

Regardless of whether a temperature differential is to be established or if the space 204 including the printing head 244, the workpiece 324, and the chuck 222 is to be maintained at a temperature substantially at or different from the ambient temperature, one or more temperature adjusting elements can be used.

The printing head 244, the feed line 348, the container 349, the chuck 222, or any combination thereof can include any one or more temperature adjusting elements. A temperature adjusting element can include a heater, heating tape, heating blanket, heated or cooled air or other fluid, heating or cooling channels, refrigeration unit, combination of a liquid or compressed gas and an expansion valve, or any combination thereof. In one embodiment, the chuck 222 includes a temperature adjusting element, and the liquid composition within the printing head 244, the feed line 348, and the container 349 are maintained substantially at the ambient temperature. In another embodiment, the chuck 222 may be maintained substantially at the ambient temperature, and the printing head 244, the feed line 348, the container 349, or any combination thereof may include a temperature-adjusting element. In a further embodiment a temperature adjusting element may surround or direct a heated or cooled fluid at any one or more of the chuck 222, the printing head 244, the feed line 348, the container 349, or any combination thereof.

Figure 6:
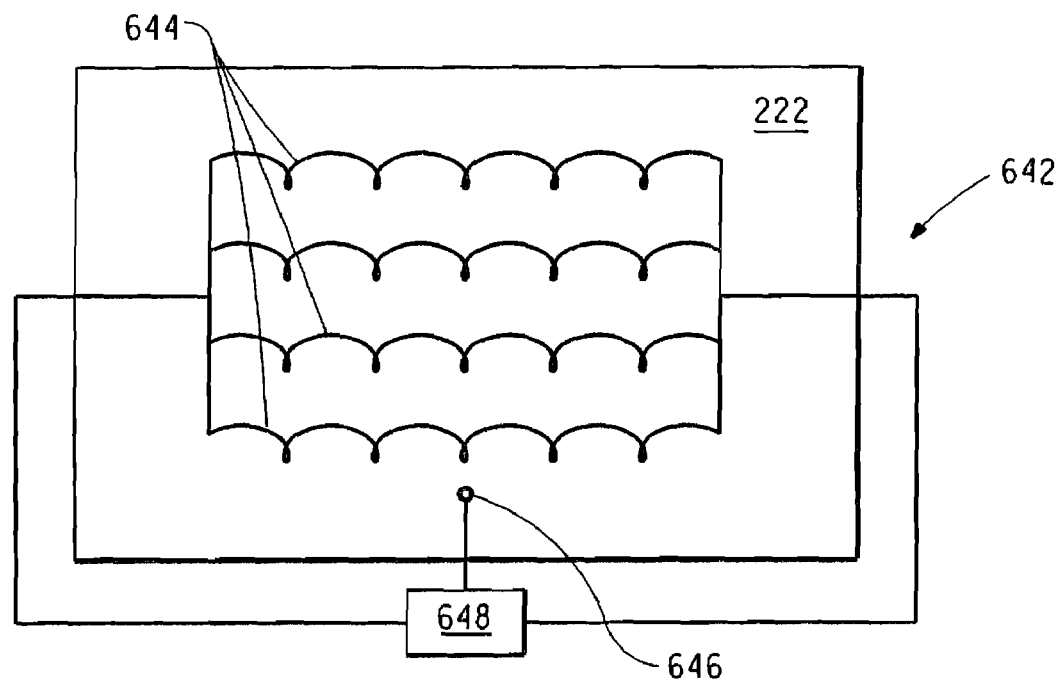
FIG. 6 includes an illustration of a chuck used within a printing apparatus, wherein the chuck includes heating elements and a temperature sensor that are controlled by a temperature controller.
Figure 7:
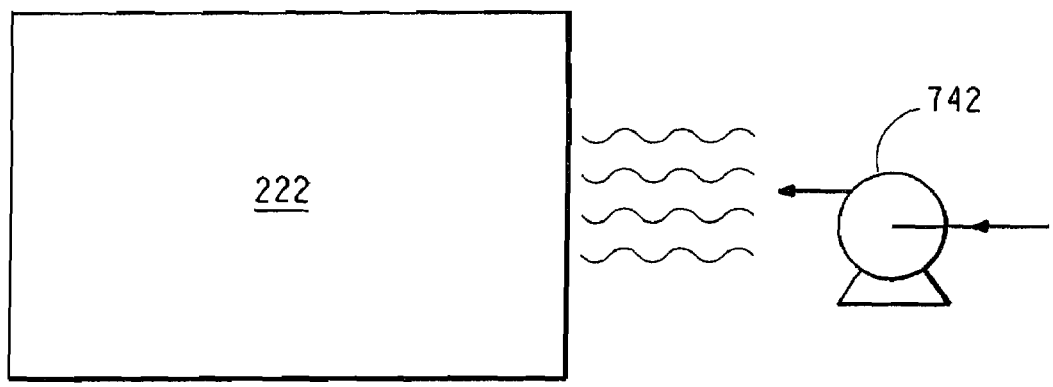
FIG. 7 includes an illustration including forced air or other gas being used to heat a chuck, cool the chuck, or maintain the chuck at a substantially constant temperature.
Figure 8:
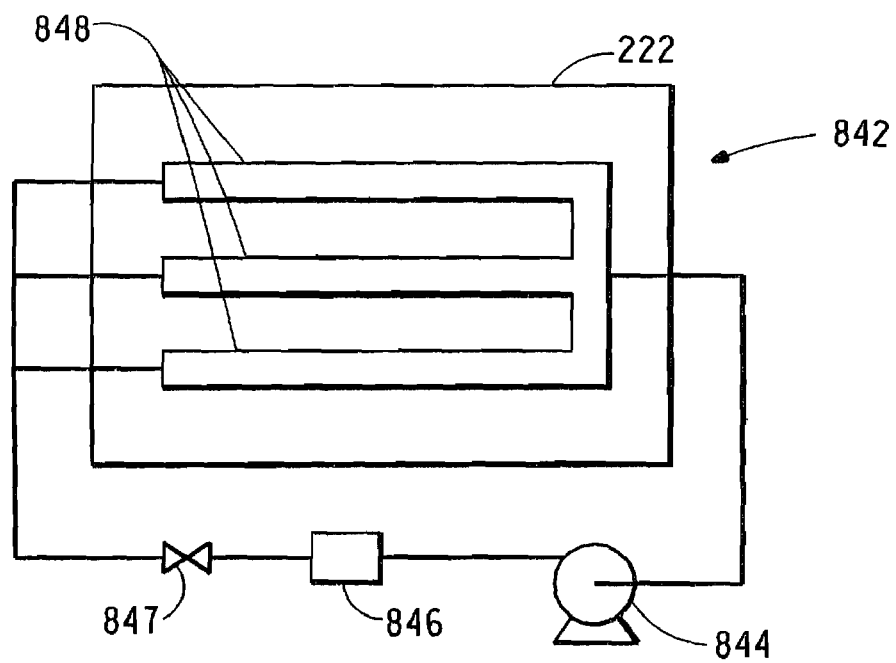
FIG. 8 includes an illustration of a chuck and a refrigeration unit thermally coupled to the chuck.

FIGS. 6 to 8 illustrate some exemplary, non-limiting embodiments of temperature adjusting elements and their configurations. FIG. 6 includes an illustration of the chuck 222 that includes a heating unit 642 that can be used with the chuck 222. The heating unit 642 includes a heater 644 within the chuck 222, a temperature sensor 646 that monitors the temperature of the chuck 222, and a controller 648. The controller 648 controls the heater 644 in response to the readings from the sensor 646. Each of the heater 644, the temperature sensor 646, and the controller 648 are conventional. After reading this specification, skilled artisans will appreciate that other designs for the heater 644 and more than one temperature sensor 646 can be used with the heating unit 642.

FIG. 7 includes an illustration of the chuck 222 in which a blower 742 directs air, nitrogen, another gas, or any combination thereof towards the chuck 222. The air, nitrogen, another gas, or any combination thereof may be heated or cooled before flowing through the blower 742, or the air, nitrogen, another gas, or any combination thereof may be heated or cooled after flowing through the blower 742 but before reaching the chuck 222. The air, nitrogen, another gas, or any combination thereof may be directed towards the workpiece 324 and chuck 222 or may be directed to the opposite side (backside) of the chuck 222.

As an alternative to heating, cooling may be used. FIG. 8 includes an illustration of a refrigeration unit 842 that can be at least partially incorporated within the chuck 222. A conventional, commercially-available refrigerant may be received by a compressor 844, which compresses the refrigerant and sends the compressed refrigerant to a condenser 846. The condenser 846 can reduce the temperature of the compressed refrigerant. The refrigerant can then flow through an expansion valve 847 where the refrigerant is allowed to expand and cool. The expanded and cooled refrigerant can pass through cooling channels 848 within the chuck 222. In an alternative embodiment, the expansion valve 847 may be omitted and the refrigerant can expand within the cooling channels 848. In another embodiment (not illustrated), a liquid or compressed gas may replace the compressor 844 and condenser 846. In this embodiment, the liquid or compressed gas may pass through the expansion valve 847 and through the cooling channels 848. The effluent from the cooling channels 848 can be vented to atmosphere or sent to a scrubber or other chemical recovery unit.

After reading this specification, skilled artisans will appreciate that there are many other ways of heating or cooling the chuck 222. Additionally, skilled artisans will understand how to modify the embodiments described with respect to the chuck 222 so that similar embodiments for the printing head 244, the feed line 348, the container 349, or any combination thereof can be used and not depart from the scope of the present invention. Therefore, the embodiments described herein should be viewed as illustrative and not limiting.

The spacing between the printing head 244 and the workpiece 342 can be adjusted to a greater extent compared to ink-jet printers. For example, in an ink-jet printer, the spacing between the printing head and the surface of the workpiece 324 is typically in a range of approximately 300 to 500 microns.

The printing apparatus 200 can be adjusted to allow a much greater range in distance between the workpiece 324 and the printing head 244. While an actual upper limit is unknown, in one embodiment, the distance between the workpiece 324 and the printing head 244 does not exceed approximately 2.0 mm. At distances greater than approximately 2 mm, the liquid stream coming from the nozzle 245 may start to diverge before reaching the workpiece 324. When working with small dimensions (e.g., no greater than 50 microns), such divergence may be unacceptable. In still other embodiments, other distances may be used, such as at least 11 microns, or no greater than 0.9 mm. After reading this specification, skilled artisans will appreciate that many other distances between the printing head 244 and the workpiece 324 can be used and tailored to specific applications and dimensions of electronic components within or on the workpiece 324.

The printing apparatus 200 can include a showerhead to provide an inert gas during printing. The inert gas can include $N_2$, $CO_2$, He, Ne, Ar, Kr, Xe, or any combination thereof. The inert gas can be used to reduce the likelihood that oxygen, water, or other environmental contaminant will adversely interact or react with a layer printed onto the workpiece 324. The inert gas can also increase the evaporation rate of the liquid medium within the liquid composition after being printed onto the workpiece 324. The inert gas may or may not be warmer or cooler than the ambient temperature when it reaches the exposed surface of the workpiece 324. A conventional heating or cooling apparatus (not illustrated) can be used to heat, cool, or maintain the temperature of the inert gas as it reaches the workpiece 324. In one embodiment, the inert gas has a temperature in a range of approximately 5 to 80° C. when it reaches the workpiece 324.

In one embodiment, a blanket layer of an inert gas is provided by a plurality of gas streams that deliver gas upward around the workpiece 324. In one embodiment, a set of channels (not illustrated) within the chuck 222 and gas outlets along a surface of the chuck 222 near the workpiece 324 can be used. When the inert gas is heavier than air, such as argon, the gas can flow over the workpiece 324 to form the blanket layer.

Figure 9:
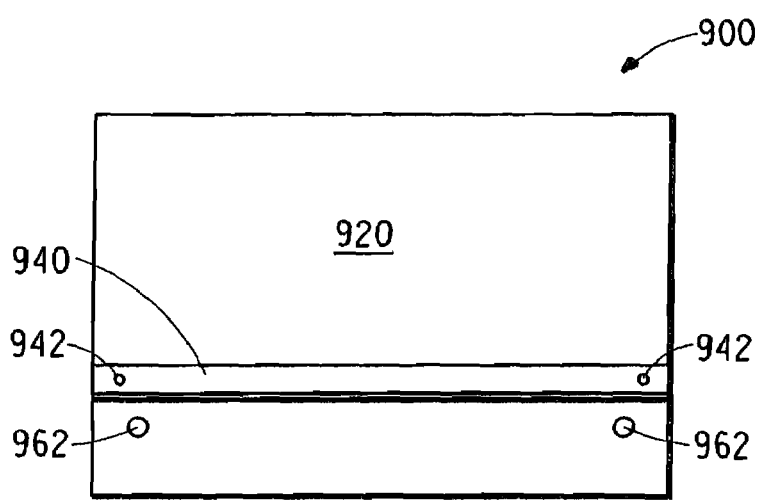
FIGS. 9 to 12 include illustrations of a top view, a bottom view, a front view, and a side view, respectively, of a showerhead.

In another embodiment, a showerhead 900, as illustrated in a top view in FIG. 9, can be provided at a distance above and substantially parallel to a primary surface of a substrate within the workpiece 324. The showerhead 900 includes a chamber 920. The chamber 920 has one or more walls that may include nearly any solid inorganic or organic material, including one or more metals, ceramics (including glasses), plastics, or any combination thereof. The chamber 920 can have any desired geometric shape. In one embodiment, the chamber has a shape including conical, pyramidal, cylindrical, rectangular prismatic, or any combination thereof. The chamber 920 may have an irregular shape. The showerhead 900 includes a mounting bracket 940 attached to a chamber 920 at attachment points 942. One or more screws, bolts, nuts, rivets, welds, adhesives, or a combination thereof can be used at the attachment points 942. More or fewer attachment points can be used. Inlets 962 allow one or more gases to be received by the showerhead 900.

Figure 10:
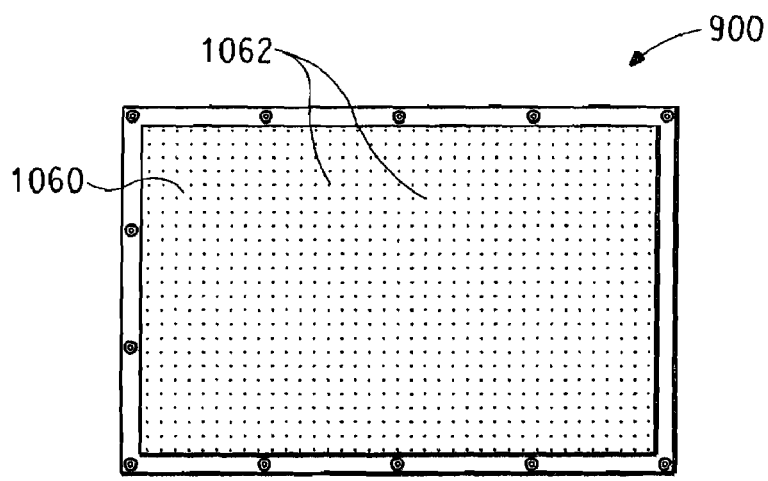

FIG. 10 includes a bottom view of the showerhead 900 illustrating a bottom surface 1060 having a plurality of openings 1062 through which the inert gas can exit the showerhead 900. In one embodiment, the bottom surface 1060 can be a substantially planar surface. In one specific embodiment, the bottom surface 1060 is rectangular. The size of the bottom surface 1060 is determined by the desired size of the blanket layer of inert gas. In one embodiment, the bottom surface 1060 is large enough to cover a wet layer of an air-sensitive material at or shortly after a time that the air-sensitive material is printed onto the workpiece 324 and until the time the air-sensitive material is substantially dried. In one embodiment, the bottom surface 1060 has an area greater than 150 cm$^2$. In one embodiment, the area is greater than 200 cm$^2$, and in another embodiment, the area is greater than 300 cm$^2$.

The openings 1062 can have any shape, including circular, ellipsoidal, square, other rectangular, other polygonal, or irregular shapes. The openings 1062 can have the same or different shapes, the same or different widths, or any combination thereof. The openings 1062 can be spaced at regular or irregular intervals. In one embodiment, the openings 1062 have the same shape and width and are spaced at regular intervals as illustrated in FIG. 10. In one embodiment, the lower limit of the widths of the openings 1062 is determined by the width through which a blanket layer of gas can be formed at the gas pressure used (i.e., pressure difference between inside and outside of the chamber 920). The upper limit to the widths of the openings 1062 may be determined by the maximum flow rate over the workpiece 324 at which a wet layer of the air-sensitive material is not substantially altered or damaged by the flow of the inert gas. In one embodiment, the openings 1062 have widths in the range of 0.05 to 10 mm. In another embodiment, the openings 1062 have widths in the range of 0.1 to 1 mm. In still another embodiment, the bottom surface 1060 is a microperforated sheet of stainless steel having openings 1062 of less than 0.5 mm in diameter.

Figure 11:
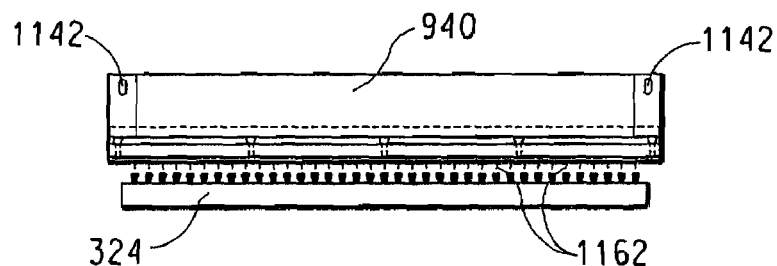
Figure 12:
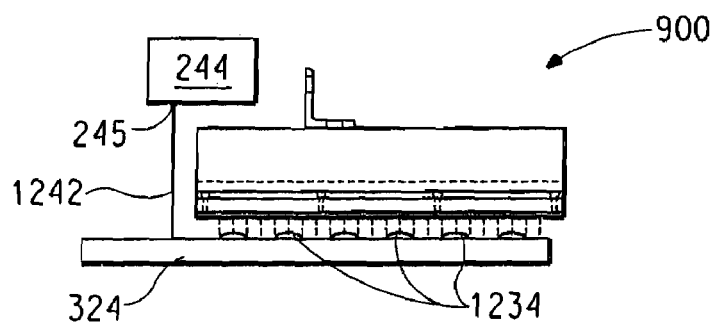

The showerhead 900 can be used with the printing apparatus 200 at a location over the workpiece 324 as illustrated in FIGS. 11 and 12. The showerhead 900 can be used to form the blanket layer of inert gas over the workpiece 324 to help keep air, oxygen, water, another airborne contaminant, a particle, or any combination thereof away from the exposed surface of the workpiece 324. The distance between the bottom surface 1060 and the workpiece 324 can be nearly any distance that facilitates the formation of the blanket layer of inert gas. In one embodiment, the distance is in a range of approximately 1 to 10 cm.

The showerhead 900 can be mounted to the printing apparatus 200 at the oblong holes 1142 in the mounting bracket 940 as illustrated in FIG. 11. More or fewer holes 1142 can be used, and the shape of the holes 1142 can be circular, rectangular, etc. Exemplary gas flow is illustrated by arrows 1162 in FIG. 11.

When in the printing apparatus 200, the showerhead 900 is positioned so as to not interfere with the printing head 244, as illustrated in FIG. 12. A liquid steam 1242 passes though the nozzle 245 of the printing head 244 and is printed onto the workpiece 324. The liquid stream 1242 may include the air-sensitive material, such as a liquid composition as described in more detail later in this specification. Recently printed lines 1234 lie under the showerhead 900 and within an inert gas blanket that helps to dry the lines 1234 and keep a contaminant, a particle, or a combination thereof away from the lines 1234 while drying. In one embodiment, the lines 1234 are substantially dry after they leave the inert gas blanket and form a patterned layer that can be used in electronic components within an electronic device.

3. Liquid Compositions

The printing apparatus 200 can be used to deposit a variety of different materials, including liquid compositions. The following paragraphs include only some but not all of the materials that may be used. In one embodiment, one or more materials for an organic or inorganic layer within an electronic device are formed using the printing apparatus 200.

The printing apparatus 200 is well suited for printing liquid compositions. The printing apparatus 200 allows a wider range of operating parameters and liquid compositions to be used compared to a conventional ink-jet printer. In one embodiment, one or more parameters can affect the flow characteristics of the liquid composition. Viscosity is a parameter that can affect the flow characteristics. The viscosity can be affected by selection of the liquid medium, the solids content within the liquid medium, temperature of the liquid composition, or potentially one or more other factors, or any combination thereof. Viscosity can be affected directly by temperature (viscosity of the liquid medium increases with decreasing temperature or decreases with increasing temperature) or indirectly by changing the evaporation rate of the liquid medium within the liquid composition (i.e., using liquid medium having lower or higher boiling points, changing the temperature of the liquid composition, or a combination thereof. After reading this specification, skilled artisans will appreciate that they have many different ways to allow a significantly larger selection of liquid medium, a larger range of solids concentration of the liquid composition to be used, or a combination thereof.

The liquid composition can be in the form of a solution, dispersion, emulsion, or suspension. In the paragraphs that follow, non-limiting examples of solid materials and liquid medium are given. The solid material(s) can be selected upon the electronic or electro-radiative properties for a subsequently-formed layer. The liquid medium can be selected based on criteria described later in this specification.

When using the printing apparatus 200, the liquid composition may have solid(s) greater than approximately 2.0 weight percent without having to worry about clogging. In one embodiment, the solid(s) content is in a range of approximately 2.0 to 3.0 weight percent. Further, the printing apparatus 200 does not require precisely formed drops to be used. Therefore, the printing apparatus 200 can use a liquid composition having a higher viscosity or lower boiling point compared to a conventional ink-jet printer. Further, the printing apparatus 200 can use a liquid composition having a lower viscosity or higher boiling point compared to a conventional ink-jet printer. Additionally, the liquid medium within a liquid composition does not need to be degassed before printing. For example, a conventional ink-jet printer used for dispensing a conductive organic material within an aqueous solution requires the aqueous solvent to be degassed. However, because printing apparatus 200 allows for more processing margin, degassing of a liquid medium is not required for the proper operation of the printing apparatus 200.

An organic layer printed using the printing apparatus 200 can include an organic active layer, (e.g., a radiation-emitting organic active layer or a radiation-responsive organic active layer), filter layer, buffer layer, charge-injecting layer, charge-transport layer, charge-blocking layer, or any combination thereof. The organic layer may be used as part of a resistor, transistor, capacitor, diode, etc.

For a radiation-emitting organic active layer, suitable radiation-emitting materials include one or more small molecule materials, one or more polymeric materials, or a combination thereof. A small molecule material may include any one or more of those described in, for example, U.S. Pat. No. 4,356,429 ("Tang"); U.S. Pat. No. 4,539,507 ("Van Slyke"); U.S. Paten Application Publication No. US 2002/0121638 ("Grushin"); or U.S. Pat. No. 6,459,199 ("Kido"). Alternatively, a polymeric material may include any one or more of those described in U.S. Pat. No. 5,247,190 ("Friend"); U.S. Pat. No. 5,408,109 ("Heeger"); or U.S. Pat. No. 5,317,169 ("Nakano"). An exemplary material is a semiconducting conjugated polymer. An example of such a polymer includes poly(paraphenylenevinylene) (PPV), a PPV copolymer, a polyfluorene, a polyphenylene, a polyacetylene, a polyalkylthiophene, poly(n-polymer. An example of such a polymer includes poly(paraphenylenevinylene) (PPV), a PPV copolymer, a polyfluorene, a polyphenylene, a polyacetylene, a polyalkylthiophene, poly(n-vinylcarbazole) (PVK), or the like. In one specific embodiment, a radiation-emitting active layer without any guest material may emit blue light.

For a radiation-responsive organic active layer, a suitable radiation-responsive material may include a conjugated polymer or an electroluminescent material. Such a material includes, for example, a conjugated polymer or an electro- and photo-luminescent material. A specific example includes poly(2-methoxy,5-(2-ethyl-hexyloxy)-1,4-phenylene vinylene) ("MEH-PPV") or a MEH-PPV composite with CN-PPV.

The location of a filter layer may be between an organic active layer and a user side of the electronic device. A filter layer may be part of a substrate, an electrode (e.g., an anode or a cathode), a charge-transport layer, a charge-injecting layer, or a charge-blocking layer; the filter layer may lie between any one or more of the substrate, an electrode, a charge-transport layer, a charge-injecting layer, a charge-blocking layer, or any combination thereof. In another embodiment, the filter layer may be a layer that is fabricated separately (while not attached to the substrate) and later attached to the substrate at any time before, during, or after fabricating the electronic components within the electronic device. In this embodiment, the filter layer may lie between the substrate and a user of the electronic device.

When the filter layer is separate from or part of the substrate, or when the filter lies between the substrate and an electrode closest to the substrate, a suitable material includes an organic material including a polyolefin (e.g., polyethylene or polypropylene); a polyester (e.g., polyethylene terephthalate or polyethylene naphthalate); a polyimide; a polyamide; a polyacrylonitrile or a polymethacrylonitrile; a perfluorinated or partially fluorinated polymer (e.g., polytetrafluoroethylene or a copolymer of tetrafluoroethylene and polystyrene); a polycarbonate; a polyvinyl chloride; a polyurethane; a polyacrylic resin, including a homopolymer or a copolymer of an ester of an acrylic or methacrylic acid; an epoxy resin; a Novolac resin; or any combination thereof.

For a hole-injecting layer, hole-transport layer, electron-blocking layer, or any combination thereof, a suitable material includes polyaniline ("PANI"), poly(3,4-ethylenedioxythiophene) ("PEDOT"), polypyrrole, an organic charge transfer compound, such as tetrathiafulvalene tetracyanoquinodimethane ("TTF-TCQN"), a hole-transport material as described in Kido, or any combination thereof.

For an electron-injecting layer, electron transport layer, hole-blocking layer, or any combination thereof, a suitable material includes a metal-chelated oxinoid compound (e.g., $Alq_3$ or aluminum(III)bis(2-methyl-8-quinolinato)4-phenylphenolate ("BAlq")); a phenanthroline-based compound (e.g., 2,9-dimethyl-4,7-diphenyl-1,10-phenanthroline ("DDPA") or 9,10-diphenylanthracence ("DPA")); an azole compound (e.g., 2-tert-butylphenyl-5-biphenyl-1,3,4-oxadiazole ("PBD") or 3-(4-biphenyl)-4-phenyl-5-(4-t-butylphenyl)-1,2,4-triazole ("TAZ"); an electron transport material as described in Kido; a diphenylanthracene derivative; a dinaphthylanthracene derivative; 4,4-bis(2,2-diphenyl-ethen-1-yl)-biphenyl ("DPVBI"); 9,10-di-beta-naphthylanthracene; 9,10-di-(naphenthyl)anthracene; 9,10-di-(2-naphthyl)anthracene ("ADN"); 4,4'-bis(carbazol-9-yl) biphenyl ("CBP"); 9,10-bis-[4-(2,2-diphenylvinyl)-phenyl]-anthracene ("BDPVPA"); anthracene, N-arylbenzimidazoles (such as "TPBI"); 1,4-bis[2-(9-ethyl-3-carbazoyl)vinylenyl] benzene; 4,4'-bis[2-(9-ethyl-3-carbazoyl)vinylenyl]-1,1'-biphenyl; 9,10-bis[2,2-(9,9-fluorenylene)vinylenyl]anthracene; 1,4-bis[2,2-(9,9-fluorenylene)vinylenyl]benzene; 4,4'-bis[2,2-(9,9-fluorenylene)vinylenyl]-1,1'-biphenyl; perylene, substituted perylenes; tetra-tert-butylperylene ("TBPe"); bis(3,5-difluoro-2-(2-pyridyl)phenyl-(2-carboxypyridyl)iridium III ("F(Ir)Pic"); a pyrene, a substituted pyrene; a styrylamine; a fluorinated phenylene; oxidazole; 1,8-naphthalimide; a polyquinoline; one or more carbon nanotubes within PPV; or any combination thereof.

For an electronic component, such as a resistor, transistor, capacitor, etc., the organic layer may include one or more of thiophenes (e.g., polythiophene, poly(alkylthiophene), alkylthiophene, bis(dithienthiophene), alkylanthradithiophene, etc.), polyacetylene, pentacene, phthalocyanine, or any combination thereof.

Examples of an organic dye include 4-dicyanmethylene-2-methyl-6-(p-dimethylaminostyryl)-4H-pyran (DCM), coumarin, pyrene, perylene, rubrene, a derivative thereof, or any combination thereof.

Examples of an organometallic material include a functionalized polymer comprising one or more functional groups coordinated to at least one metal. An exemplary functional group contemplated for use includes a carboxylic acid, a carboxylic acid salt, a sulfonic acid group, a sulfonic acid salt, a group having an OH moiety, an amine, an imine, a diimine, an N-oxide, a phosphine, a phosphine oxide, a β-dicarbonyl group, or any combination thereof. An exemplary metal contemplated for use includes a lanthanide metal (e.g., Eu, Tb), a Group 7 metal (e.g., Re), a Group 8 metal (e.g., Ru, Os), a Group 9 metal (e.g., Rh, Ir), a Group 10 metal (e.g., Pd, Pt), a Group 11 metal (e.g., Au), a Group 12 metal (e.g., Zn), a Group 13 metal (e.g., Al), or any combination thereof. Such an organometallic material includes a metal chelated oxinoid compound, such as tris(8-hydroxyquinolato)aluminum ($Alq_3$); a cyclometalated iridium or platinum electroluminescent compound, such as a complex of iridium with phenylpyridine, phenylquinoline, or phenylpyrimidine ligands as disclosed in published PCT Application WO 02/02714, an organometallic complex described in, for example, published applications US 2001/0019782, EP 1191612, WO 02/15645, WO 02/31896, and EP 1191614; or any mixture thereof.

An examples of a conjugated polymer includes a poly (phenylenevinylene), a polyfluorene, a poly(spirobifluorene), a copolymer thereof, or any combination thereof.

Selecting a liquid medium can also be an important factor for achieving one or more proper characteristics of the liquid composition. A factor to be considered when choosing a liquid medium includes, for example, viscosity of the resulting solution, emulsion, suspension, or dispersion, molecular weight of a polymeric material, solids loading, type of liquid medium, boiling point of the liquid medium, temperature of an underlying substrate, thickness of an organic layer that receives a guest material, or any combination thereof.

In some embodiments, the liquid medium includes at least one solvent. An exemplary organic solvent includes a halogenated solvent, a colloidal-forming polymeric acid, a hydrocarbon solvent, an aromatic hydrocarbon solvent, an ether solvent, a cyclic ether solvent, an alcohol solvent, a glycol solvent, a ketone solvent, a nitrile solvent, a sulfoxide solvent, an amide solvent, or any combination thereof.

An exemplary halogenated solvent includes carbon tetrachloride, methylene chloride, chloroform, tetrachloroethylene, chlorobenzene, bis(2-chloroethyl)ether, chloromethyl ethyl ether, chloromethyl methyl ether, 2-chloroethyl ethyl ether, 2-chloroethyl propyl ether, 2-chloroethyl methyl ether, or any combination thereof.

An exemplary colloidal-forming polymeric acid includes a fluorinated sulfonic acid (e.g., fluorinated alkylsulfonic acid, such as perfluorinated ethylenesulfonic acid) or any combinations thereof.

An exemplary hydrocarbon solvent includes pentane, hexane, cyclohexane, heptane, octane, decahydronaphthalene, a petroleum ether, ligroine, or any combination thereof.

An exemplary aromatic hydrocarbon solvent includes benzene, naphthalene, toluene, xylene, ethyl benzene, cumene (iso-propyl benzene) mesitylene (trimethyl benzene), ethyl toluene, butyl benzene, cymene (iso-propyl toluene), diethylbenzene, iso-butyl benzene, tetramethyl benzene, sec-butyl benzene, tert-butyl benzene, anisole, 4-methylanisole, 3,4-dimethylanisole, or any combination thereof.

An exemplary ether solvent includes diethyl ether, ethyl propyl ether, dipropyl ether, diisopropyl ether, dibutyl ether, methyl t-butyl ether, glyme, diglyme, benzyl methyl ether, isochroman, 2-phenylethyl methyl ether, n-butyl ethyl ether, 1,2-diethoxyethane, sec-butyl ether, diisobutyl ether, ethyl n-propyl ether, ethyl isopropyl ether, n-hexyl methyl ether, n-butyl methyl ether, methyl n-propyl ether, or any combination thereof.

An exemplary cyclic ether solvent includes tetrahydrofuran, dioxane, tetrahydropyran, 4 methyl-1,3-dioxane, 4-phenyl-1,3-dioxane, 1,3-dioxolane, 2-methyl-1,3-dioxolane, 1,4-dioxane, 1,3-dioxane, 2,5-dimethoxytetrahydrofuran, 2,5-dimethoxy-2,5-dihydrofuran, or any combination thereof.

An exemplary alcohol solvent includes methanol, ethanol, 1-propanol, 2-propanol, 1-butanol, 2-butanol, 2-methyl-1-propanol (i.e., iso-butanol), 2-methyl-2-propanol (i.e., tert-butanol), 1-pentanol, 2-pentanol, 3-pentanol, 2,2-dimethyl-1-propanol, 1-hexanol, cyclopentanol, 3-methyl-1-butanol, 3-methyl-2-butanol, 2-methyl-1-butanol, 2,2-dimethyl-1-propanol, 3-hexanol, 2-hexanol, 4-methyl-2-pentanol, 2-methyl-1-pentanol, 2-ethylbutanol, 2,4-dimethyl-3-pentanol, 3-heptanol, 4-heptanol, 2-heptanol, 1-heptanol, 2-ethyl-1-hexanol, 2,6-dimethyl-4-heptanol, 2-methylcyclohexanol, 3-methylcyclohexanol, 4-methylcyclohexanol, or any combination thereof.

An alcohol ether solvent may also be employed. An exemplary alcohol ether solvent includes 1-methoxy-2-propanol, 2-methoxyethanol, 2-ethoxyethanol, 1-methoxy-2-butanol, ethylene glycol monoisopropyl ether, 1-ethoxy-2-propanol, 3-methoxy-1-butanol, ethylene glycol monoisobutyl ether, ethylene glycol mono-n-butyl ether, 3-methoxy-3-methylbutanol, ethylene glycol mono-tert-butyl ether, or any combination thereof.

An exemplary glycol solvent includes ethylene glycol, propylene glycol, propylene glycol monomethyl ether (PGME), dipropylene glycol monomethyl ether (DPGME), or any combination thereof.

An exemplary ketone solvent includes acetone, methylethyl ketone, methyl iso-butyl ketone, cyclohexanone, isopropyl methyl ketone, 2-pentanone, 3-pentanone, 3-hexanone, diisopropyl ketone, 2-hexanone, cyclopentanone, 4-heptanone, iso-amyl methyl ketone, 3-heptanone, 2-heptanone, 4-methoxy-4-methyl-2-pentanone, 5-methyl-3-heptanone, 2-methylcyclohexanone, diisobutyl ketone, 5-methyl-2-octanone, 3-methylcyclohexanone, 2-cyclohexen-1-one, 4-methylcyclohexanone, cycloheptanone, 4-tert-butylcyclohexanone, isophorone, benzyl acetone, or any combination thereof.

An exemplary nitrile solvent includes acetonitrile, acrylonitrile, trichloroacetonitrile, propionitrile, pivalonitrile, isobutyronitrile, n-butyronitrile, methoxyacetonitrile, 2-methylbutyronitrile, isovaleronitrile, N-valeronitrile, n-capronitrile, 3-methoxypropionitrile, 3-ethoxypropionitrile, 3,3'-oxydipropionitrile, n-heptanenitrile, glycolonitrile, benzonitrile, ethylene cyanohydrin, succinonitrile, acetone cyanohydrin, 3-n-butoxypropionitrile, or any combination thereof.

An exemplary sulfoxide solvent includes dimethyl sulfoxide, di-n-butyl sulfoxide, tetramethylene sulfoxide, methyl phenyl sulfoxide, or any combinations thereof.

An exemplary amide solvent includes dimethyl formamide, dimethyl acetamide, acylamide, 2-acetamidoethanol, N,N-dimethyl-m-toluamide, trifluoroacetamide, N,N-dimethylacetamide, N,N-diethyldodecanamide, epsilon-caprolactam, N,N-diethylacetamide, N-tert-butylformamide, formamide, pivalamide, N-butyramide, N,N-dimethylacetoacetamide, N-methyl formamide, N,N-diethylformamide, N-formylethylamine, acetamide, N,N-diisopropylformamide, 1-formylpiperidine, N-methylformanilide, or any combinations thereof.

A crown ether contemplated includes any one or more crown ethers that can function to assist in the reduction of the chloride content of an epoxy compound starting material as part of the combination being treated according to the invention. An exemplary crown ether includes benzo-15-crown-5; benzo-18-crown-6; 12-crown-4; 15-crown-5; 18-crown-6; cyclohexano-15-crown-5; 4',4"(5")-ditert-butyldibenzo-18-crown-6; 4',4"(5")-ditert-butyldicyclohexano-18-crown-6; dicyclohexano-18-crown-6; dicyclohexano-24-crown-8; 4'-aminobenzo-15-crown-5; 4'-aminobenzo-18-crown-6; 2-(aminomethyl)-15-crown-5; 2-(aminomethyl)-18-crown-6; 4'-amino-5'-nitrobenzo-15-crown-5; 1-aza-12-crown-4; 1-aza-15-crown-5; 1-aza-18-crown-6; benzo-12-crown-4; benzo-15-crown-5; benzo-18-crown-6; bis((benzo-15-crown-5)-15-ylmethyl)pimelate; 4-bromobenzo-18-crown-6; (+)-(18-crown-6)-2,3,11,12-tetra-carboxylic acid; dibenzo-18-crown-6; dibenzo-24-crown-8; dibenzo-30-crown-10; ar-ar'-di-tert-butyldibenzo-18-crown-6; 4'-formylbenzo-15-crown-5; 2-(hydroxymethyl)-12-crown-4; 2-(hydroxymethyl)-15-crown-5; 2-(hydroxymethyl)-18-crown-6; 4'-nitrobenzo-15-crown-5; poly-[(dibenzo-18-crown-6)-co-formaldehyde]; 1,1-dimethylsila-11-crown-4; 1,1-dimethylsila-14-crown-5; 1,1-dimethylsila-17-crown-5; cyclam; 1,4,10,13-tetrathia-7,16-diazacyclooctadecane; porphines; or any combination thereof.

In another embodiment, the liquid medium includes water. A conductive polymer complexed with a water-insoluble colloid-forming polymeric acid can be deposited over a substrate and used as a charge-transport layer.

Many different classes of liquid medium (e.g., halogenated solvents, hydrocarbon solvents, aromatic hydrocarbon solvents, water, etc.) are described above. Mixtures of more than one of the liquid medium from different classes may also be used.

The liquid composition may also include an inert material, such as a binder material, a filler material, or a combination thereof. With respect to the liquid composition, an inert material does not significantly affect the electronic, radiation emitting, or radiation responding properties of a layer that is formed by or receives at least a portion of the liquid composition.

4. Workpiece and Structures or lack Thereof

The printing apparatus 200 can be used to print lines on nearly any workpiece regardless of the number of layers, surface conditions at the exposed surface of the workpiece, structures on or within the workpiece or a lack of such structures. Therefore, liquid containment structures, such as well structures or cathode separators, may or may not be used. Such structures may be used if required for other reasons (i.e., reasons not related to printing) or if the user so desires. For example, cathode separators may be used in a passive matrix display so that one cathode is not electrically connected to another cathode when the cathode layer(s) are deposited onto a workpiece. Note that this reason is unrelated to using the printing apparatus 200. Additionally, one or more surface treatments may or may not be used. For example, a well structure may be fluorinated to reduce surface energy, or a surfactant may be added to a surface to improve wetting. As will be described later in this specification, the printing apparatus 200 has great flexibility that allows a user to select liquid compositions and printing conditions, such that lines of the proper width, length, and thickness can be formed over nearly any workpiece, regardless of surface conditions.

Figure 13:
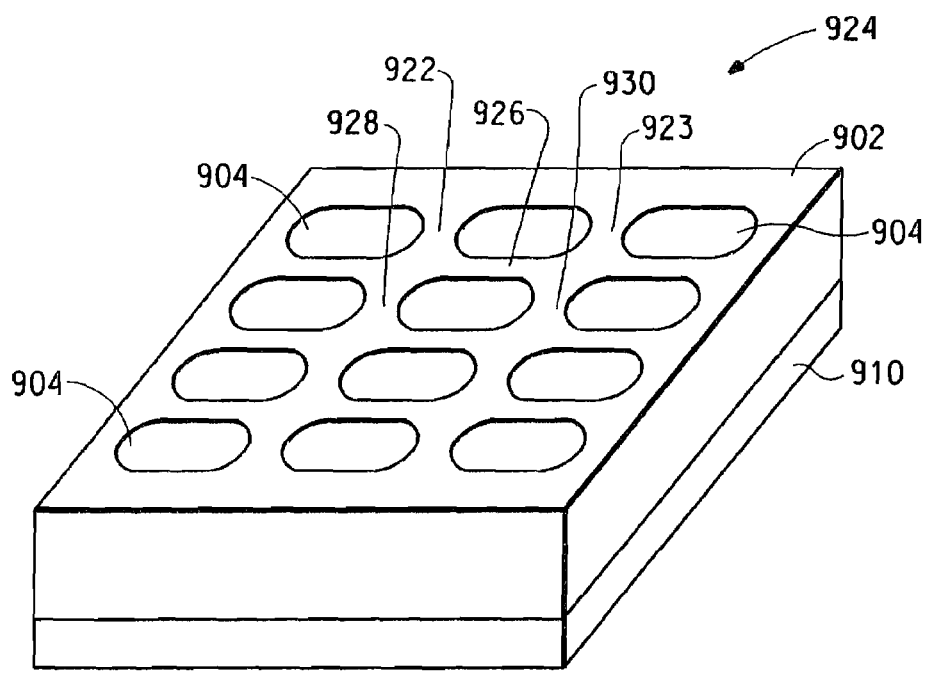
FIGS. 13 and 14 include illustrations of perspective views of substrate structures that can be used with a printing apparatus.
Figure 14:
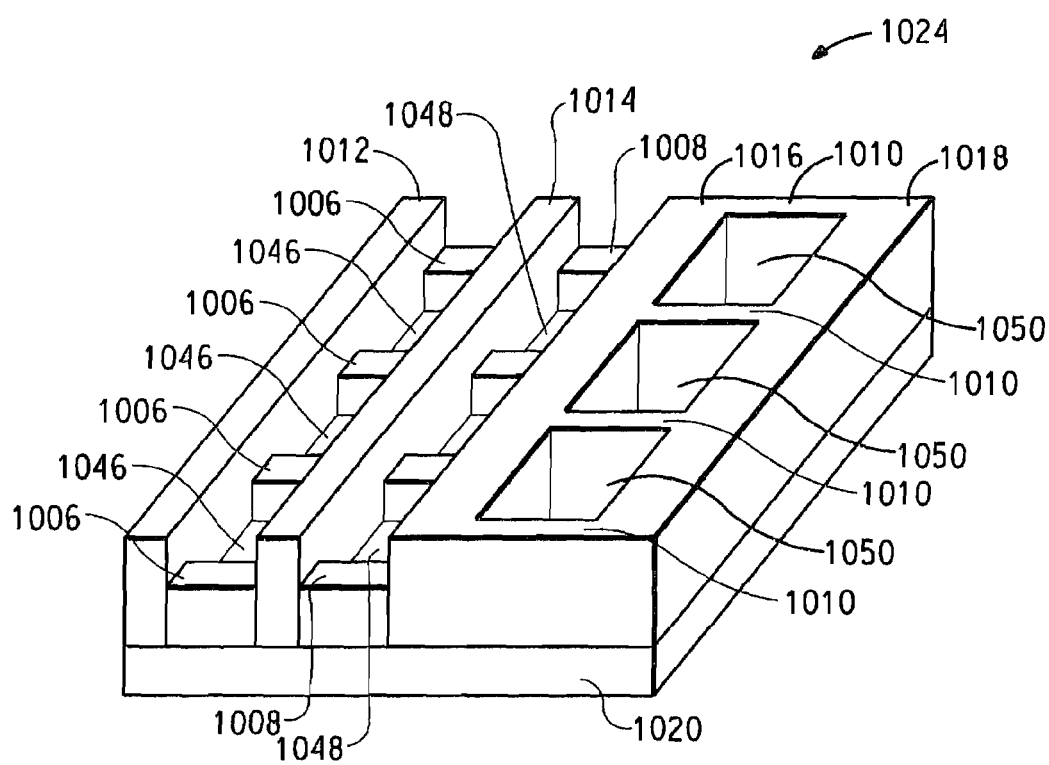

Exemplary, non-limiting substrate structures that may be present during printing are illustrated in FIGS. 13 and 14. In FIG. 13, a workpiece 924 includes a substrate structure 902 that is formed and overlies a substrate 910. The substrate 910 may or may not include electronic components or portions thereof. The substrate structure 902 is configured to define an array of openings 904. In one embodiment, the substrate structure 902 is a well structure. The array of openings 904 includes vectors of the openings 904. Each vector can be a row or a column of the openings 904. Locations of the substrate structure 902, between the openings 904 and along a particular vector, have heights that are substantially equal to one another. For example, the substrate structure 902 can be formed such that along a row, heights at locations between the openings 904, such as locations 922 and 923, are substantially equal to one another.

In one exemplary embodiment, the heights at locations between openings 904 along a first vector, such as a row (e.g., the locations 922 and 923), are substantially equal to heights at locations along a second vector, such as a column (e.g., a location 926). In alternative embodiments, the heights at locations along the second vector may be different from those at locations along the first vector. For example, heights at locations (e.g., the locations 922 and 923) along a first vector, such as a first row, are substantially equal to one another. Heights at locations along a second vector (e.g., locations 928 and 930), such as a second row, are also substantially equal to one another. However, the heights at the locations along the first vector (e.g., the locations 922 and 923) can be different from the heights at the locations along the second vector (e.g., the locations 928 and 930).

In a specific embodiment, the substrate structure 902 includes an inorganic material (e.g., silicon dioxide, silicon nitride, aluminum oxide, aluminum nitride, etc.) or an organic material (e.g., photoresist, polyimide, etc.), or any combination thereof. In another embodiment where an array for a display is being formed, the substrate structure 902 can include a black material (e.g., carbon) in order to increase contrast to ambient light while the display is being operated.

In one exemplary embodiment, the substrate structure 902 may be formed from one or more resist or polymeric layers. The resist may, for example, be a negative resist material or positive resist material. The resist may be deposited over the substrate 910 using a conventional technique. The substrate structure 902 may be patterned, as deposited, or may be deposited as a blanket layer and patterned using one or more conventional lithographic techniques. In one particular embodiment, the substrate structure 902 has a thickness in a range of approximately 1 to 10 microns as viewed from a cross-sectional view. In one exemplary embodiment, the openings 904 are in a range of approximately 50 to 100 microns wide and in a range of approximately 100 to 500 microns long when viewed from a plan view. The slope of the substrate structure 902 at the openings 904 may be less than 90°, approximately 90°, or more than 90° with respect to the surface at the bottom of the openings 904.

In an alternative embodiment, a workpiece 1024 can include a combination of structures that can form a liquid containment structure having different heights at different locations as illustrated in FIG. 14. The liquid containment structure, including longitudinal portions and transverse portions, overlies a substrate 1020 and defines openings having depths defined by the heights of the transverse portions of the liquid containment structures. The substrate 1020 may or may not include electronic components or portions thereof.

In one exemplary embodiment, longitudinal portions 1012 and 1014 and transverse portions 1006 define a set of openings 1046. In one exemplary embodiment, the transverse portions 1006 are substantially perpendicular to the longitudinal portions 1012 and 1014. In an alternative embodiment, the transverse portions are skewed from perpendicular, such that each transverse portion 1006 is not perpendicular to longitudinal portions 1012 and 1014 but still contacts both longitudinal portions 1012 and 1014. The set of openings 1046 is included in a vector of the openings 1046. The transverse portions 1006 have heights that are substantially equal to one another and, as a result, the openings 1046 have depths that are substantially equal to one another.

In this exemplary embodiment, a set of openings 1048 is defined by longitudinal portions 1014 and 1016 and transverse portions 1008. Transverse portions 1008 have heights that are substantially equal to one another. Similarly, a set of openings 1050 is defined by longitudinal portions 1016 and 1018 and transverse portions 1010. The transverse portions 1010 have substantially equal heights to one another and to the longitudinal portions 1016 and 1018.

In one exemplary embodiment, the transverse portions 1006 and the transverse portions 1008 have heights that are substantially equal to one another. In an alternative embodiment, the transverse portions 1006 and the transverse portions 1008 have heights that are different. In a particular embodiment, the transverse portions 1006 and the transverse portions 1008 have heights that are substantially equal to one another, while the transverse portions 1010 have heights that are different from the heights of the transverse portions 1006 and the transverse portions 1008.

Such height differences between sets of transverse portions may be useful in controlling thicknesses of different materials. For example, different sets of openings may be used in forming components associated with different colors in an exemplary display within an electronic device. In one exemplary embodiment, the openings 1046 are located where blue radiation-emitting components are formed, the openings 1048 are located where green radiation-emitting components are formed, and the openings 1050 are located where red radiation-emitting components are formed.

The longitudinal and transverse portions as illustrated in FIG. 14 can be formed by depositing one or more materials as previously described with respect to the substrate structure 902. The longitudinal and transverse portions can be deposited as one or more patterned layers or may be deposited and patterned using a conventional lithographic technique.

In one particular embodiment for an electronic device that includes an array of radiation-emitting components, a first liquid composition is printed in a line substantially parallel to and between the longitudinal portions 1012 and 1014, to lie within the openings 1046 and to at least partially overlie the transverse portions 1006. A second liquid composition is printed in a line substantially parallel to and between the longitudinal portions 1014 and 1016, to lie within the openings 1048 and to at least partially overlie transverse the portions 1008. In addition, a third liquid composition is printed in a line substantially parallel to and between the longitudinal portions 1016 and 1018, to lie within the openings 1050 and to at least partially overlie the transverse portions 1010. When the transverse portions 1006 and 1008 have heights that are substantially equal to one another and are different from the transverse portions 1010, layers formed within the openings 1046 and 1048 may or may not have thickness different than a layer formed within the openings 1050. For example, a blue light-emitting layer may be formed within the openings 1046, a green light-emitting layer may be formed within the openings 1048, and a red light-emitting layer may be formed within the openings 1050.

In still another embodiment, the workpiece may or may not include a previously patterned layer. For example, the liquid composition may be printed as a first layer over a substrate. In another embodiment, another patterned layer, such as first electrodes for electronic components, may already lie over the substrate before the liquid composition is printed. In this embodiment, the first electrodes are not liquid containment structures because their principal function is to provide charged carriers to or carry charged carriers away from the electronic components.

5. Printing Lines

The wide variety of configurations of the printing apparatus 200, the liquid compositions, the workpieces and their associated layers and structures, and the operating parameters for the printing apparatus 200 provide a nearly endless array of options available to users to print one or more lines for one or more layers that can be used in an electronic device.

FIGS. 3 and 15 to 21 illustrate patterns of some of the lines that can be formed using the printing apparatus 200. In FIG. 3, the line 362 can be straight and substantially parallel to the x-axis. In one embodiment, the chuck 222 moves bi-directionally in the y-direction, and the printing head 244 moves bi-directionally in the x-axis. The chuck 222 can be positioned to the correct y-direction position using a conventional stepper motor. After the chuck 222 stops and upon supplying proper signal(s) to the printing head 244, the line 362 is printed onto the workpiece 324. Note that the line 362 may be printed over a portion of the chuck 222. In an alternative embodiment, the line 362 may only be printed on the workpiece 324 or may be extended to print onto the chuck 222 at a location on an opposite side of the workpiece 324.

Figure 15:
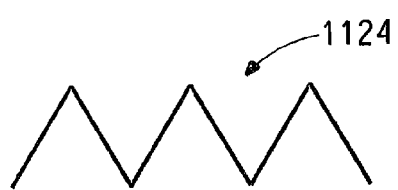
FIGS. 15 to 21 include illustrations of patterns of lines that can be printed using a printing apparatus.
Figure 16:
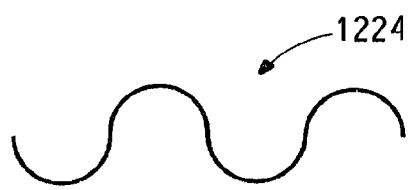
Figure 17:
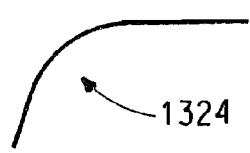
Figure 18:
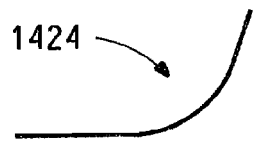
Figure 19:
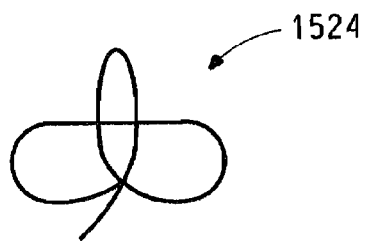

The chuck 222, printing head 244, or both may or may not have its (their) movement restricted. As previously described, the chuck 222, the printing head 244, or both may have many different types of motion, potentially along more than one axis. Also, each of the chuck 222 and the printing head 244 may or may not be moved while printing a line. As a result, many different patterns for the lines may be formed to overlie a substrate. FIGS. 15 to 19 include illustrations of exemplary patterns formed by a single dispense nozzle. For example, line 1124 includes a saw-tooth design, as illustrated in FIG. 15, which exemplifies a continuous line with segments that form sharp corners. In an alternative embodiment, a line 1224 has a shape in the form of a sinusoidal function, as illustrated in FIG. 16. In another embodiment, a line 1324 includes a curve having a negative rate of change of slope along a horizontal axis, as illustrated in FIG. 17, and a line 1424 includes a curve having a positive rate of change of slope along the horizontal axis, as illustrated in FIG. 18. The relative movement of the chuck 222 and the continuous dispense nozzle may form more complex patterns over a substrate, such as a cloverleaf 1524 in FIG. 19. Although not illustrated, other patterns including one or more letters, one or more numbers, one or more words, one or more symbols, one or more graphical designs, or any combination of thereof can be printed with the printing apparatus 200. In an alternative embodiment, more than one line having patterns, such as those illustrated in FIGS. 15 to 19, can be printed simultaneously by the printing apparatus 200 having a printing head with more than one nozzle or by repeatedly printing lines from a printing head having one nozzle.

Figure 20:
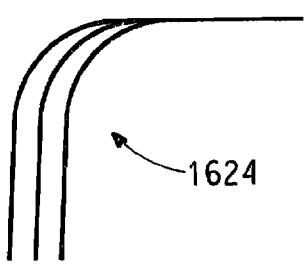
Figure 21:
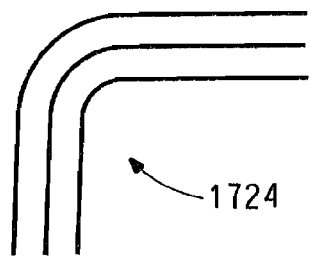

FIGS. 20 and 21 illustrate patterns of lines that can be achieved using the printing head 444 having the nozzles 445 and the pivoting mechanism 446. When printing lines using the printing head 444, the lines may be allowed to cross over or be substantially prevented from crossing over one another by proper use of the pivoting mechanism 446. For example, lines 1624, including one or more liquid compositions, may be printed over the workpiece 324 along a curve, as illustrated in FIG. 20. When the pivoting mechanism is in a fixed position, the chuck 222, the printing head 444, or both may move in directions along the x-axis and y-axis resulting in the conjoining, crossing, or overlapping of lines. Such conjoining, crossing, or overlapping of lines may or may not be desired. For example, in forming complex images, such conjoining, crossing, or overlapping may be desired. However, in another embodiment, such conjoining, crossing, or overlapping may pose a particular problem when dispensing liquid compositions that have different compositions or are associated with the emission or absorption of differing wavelengths of radiation, such as lines associated with different colors of an electronic device including a display.

In an alternative embodiment, the nozzles 445 are permitted to rotate using the pivoting mechanism 446 during printing of lines 1724, as illustrated in FIG. 21. In this exemplary embodiment, the lines do not conjoin, cross, or overlap. As such, better control over color emission may be achieved.

6. Considerations Involving More Than One Factor a. Segment Width and Viscosity

The width of a segment to be printed onto the workpiece 324 can be controlled by increasing the viscosity of a liquid composition after it reaches the workpiece 324 in order to constrain the flow of the liquid composition in one or more lateral directions as seen from a plan view of the workpiece 324. The viscosity of the liquid composition would normally increase when exposed to ambient conditions as a liquid medium within the liquid composition evaporates. However, the rate at which the viscosity increases under ambient conditions may be too low, particularly when a high-resolution display is to be formed.

The viscosity of nearly all liquids decreases with an increase in temperature and increases with a decrease in temperature. The vapor pressure of nearly all materials in a liquid state increases with an increase in temperature and decreases with a decrease in temperature. As will be described in more detail, the viscosity of a liquid composition can be increased directly by reducing the temperature of the liquid composition or indirectly by increasing the temperature of the liquid composition such that a substantially constant amount of solids resides within a smaller volume of a liquid medium due to an increased evaporation rate. The relative evaporation rates between different liquids can be determined by boiling points or vapor pressures. For example, a lower boiling point material has a higher evaporation rate as compared to a higher boiling point material. Similarly a higher vapor pressure material (at a specific temperature) has a higher evaporation rate as compared to a lower vapor pressure material (at the same specific temperature).

In one embodiment, the rate at which the viscosity of a liquid composition changes can be achieved by maintaining a temperature difference between the liquid composition being printed onto the workpiece 324 and the workpiece 324, itself. In a specific embodiment, the liquid composition, the workpiece 324, or both are not substantially at the ambient temperature. The temperature of the workpiece 324 can be changed by heating or cooling the chuck 222, and the temperature of the liquid composition can be changed by heating or cooling the liquid composition within the printing head 244, the feed line 348, the container 349, or any combination thereof.

Figure 22:
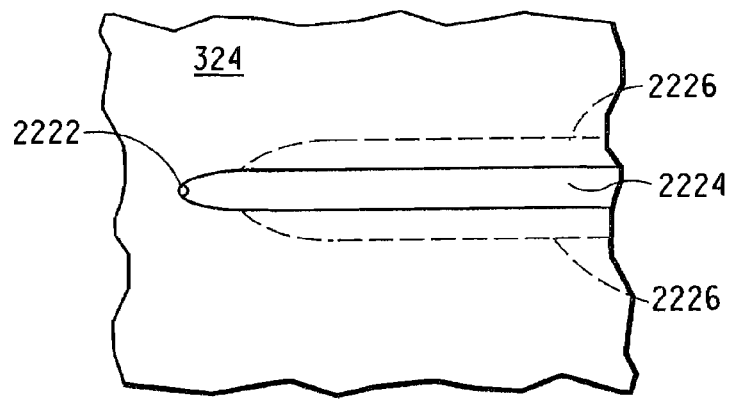
FIG. 22 includes a plan view of a line being printed over a workpiece to illustrate differences in line widths when using a printing apparatus and processes described herein compared to a conventional technique.

In one embodiment, the printing apparatus 200 can be used to print a liquid composition as a segment onto the workpiece 324. The width of the segment may be controlled by using any one or more of the temperature adjusting elements previously described to achieve the temperature difference as illustrated in FIG. 5 as previously described. FIG. 22 includes an illustration of a plan view of a workpiece 324 during and shortly after continuously printing a liquid composition over at least a portion of the workpiece 324 using one or more of the embodiments described herein. The dimension of the nozzle 245 can be in a range of approximately 10 to 20 microns wide. In one embodiment, the nozzle 245 is approximately 18 microns wide. The liquid composition reaches the workpiece 324 in a stream 2222, which is illustrated by a circle in FIG. 22. The liquid reaches the workpiece 324 as the printing head 244 (not illustrated in FIG. 22) moves to the left. The liquid composition begins to laterally spread and forms segment 2224 in FIG. 22. The temperature difference allows the viscosity to increase faster than the ambient viscosity increase rate. If the liquid composition would be printed under ambient conditions (liquid composition and workpiece 324 both substantially at the ambient temperature) the printed line would have a shape corresponding to the dashed lines 2226. Although not meant to limit, the width of segment 2224 is in a range of approximately 40 to 60 microns, and the width of the dashed lines (distance between dashed lines 2226) can easily exceed 100 microns.

When forming high resolution, small geometry patterns, the width, as illustrated by dashed lines 2226, may be unacceptable, and thus cause a material within the liquid composition to intermix with portion(s) of the workpiece 324 in which such material is not intended or desired. For example, if a red light-emitting material is part of a liquid composition, its introduction into a region of a workpiece 324 in which a blue or green light-emitting component has been or will be formed may affect the wavelength of the emission maximum for that blue or green light-emitting component. A similar concept may hold for radiation-sensing components that are to respond to radiation at different wavelengths or spectra of wavelengths.

The temperature(s) used for the liquid composition and workpiece 324 are determined more by practical considerations than by theoretical limits. Temperature considerations for the workpiece 324 and the liquid composition are described in more detail below. The actual temperatures selected may depend upon a number of considerations. These considerations may or may not depend on the material(s), liquid medium, or a combination thereof within the liquid composition. After reading this specification, skilled artisans will be able to choose temperatures for the chuck 222, workpiece 324, printing head 244, feed line 348, container 349, or any combination thereof to meet the needs or desires for the particular application selected.

The selection of the temperature(s) may be limited by ambient conditions. For example, a clean room may be maintained at a temperature of approximately 20° C. and 40% relative humidity. At these conditions, the dew point is about 5° C. Therefore, the temperature of the chuck 222, workpiece 324, or both may be maintained at a temperature greater than 5° C. to reduce the likelihood of water condensing on the chuck 222, workpiece 324, or both. In another embodiment, the atmosphere within the printing apparatus 200 can be changed so that the printing is performed in an atmosphere that is different from the ambient atmosphere outside of the printing apparatus 200. For example, air or another gas with substantially less water vapor may allow the temperature of the chuck 222, the workpiece 324, or both to be taken to a temperature of 5° C. or lower. If the workpiece 324, the printing head 244, the feed line 348, the container 349, or any combination thereof is cooled below the ambient temperature (e.g., 20° C.), a liquid medium with a boiling point no greater than 150° C. can be used.

One or more layers or electronic components already residing on or within the workpiece 324 may determine a lower or an upper limit for the temperature of the chuck 222, the workpiece 324, or both. For example, if the workpiece 324 is taken below 0° C., any residual water on or within any part of the workpiece 324 may become frozen and damage layer(s) or portions of component(s), including the layer(s) formed over the substrate of workpiece 324 during or after printing. On the other end of the spectrum, the temperature of the workpiece 324 or the chuck 222 should not be so high as to damage layer(s) or portions of component(s) on or within the workpiece 324 or the layer(s) formed on the workpiece 324 during printing. As used in this specification, damage includes significantly reducing the lifetime of an electronic component, including any material(s) or layer(s) therein, as compared to printing at substantially ambient conditions.

Regarding the liquid composition, the limits of its temperature exposure can depend upon material(s) and liquid medium of the liquid composition. The lower and upper temperature limits of the solid material(s) within the liquid composition are similar to limits for the layer(s) and material(s) on or within the workpiece 324. For example, if the workpiece 324 includes an organic active layer or the liquid composition is used to form an organic active layer, such organic active layer or liquid composition would not be exposed to a temperature of 80° C. for a prolonged time. Otherwise, the lifetime of electronic components formed from the liquid composition may be significantly reduced.

The liquid medium may have temperature limits determined more by viscosity and vapor pressure considerations. For lower temperatures, the viscosity of the liquid medium may not be so low as to substantially adversely affect the flow of the liquid composition at the printing head 244. As the molecular weight(s) of component(s) within the liquid medium decrease, the temperature of the liquid medium may be reduced without significantly adversely affecting the flow of the liquid composition within the printing head 244. For higher temperatures, the temperature of the liquid medium may not be so high that the liquid medium boils, flashes, or has an unacceptably high vapor pressure. As the molecular weight(s) of component(s) within the liquid medium increase, the temperature of the liquid medium may be increased without significantly adversely affecting the flow of the liquid composition within the printing head 244.

In one embodiment, the temperature used for the liquid composition, the workpiece 324, the chuck 222, the printing head 244, the feed line 348, and the container 349 is limited by a plurality of considerations. For example, the printing operation may be performed in a clean room, and therefore, the workpiece 324 and the chuck 222 may be maintained at a temperature higher than 5° C. Also, the liquid composition may be used to form an organic active layer, or the workpiece 324 may already include an organic active layer at the time of printing. In this embodiment, the organic active layer is not exposed to a temperature greater than approximately 80° C. for a prolonged time. Therefore, the maximum temperature difference (ΔT in FIG. 5) for this specific embodiment is 75° C. After reading this specification, skilled artisans will consider the temperature limitations of the liquid compositions, the layer(s) or the component(s) present on the workpiece 324 during printing, and other limitations of the printing apparatus 200 in order to select proper temperatures for a specific application.

b. Reducing or Eliminating Stitching Defects

The printing apparatus 200 can be configured to print segments in an array that have a significantly reduced likelihood of stitching defects. Stitching defects can occur when a plurality of lines is being printed, and the local conditions for one or more specific segments of the same type vary. For example, when several segments of the same composition are printed on a workpiece, the outermost segments may dry faster than the inner segments. When the segments are part of an electronic device, stitching defects 120, such as those illustrated in FIG. 1, can be seen when using an electronic device including the array 100. The stitching defects can be reduced or eliminated by controlling one or more factors, such as one or more printing conditions, selection of liquid medium within a liquid composition, or any combination thereof.

Figure 23:
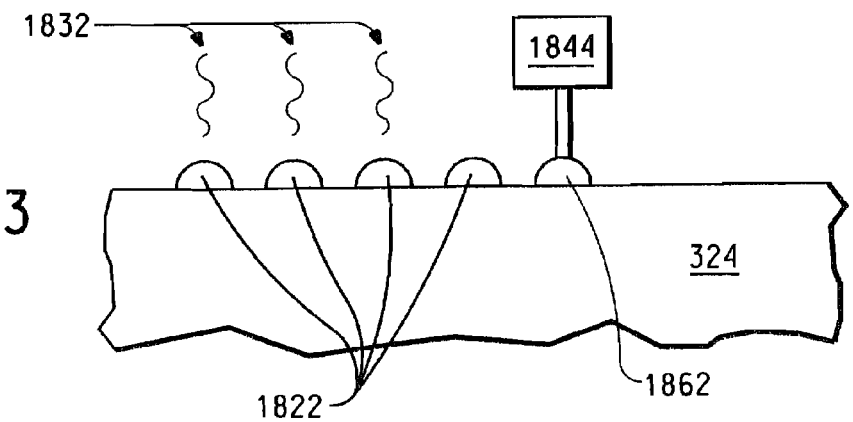
FIGS. 23 and 24 include illustrations of a cross-sectional view and a plan view, respectively, of a workpiece including printed lines.

In one embodiment, the stitching defects can be reduced or eliminated by exposing the segments of the same type to substantially the same conditions during and after continuous printing. FIG. 23 illustrates a cross-sectional view of a portion of the workpiece 324, segments 1822 of one or more lines that have recently been printed, and a segment 1862 that is being printed using a printing head 1844.

The portion of the workpiece 324 may correspond to part or all of an array of radiation-emitting components, radiation-responsive components, or any combination thereof. The segments 1822 and 1862 are printed using substantially the same liquid composition. Also, the segments 1822 and 1862 can be separate lines or portions of the same line. At the time of printing the segment 1862, one side of the segment 1862 is exposed to the recently printed segments 1822, where the liquid medium is evaporating to generate a significant amount of vapor 1832, and the other side of the segment 1862 is not exposed to any recently printed segments that are generating a significant amount of vapor. For example, to the right of segment 1862, the array may have no segments that have been printed. Alternatively, that part of the array may have segments that were printed some time ago and are no longer generating a significant amount of vapor. After the segment 1862 is printed, it becomes a recently printed segment, similar to segments 1822, and a new segment (not illustrated) will be printed to the right of the segment 1862 in FIG. 23. Just like the segment 1862, the next segment will have recently printed segments to the left and no segments that are generating a significant amount of vapor to the right.

In one specific embodiment, the liquid composition may take a time in a range of approximately 30 to 60 seconds to dry or otherwise reach a point where the printed segment no longer has any significant amount of the liquid medium evaporating from such printed segment. In one embodiment, the area over the workpiece 324 to the right of the segment 1862 may have no printed lines. In another embodiment, the area over the workpiece 324 to the right of the segment 1862 may have printed lines (not illustrated in FIG. 23), but such printed lines may not be generating any significant amount of vapor.

Figure 24:
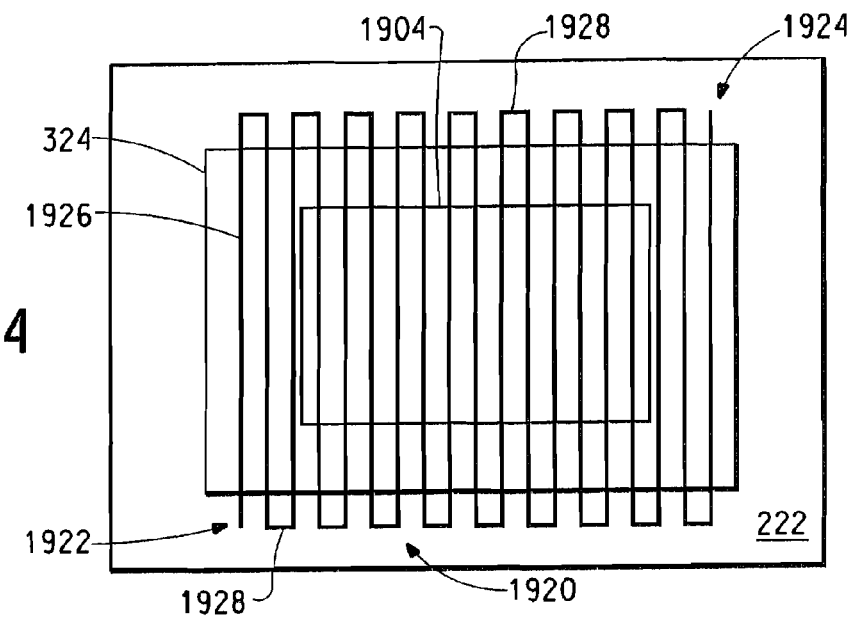

In another embodiment, a line 1920 can be printed over the workpiece 324 and portions of the chuck 222 as illustrated in FIG. 24. In one embodiment, the line 1920 is a single, continuous line in the shape of a square wave as seen from a plan view. The line 1920 starts at a point 1922 and ends at another point 1924. The line 1922 includes segments 1926, which have lengths substantially parallel to one another and extend vertically in FIG. 24, and segments 1928, which have lengths substantially parallel to one another and extend horizontally in FIG. 24. The workpiece 324 includes an array 1904, in which electronic components that include the segments 1926 are being formed. In one embodiment, an exposed portion of the chuck 222 and an exposed surface of the workpiece 324 are at substantially the same elevation, and in another embodiment, the exposed portion of the chuck 222 is in a range of approximately 0.5 to 2 mm from the elevation of the exposed surface of the workpiece 324.

In one embodiment, only the portions of the segments 1926 within the array 1904 are used for electronic components. However, if the segments were to terminate at the edges of the array 1904, the portions of the segments 1926 closest to the edges would dry differently compared to portions of the same segments closer to the center of the array 1904. In one specific embodiment, the line 1920 has portions that are printed over other parts of the workpiece 324 outside of the array 1904 and the chuck 222.

More specifically, when printing the line 1920, dummy segments are printed before, between, and after those segments 1926 that overlie the array 1904. Referring to FIG. 24, three segments 1926 are printed before reaching the array 1904, and three segments 1926 are printed after the array 1904. The number of dummy segments before reaching the array 1904 or after printing over the array 1904 can vary, and in one embodiment is in a range of 1 to 10. All of the segments

1928 are printed outside of the array. Therefore, the three segments 1926 on each side of the array 1904 and the segments 1928 are dummy segments. The dummy segments may remain within a substantially completed electronic device or may be removed after they have served their principal purpose (e.g., after the segments 1926 and 1928 of the line 1920 are dry).

After the line 1920 is printed on the workpiece 324, the segments 1928 and portions of the segments 1926 outside of the array 1904 can be selectively removed using a conventional technique. For example, a conventional lithographic or laser ablation operation can be performed. Such selective removal can occur after the line 1920 is dried and before forming any subsequent layers over the line 1920 or may be performed after one or more subsequent layers are formed over the line 1920. Such subsequent layer(s) may be part of a hard mask that can be used to protect the array while the portions of the line 1920 outside the array are removed. In one embodiment, such portions of the line 1920 outside the array 1904 may be removed after one or more electrodes for the electronic components within the array 1904 are formed. In one embodiment for an active matrix display, a common cathode may be formed over substantially all of the array 1904, and portions of the line 1920 outside the array 1904 are removed after the common cathode covers portions of the line 1920 within the array 1904. In another embodiment for a passive matrix display, one or more metal-containing layers can be deposited over the line 1920 and over cathode separators (not illustrated) within the array 1904. After forming such one or more metal-containing layers, the portions of the line 1920 outside the array 1904 are removed.

In another embodiment, the segments 1928 may not be used. In this embodiment, the printing head 1844 would stop dispensing near the end of one of the segments 1926 and start before printing the next segment 1926. In still other embodiments, other patterns for the line or segments can be printed. For example, the orientation of the segments 1926 with respect to the array 1904 can be changed, such that the segments 1926 have lengths that extend horizontally or diagonally instead of vertically. Also, the line 1920 can be curved along segments 1928. Further, the segments 1926 may have different shapes, such as one or more of saw tooth, serpentine, etc.

In one embodiment, the array 1904 can include a first set (e.g., row) of first electronic components closest to the top of the array 1904, a second set (e.g., another row) of second electronic components closest to the bottom of the array 1904. Each of the segments 1926 can form a layer that extends continuously from one of the first electronic components within the first set to one of the second electronic components within the second set. The array 1904 can be formed that is substantially free of a stitching defect. In another embodiment, additional lines may be formed in a similar manner. For example, line 1920 may form a blue light-emitting layer before forming another line (not illustrated) that forms a green light-emitting layer, that is formed before forming yet another line (not illustrated) that forms a red light-emitting layer.

Figure 25:
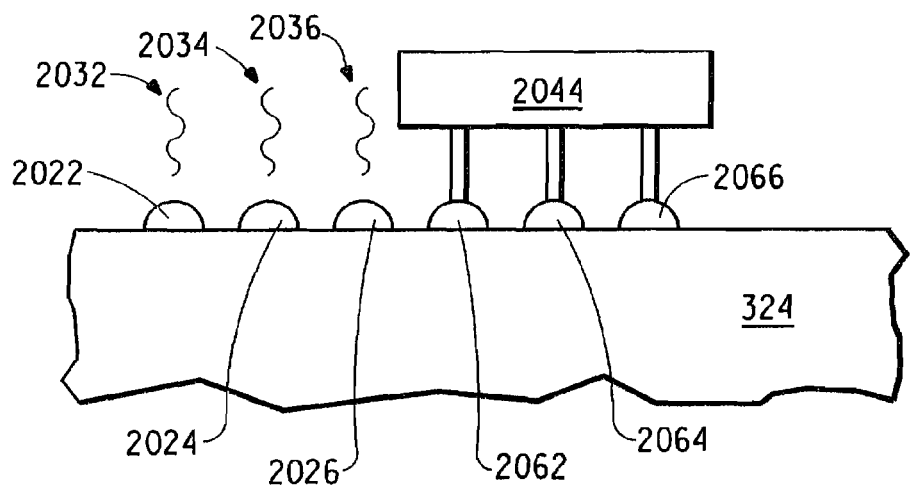
FIGS. 25 and 26 includes illustrations of cross sectional views of workpieces for printing lines in accordance with alternative embodiments.

More than one segment can be printed at one time and still not form a stitching defect. FIG. 25 includes an illustration where three different types of segments having different compositions are printed simultaneously on the workpiece 324. In one embodiment, recently printed segments 2022, 2024, and 2026 are used to form blue, green, and red light-emitting layers, respectively, and segments 2062, 2064, and 2066, which are used to form blue, green, and red light-emitting layers, respectively, are currently being printed using printing head 2044. Vapors 2032, 2034, and 2036 are generated from the recently printed segments 2022, 2024, and 2026, respectively. In this embodiment, the currently printed (blue) segment 2062 lies between a recently printed (red) segment 2026 and a currently printed (green) segment 2064. The currently printed (green) segment 2064 lies between currently printed (blue and red) segments 2062 and 2066. The currently printed (red) segment 2066 has a currently printed (green) segment 2064 on one side and the other side of the currently printed (red) segment 2066 is not exposed to any recently printed segments that are producing a significant amount of vapor.

In another embodiment, the relative positions of the segments 2062, 2064, and 2066 can be changed, however, once printing starts, the relative positions of the three should stay the same so that each type of segment (red, green, or blue) is exposed to substantially the same local environmental conditions as the other segments of the same type as they are printed. In this embodiment, more than one segment is printed simultaneously; however, only one segment of each type (blue, green, red) is printed simultaneously.

Figure 26:
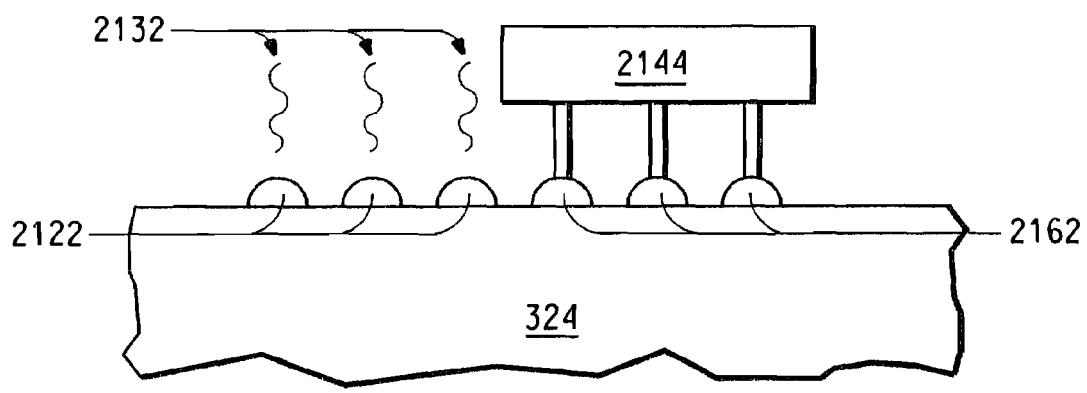

Stitching defects may also be reduced or eliminated using a liquid medium having a higher boiling point. By using a liquid medium with a higher boiling point, the time for drying a liquid composition is significantly longer than the time before the next segment, or set of neighboring segments, is printed beside the previous segment, or set of segments. In one embodiment, the liquid medium with the higher boiling point also has a relatively higher viscosity. In this embodiment, the relatively higher viscosity helps to reduce flow along the surface of the workpiece 324. FIG. 26 illustrates a cross-sectional view of a portion of the workpiece 324, segments 2122 that have recently been printed, and segments 2162 that are currently being printed using printing head 2144. The segments 2122 and 2162 are printed using substantially the same liquid composition.

In one embodiment, the liquid medium used in the liquid composition for printing segments 2122 and 2162 has a significantly higher boiling point than the liquid medium for the liquid compositions used to print segments 1822 and 1862. For example, the liquid medium used in segments 1822 and 1862 can be an anisole, a derivative of anisole or a mixture including one or both of anisole or its derivative. Such liquid medium has a boiling point between 135 to 200° C. The liquid medium for liquid composition used to print segments 2122 and 2162 may have a boiling point of at least 200° C. In one embodiment, the boiling point may be as high as approximately 300° C. An exemplary, non-limiting liquid medium includes ethylene glycol, propylene glycol, 1,4 butanediol, ethanolamine, nitrobenzene, benzyl hydroxide, or any combination thereof.

In one embodiment, a liquid composition comprises a single liquid medium with one solvent having a boiling point no greater than 150° C., and in another embodiment, a liquid composition comprises liquid medium with two or more solvents, wherein the boiling point for such liquid medium is no greater than 135° C. In one embodiment, the liquid medium has a boiling point of at least 50° C.

In the preceding paragraphs, many exemplary boiling points of a liquid medium were described. The exemplary numbers should not be construed as requirements or limits to the present invention. In other embodiments, the liquid medium has a boiling point in a range of approximately 50 to 300° C. In another embodiment, the liquid medium may have a boiling point less than or greater than those described.

Because the boiling point of the liquid medium is higher, the rate at which vapor 2132 is generated from segments 2122 is lower. Therefore, evaporation of liquid medium from the segments 2122 and 2162 creates a more uniform vapor "cloud" or blanket over the segments 2122 and 2162. Note that additional sets of segments would soon be printed beside the rightmost segment 2162. The more uniform local environmental conditions for each of the segments 2122 and 2162 during drying can help to reduce or eliminate the stitching defects.

c. Hybrid Printing

One or more layers can be formed in which a substantial amount of one or more guest materials is incorporated at least partially within at least one of the layers, which comprises at least one host material. Hybrid printing may be performed using the printing apparatus 200 or an ink-jet printer. The layer may or may not be an organic layer. In one embodiment, a substantial amount is at least approximately 40 percent, and in another embodiment, is at least approximately 50 percent. In still a further embodiment, substantially all of the one or more guest materials may be incorporated into the layer. Well structures may or may not be present during the incorporation process. More specifically, one or more liquid compositions, including such one or more guest materials and a liquid medium, may be in the form of a solution, dispersion, emulsion, or suspension.

This paragraph includes a description of one possible interaction between an organic layer and the liquid composition. Note that the organic layer can be a layer overlying a substrate. Alternatively, the substrate may not be present or the organic layer is the substrate. Although the description in this paragraph refers to a liquid composition having one guest material to simplify understanding, more than one guest material may be used, and the principles for a dispersion, emulsion, or suspension are similar. Alternatively, the liquid composition may also include a host material, which is also present in the organic layer, in addition to one or more guest materials. The liquid composition may be placed over the precise area where the guest material is to intermix with the organic layer. The liquid medium of the liquid composition is capable of forming a solution, dispersion, emulsion, or suspension with a localized region of the organic layer to convert the localized region of the organic layer from a substantially solid state to a substantially liquid state in the form of such solution, dispersion, emulsion, or suspension. The organic layer has good miscibility characteristics with the liquid medium used for the liquid composition. As the liquid medium converts a localized region of the organic layer to a substantially liquid state, the guest material can intermix with the organic layer. Unexpectedly, most of the guest material intermix with the organic layer. In one embodiment, substantially all of the guest material from the liquid composition intermixes with the localized region of the organic layer. The guest material can affect the radiation emitted from, responded to by, transmitted through, or electronic characteristics of the organic layer.

The host material(s) for forming the organic layer vary based upon the application of the organic electronic device and the use of the organic layer within the organic electronic device. At least portion(s) of the organic layer may be used as a radiation-emitting organic active layer, a radiation-responsive organic active layer, a filter layer, or layer within an electronic component (e.g., at least part of a resistor, transistor, capacitor, etc.). One or more materials as previously described within the Liquid Compositions section can be used.

A guest material can include any one or more of all known materials used for an electroluminescent layer, charge-injection, charge-transport, or charge-blocking layer, or another material used for an organic active layer or its corresponding dopant. Such guest material can include an organic dye, an organometallic material, a polymer (conjugated, partially conjugated, or non-conjugated), or any combination thereof. The guest materials may or may not have fluorescent or phosphorescent properties.

An example of the organic dye includes 4-dicyanmethylene-2-methyl-6-(p-dimethylaminostyryl)-4H-pyran (DCM), coumarin, pyrene, perylene, rubrene, a derivative thereof, or any combination thereof.

Am example of the organometallic material includes a functionalized polymer comprising one or more functional groups coordinated to at least one metal. An exemplary functional group contemplated for use includes a carboxylic acid, a carboxylic acid salt, a sulfonic acid group, a sulfonic acid salt, a group having an OH moiety, an amine, an imine, a diimine, an N-oxide, a phosphine, a phosphine oxide, a β-dicarbonyl group, or any combination thereof. An exemplary metal contemplated for use includes a lanthanide metal (e.g., Eu, Tb), a Group 7 metal (e.g., Re), a Group 8 metal (e.g., Ru, Os), a Group 9 metal (e.g., Rh, Ir), a Group 10 metal (e.g., Pd, Pt), a Group 11 metal (e.g., Au), a Group 12 metal (e.g., Zn), a Group 13 metal (e.g., Al), or any combination thereof. Such an organometallic material includes a metal chelated oxinoid compound, such as tris(8-hydroxyquinolato)aluminum ($Alq_3$); a cyclometalated iridium or platinum electroluminescent compound, such as a complex of iridium with one or more phenylpyridine, phenylquinoline, or phenylpyrimidine ligands as disclosed in Published PCT Application WO 02/02714, or an organometallic complex described in, for example, published applications US 2001/0019782, EP 1191612, WO 02/15645, WO 02/31896, and EP 1191614; or any mixture thereof.

An examples of a conjugated polymer includes a poly (phenylenevinylene), a polyfluorene, a poly(spirobifluorene), a copolymer thereof, or any mixture thereof.

Other material previously described in the Liquid Compositions section may be used instead of or in conjunction with those described in this section.

The liquid medium that can be used with the guest material can be any one or more of those previously described within the Liquid Compositions section.

When used for the production of a full-color, organic electronic device, in one embodiment, a first guest material is selected to emit red light, a second guest material is selected to emit green light, and a third guest material is selected to emit blue light. After placement of each of the liquid compositions, each pixel column contains three subpixels, wherein within a finished electronic device, such as a display, one subpixel emits red light, one subpixel emits green light, and one subpixel emits blue light. Alternatively, one or more guest materials can be contained in a single liquid composition and deposited to form a pixel or subpixel with a broader emission spectrum, for example with a Full Width Half Maximum (FWHM) of greater than 100 nm, or even selected to emit white light with an emission profile encompassing the visible spectrum of 400 to 700 nm.

A liquid medium contemplated for use in any one or more of the processes or any one or more of the electronic devices described herein is chosen so as to provide one or more proper solution characteristics for both the guest material and the organic layer that receives the guest material. A factor to be considered when choosing the liquid medium includes, for example, viscosity of the resulting solution, emulsion, suspension, or dispersion, molecular weight of a polymeric material, solids loading, type of liquid medium, boiling point of the liquid medium, temperature of the workpiece 324, thickness of an organic layer that receives a guest material, or any combination thereof.

When selecting a liquid medium, a particular liquid medium may form a solution, emulsion, suspension, or dispersion with one type of layer but may not necessarily form a solution, emulsion, suspension, or dispersion with another type of layer. For example, referring to FIG. 27, a particular liquid medium may form a solution, emulsion, suspension, or dispersion with the organic active layer 2350 but not with the charge-transport layer 2340. The liquid medium has a vapor pressure low enough so that is will not evaporate prior the desired level of intermixing with the guest material(s) or host material(s) into the organic active layer 2350.

Figure 27:
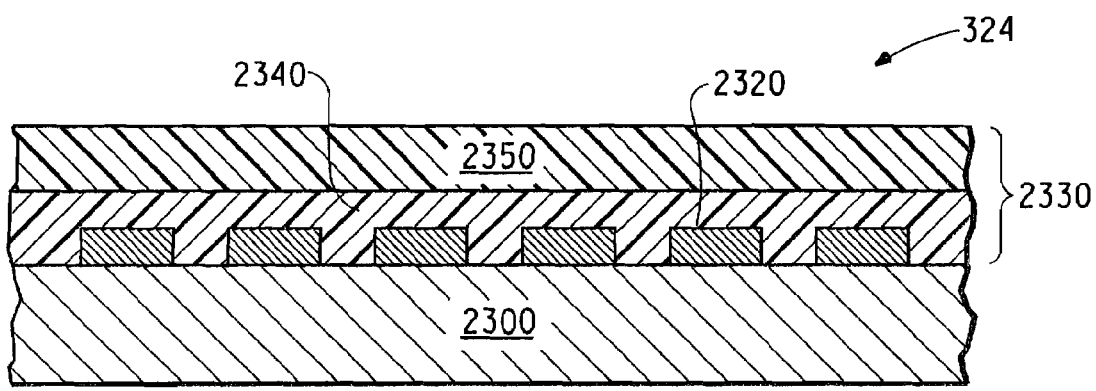
FIGS. 27 to 29 include illustrations of cross-sectional views of a portion of a workpiece during a fabrication sequence for an electronic device, wherein at least one layer within the electronic device is formed using a printing apparatus described herein.
Figure 28:
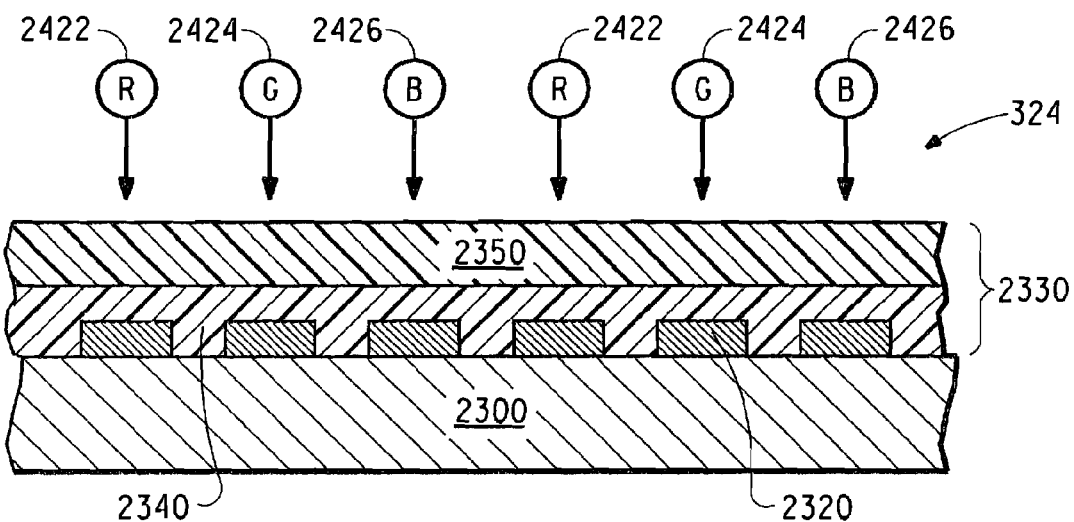
Figure 29:
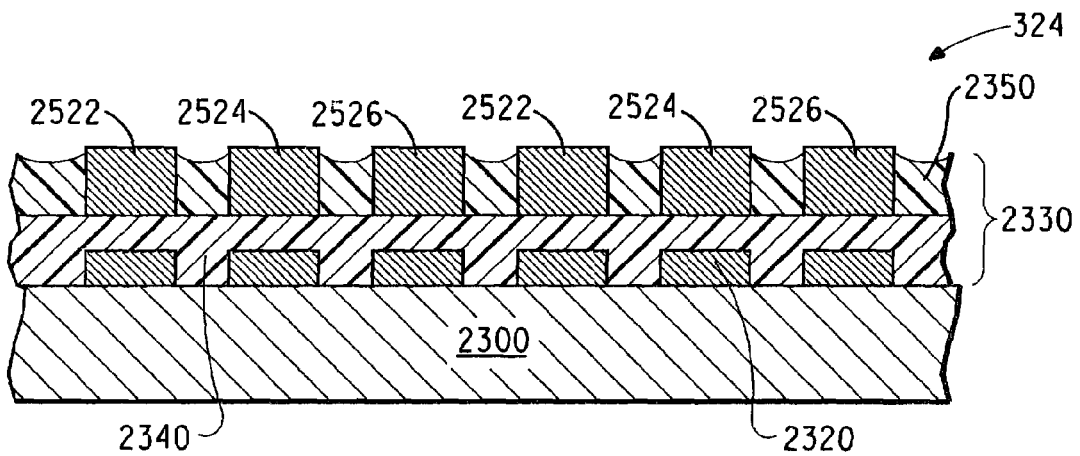

Attention is now directed to details in an exemplary embodiment that is described and illustrated in FIGS. 27 to 29. Referring to FIG. 27, the workpiece 324 includes first electrodes 2320 over portions of a substrate 2300. The workpiece 324 also includes an organic layer 2330 over the first electrodes 2320. The organic layer 2330 may include one or more layers. For example, the organic layer 2330 can include an organic active layer 2350 and any one or more of an electron-injecting layer, an electron transport layer, an electron-blocking layer, a hole-injecting layer, a hole-transport layer, or a hole-blocking layer. In one embodiment, the organic layer 2330 may include a charge-transport layer 2340 and an organic active layer 2350.

The charge-transport layer 2340 and the organic active layer 2350 are formed sequentially over the first electrodes 2320. Each of the charge-transport layer 2340 and the organic active layer 2350 can be formed by one or more of any number of different techniques including spin coating, vapor depositing (chemical or physical), printing (ink-jet printing, screen printing, solution dispensing (dispensing the liquid composition in strips or other predetermined geometric shapes or patterns, as seen from a plan view), or any combination thereof), other depositing technique or any combination thereof for appropriate material(s) as described below. One or both of the charge-transport layer 2340 and the organic active layer 2350 may be cured after deposition.

When the charge-transport layer 2340 acts as a hole-transport layer, one or more materials may be used (and its selection will depend on the device and the organic active layer 2350 material) and in this illustrative example, it may include one or more of PANI, PEDOT, polypyrrole, or material(s) conventionally used as a hole-transport layer as used in an organic electronic device. The hole-transport layer typically has a thickness in a range of approximately 100 to 250 nm as measured over the centers of the first electrodes 2320.

The composition of the organic active layer 2350 typically depends upon the application of the organic electronic device. In the embodiment illustrated in FIG. 27, the organic active layer 2350 is used in radiation-emitting components. The organic active layer 2350 can include material(s) as conventionally used as an organic active layer in an organic electronic device and can include one or more small molecule materials, one or more polymer materials, or any combination thereof. After reading this specification, skilled artisans will be capable of selecting appropriate material(s), layer(s) or both for the organic active layer 2350. In one embodiment, the organic active layer 2350 is no greater than 40 nm. In another embodiment, the organic active layer 2350 has a thickness in a range of approximately 20 to 40 nm as measured over the centers of the first electrodes 2320.

As formed, the organic layer 2330 (including charge-transport layer 2340 and organic active layer 2350) is substantially continuous over an array of organic electronic components being formed. In one embodiment, the organic layer 2330 may be substantially continuous over the entire substrate, including the peripheral circuitry area, remote circuitry area, or both. Note that the organic layer 2330 has regions where it is locally thinner, but it is not discontinuous over the area of the substrate 2300 in which the organic layer 2330 is intended to be formed (e.g., the array). Referring to FIG. 27, the organic layer 2330, including one or both of the charge-transport layer 2340 and the organic active layer 2350, is locally thinner over the first electrodes 2320 and locally thicker away from the first electrodes 2320. In one embodiment, the organic layer 2330 has a thickness in a range of approximately 10 to 290 nm as measured over the centers of the first electrodes 2320.

If the organic electronic device is a radiation-emitting microcavity device, care is taken in choosing the thickness of the organic layer 2330 so that the desired spectrum of emission wavelengths is obtained.

One or more liquid compositions (illustrated as circles 2422, 2424 and 2426) may be placed over portions of the organic layer 2330 in FIG. 28. In one embodiment, the organic active layer 2350 includes a host material that can emit blue light, liquid composition 2422 includes a red guest material, liquid composition 2424 includes a green guest material, and liquid composition 2426 includes a blue guest material that can be the same or different than the blue host material. Before the placement of the one or more liquid compositions 2422, 2424 and 2426, the organic layer 2330 may or may not be substantially solid. The liquid compositions 2422, 2424, and 2426 may be placed over the organic layer 2330 using a precision deposition technique. A stencil mask, frame, well structure, patterned layer or other structure(s) may or may not be present during such deposition. A non-limiting example of the precision deposition technique include screen printing, ink-jet printing, solution dispense, needle aspiration, vapor deposition using one or more stencil (shadow) masks, selective chemical vapor deposition, selective plating, or any combination thereof.

In one embodiment, the liquid compositions 2422, 2424, and 2426 are dispensed using the printing apparatus 200. The liquid compositions 2422, 2424, and 2426 may be placed over the organic layer 2330 sequentially or simultaneously. For simplicity, each of the liquid compositions 2422, 2424, and 2426 in FIG. 28 are referred to as a "stream," whether or not any one or more of the liquid compositions 2422, 2424, and 2426 is introduced as a stream. One or more parameters can be varied that affect the initial area of the organic layer 2330 affected by the liquid compositions 2422, 2424, and 2426. For example, such parameter(s) are selected from a group consisting of volume or width of the stream, spacing between organic electronic components, viscosity, or any combination thereof.

The liquid medium from the liquid compositions 2422, 2424, and 2426 can come in contact with and convert a localized region of the organic layer 2330 from a substantially solid state to a substantially liquid state. As the liquid medium from each stream contacts the localized region of the organic layer 2330, the liquid medium can dissolve part or all of a thickness of the localized region of the organic layer 2330 to form a solution, disperse part or all of a thickness of the localized region of the organic layer 2330 to form a dispersion, form an emulsion, or suspend solids from the liquid composition within part or all of a thickness of the localized region of the organic layer 2330 to form a suspension. Note that as more of the liquid medium interacts with the organic layer 2330, the viscosity of the "mixture" of liquid composition and organic layer 2330 increases. The increased viscosity effectively inhibits lateral movement (movement substantially parallel to the primary surface of the substrate 2300) of the streams. In one embodiment, the intermixing of the guest material(s) with the localized region of the organic layer 2330 may be performed at a temperature no greater than 40° C., and in another embodiment, may be performed at substantially room temperature.

When the liquid composition 322, 324 or 326 or a combination thereof is to be placed onto the organic layer 230 as drops, the volume selected for the drop may be affected by the thickness of the organic layer 2330 or portion thereof, by the host material within the organic layer 2330, or a combination thereof. In one embodiment, the guest material from the drop only needs to intermix with a localized region of the organic active layer 2350. If the drop volume is too small, not all of the thickness of the organic active layer 2350 may be affected. Also, if the guest material concentration within the localized region of the organic active layer 2350 is too low, the targeted luminance efficiency might not be achieved. During operation, the emission or response to radiation at a specific wavelength or spectrum of wavelengths for the localized region of the organic active layer 250 may be significantly affected by the voltage difference between the first and second electrodes.

If the drop width is too large, undesired lateral spreading of the liquid composition may occur, and the guest material may extend beyond the localized region and reach a neighboring region where the guest material within such neighboring region is undesired. For example, if the volume of a red-colored drop is too large, it may enter a region that is to have green or blue emission. If such happens, the neighboring region may emit red or otherwise change the color emission of the subpixel. Therefore, a ratio of volume of liquid composition to thickness of the organic layer 2330 (or more specifically in this embodiment, organic active layer 2350) may be used. Again, similar concepts apply when the liquid composition 322, 324, or 326 or any combination thereof is dispensed as a stream.

The use of well structures may reduce the likelihood of lateral migration, however, the volume of the liquid composition should not be so much as to overflow the "levee" formed by the well structures and migrate into an adjacent well. Note that the liquid composition can lie or flow along a top surface of the well structure between (1) one or more openings in which the liquid composition is intended and (2) other one or more openings in which the liquid composition is not intended. In one embodiment, the walls of the well structure may be perpendicular to the bottoms of the openings, or the walls may have a negative slope (i.e., a portion of the well structure overlies the bottom of the opening). The relatively sharp corner(s) defined by the top surface of the well structure and the walls of the openings, help to "pin" the liquid composition along the top surface of the well structure to reduce the likelihood that the liquid composition flows into any one or more of the adjacent openings where the liquid composition is not intended.

After the liquid compositions 2422, 2424, and 2426 are placed over the organic layer 2330 and a substantial amount of the guest material(s) within the liquid compositions 2422, 2424, and 2426 intermix with the organic active layer 2350, the liquid medium of the liquid compositions 2422, 2424, and 2426 is evaporated to give the organic layer 2330 with intermixed regions 2522, 2524, and 2526 as illustrated in FIG. 29. In this embodiment, the intermixed regions 2522 are designed to emit red light, the intermixed regions 2524 are designed to emit green light, and intermixed regions 2526 are designed to emit blue light. In one embodiment, the evaporation may be performed at ambient temperature. In another embodiment, the evaporation may be performed at a temperature in a range of approximately 20 to 240° C. for a time in a range of approximately 5 seconds to 5 minutes. In one embodiment, the evaporation may be performed at a temperature in a range of approximately 30 to 50° C. for a time in a range of approximately 0.5 to 1.5 minutes. The evaporation may be performed using an oven or a hot plate. The evaporation may be performed at one or more pressures. In one embodiment, the evaporation may be performed at substantially atmospheric pressure. In another embodiment, a vacuum pressure (significantly lower than atmospheric pressure) may be used. If a vacuum is used, care should be taken to avoid generating permanent bubbles within the organic layer 2330 or spewing material to adjacent areas if boiling occurs.

After evaporation, the organic layer 2330, including the intermixed regions 2522, 2524, and 2526, is substantially solid. The guest material(s) that were in the liquid compositions 2422, 2424, and 2426, in combination with the organic active layer 2350, create the intermixed regions 2522, 2524, and 2526. After the intermixed regions 2522, 2524, and 2526 are formed, their thicknesses are relatively close to each other. In one embodiment, all of the intermixed regions 2522, 2524, and 2526 have thicknesses within 10 nm of each other. In one specific embodiment, each of the intermixed regions 2522, 2524, and 2526 has a thickness of at least 60 nm. In another embodiment, each of the intermixed regions 2522, 2524, and 2526 has a thickness in a range of approximately 50 to 100 nm, and in a more specific embodiment, in a range of approximately 70 to 90 nm. In one embodiment, intermixed regions 2522, 2524, and 2626 are at least 20 nm thicker than the organic active layer 2350 as originally formed at the same locations as the intermixed regions 2522, 2524, and 2526. In another embodiment, the thickness may be less than 50 nm or more than 100 nm.

If the guest materials are introduced into the organic active layer 2350 by repeatedly placing one or more of the liquid compositions 2422, 2424, or 2426 over the organic layer 2330, it may not be necessary to fully evaporate the liquid medium between successive depositions of the liquid compositions.

If the organic active layer 2350 comprises host material(s) that are to be cross-linked, the organic active layer 2350 may be formed by one or more of any number of different techniques including spin coating, vapor deposition (chemical or physical), printing ((ink-jet printing, screen printing, solution dispense, or any combination thereof), other deposition technique, or any combination thereof. Before introducing the stream(s) with guest material(s), in one embodiment, the organic active layer 2350 may be partially cross-linked. Although within the scope of the invention, if the organic active layer 2350 is not cross-linked, lateral migration of the guest material(s) within the organic active layer 2350 may be too high, and if the organic active layer 2350 is completely cross-linked, the liquid medium may be less likely to form a solution, emulsion, suspension, or dispersion.

After introducing the stream(s) with the guest material(s), heat may be used to evaporate the liquid medium used during deposition, if needed, to make the organic active layer 2350 substantially solid. However, the temperature or other conditions should not be so aggressive such that further cross-linking occurs. The liquid composition(s) can, when placed in contact with the organic active layer 2350, have guest material(s) that intermix with the organic active layer 2350. The liquid medium for the liquid composition(s) can then be evaporated, and the organic active layer 2350 may be subjected to the conditions sufficient to substantially complete cross-linking of the organic active layer 2350. Actual temperatures and pressure used may depend on the material(s) used for cross-linking. Such cross-linking conditions may be obtained by the vendor of the cross-linking material or may be determined empirically by performing one or more tests.

The liquid medium helps to intermix the guest material with the organic layer 2330 as a solution, dispersion, emulsion, or suspension that is formed by a combination of the liquid medium and organic layer 2330. Therefore, a substantial amount of the guest material(s) within the liquid composition(s) may intermix such that the guest material(s) appear to migrate toward the first electrodes 2320 without substantial lateral migration or diffusion. The concentration of the guest material(s) near the surface of the organic layer 2330 (over which the second electrode(s) is (are) subsequently-formed) can be less than an order of magnitude different from the concentration of the guest material(s) near the opposite surface (near the first electrodes 2320). The concentrations of the guest material(s) near the opposite sides of the organic active layer 2530 are closer to each other. A thermal drive step is not required. The concentration gradient of the guest materials within each of the intermixed regions 2522, 2524, and 2526 between the first electrodes 2320 and a subsequently-formed second electrode (concentration gradient measured in a direction perpendicular to the primary surface of the substrate) is lower than a concentration gradient formed by a conventional thermal diffusion process. The emission spectra from an organic electronic device formed by such a technique may not be significantly affected by changing the potential difference between the first and second electrodes.

Figure 30:
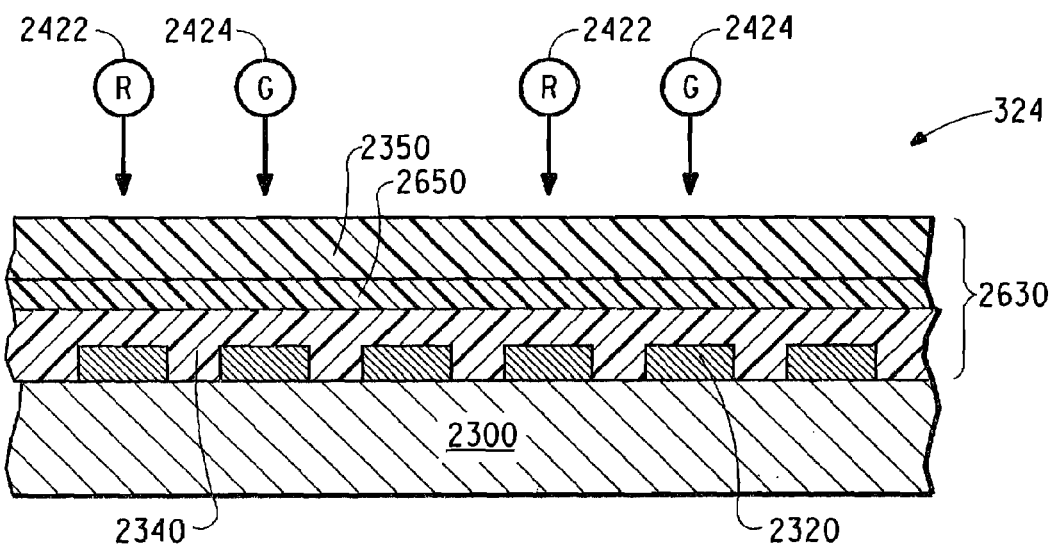
FIGS. 30 to 33 include illustrations of cross-sectional views of a portion of the workpiece during alternative fabrication sequences for an electronic device, wherein at least one layer within the electronic device is formed using a printing apparatus described herein.

FIG. 30 includes an illustration of an alternate embodiment that is formed in a manner similar to the process described except that the organic layer 2330 is replaced by an organic layer 2630. The organic layer 2630 includes an electron-blocking layer 2650 between the layers 2340 and 2350. The materials and formation of the layers 2340 and 2350 are described above. After forming the charge-transport layer 2340, the electron-blocking layer 2650 is formed. The electron-blocking layer 2650 includes any one or more of the electron-blocking materials previously described.

The electron-blocking layer 2650 may be formed using one or more of any number of different techniques including a conventional coating, vapor deposition (chemical or physical), printing (ink-jet printing, screen printing, solution dispense, or any combination thereof), other deposition technique, or any combination thereof. The electron-blocking layer 2650 has a thickness in a range of approximately 5 to 200 nm as measured over the substrate 2300 over the centers of the first electrodes 2320.

In one embodiment, the electron-blocking layer 2650 includes one or more materials that can be cross-linked. After the material(s) for the electron-blocking layer 2650 is deposited, the material(s) can be substantially completely cross-linked. The cross-linking is performed using a conventional technique.

After formation of the organic layer 2630, one or more liquid compositions (illustrated as circles 2422 and 2424) are placed over organic layer 2630 using any one or more of the techniques previously described. In one embodiment, the organic active layer 2350 includes a host material that can emit blue light, the liquid composition 2422 may include a red guest material, and the liquid composition 2424 may include a green guest material. Before the placement of any one or more of the liquid compositions, the organic active layer 2350 may or may not be substantially solid. The liquid compositions 2422 and 2424 may be placed over the organic layer 2630 sequentially or simultaneously.

The liquid medium from the liquid compositions 2422 and 2424 can come in contact with and only convert localized regions of the organic layer 2350, and not the electron-blocking layer 2650, from a substantially solid state to a substantially liquid state.

After the liquid compositions 2422 and 2424 are placed over the organic layer 2630 and a substantial amount of the guest material(s) within the liquid compositions 2422 and 2424 intermix with the localized regions of the organic active layer 2350. In one embodiment, the electron-blocking layer 2650, which is substantially completely cross linked, can help reduce the likelihood that the liquid medium from the liquid compositions 2422 and 2424 will reach the charge-transport layer 2340 or the first electrodes 2320. The liquid medium of the liquid compositions 2422 and 2424 is evaporated as previously described to give the organic active layer 2350 with the intermixed regions 2722 and 2724. In this embodiment, the regions 2722 are designed to emit red light, and region 2724 is designed to emit green light, as illustrated in FIG. 31.

Figure 31:
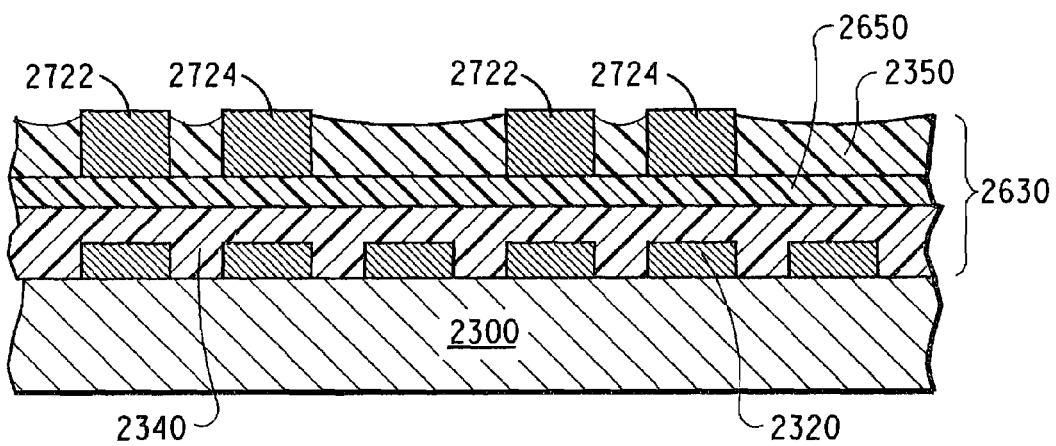

FIG. 31 includes what will be two pixels that each have red, green, and blue radiation-emitting components after forming one or more second electrodes (not illustrated in FIG. 31). The red light-emitting components include the red-intermixed regions 2722, and the green light-emitting components include the green-intermixed regions 2724, and the blue light-emitting components do not include intermixed portions (substantially free of the red and green guest materials) of the organic active layer 2350 lying over the first electrodes 2320. In one embodiment, the blue light-emitting components have an organic active layer 2350 thickness no greater than 40 nm and can still achieve one or more opto-electronic properties if the organic active layer 2350 were 70-80 nm thick. For example, the organic active layer 2350 emit blue light at an efficiency in a range of approximately 8 to 10 cd/A. In another embodiment, the red-intermixed regions 2722 and green-intermixed regions 2724 have a thickness in a range of approximately 90 to 100 nm, and the other regions (for the blue light emitting components) have a thickness in a range of approximately 70 to 80 nm. In still another embodiment, the thicknesses described can be thinner or thicker than those described.

Figure 32:
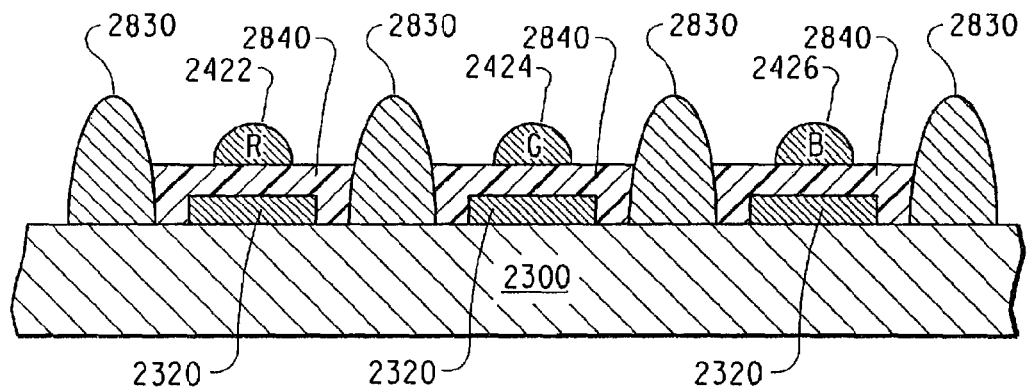

In still a further embodiment, the liquid compositions may be placed over a substrate before forming an organic layer. Referring to FIG. 32, first electrodes 2320 are formed over the substrate 2300. A well structure 2830, which is a type of liquid containment structure, is formed using a conventional process, such as coating a photoresist layer and patterning it. The well structure 2320 may have a thickness in a range of approximately 1 to 5 microns. The charge-transport layer 2840 may be formed over the first electrodes 2320 and within openings in the well structure 2830 using a technique previously described. Liquid compositions 2422, 2424, and 2426 are placed over the charge-transport layer 2840 using any one or more of the techniques previously described. The liquid medium within the liquid compositions 2422, 2424, and 2426 may or may not be evaporated at this time.

Figure 33:
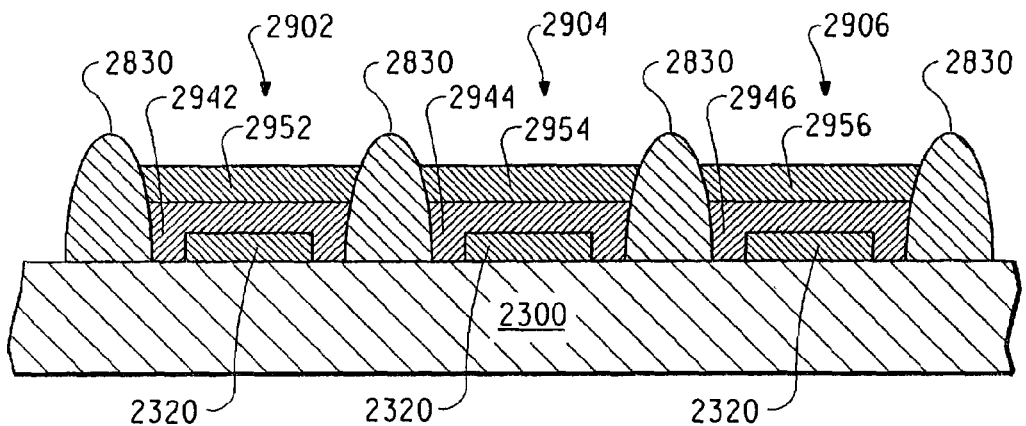

An organic active layer, which in one embodiment has a composition and thickness of the organic active layer 2350, is formed over the charge-transport layer 2840 and within openings in the well structure 2830 as illustrated in FIG. 33. The guest material(s) within the liquid compositions 2422, 2424, and 2426 may intermix with one or both of the charge-transport layer 2840 and the organic active layer to: (1) form a red-intermixed charge-transport layer 2942 and red-intermixed organic active layer 2952, which together comprise red-intermixed organic layer, for the red light-emitting component 2902 (2) form a green-intermixed charge-transport layer 2944 and green-intermixed organic active layer 2954, which together comprise green-intermixed organic layer, for the green light-emitting component 2904, and (3) form a blue-intermixed charge-transport layer 2946 and blue-intermixed organic active layer 2956, which together comprise blue-intermixed organic layer, for the blue light-emitting component 2906. The organic active layers 2952, 2954, and 2956 can be cured to render the organic active layers 2952, 2954, and 2956 substantially solid. One or more second electrodes (not illustrated in FIG. 33) and subsequent processing may be performed.

In this embodiment, processing latitude exists to allow the formation of the organic active layer after placing the liquid compositions 2422, 2424, and 2426 over the first electrodes 2320. The well structure 2830 help to keep the guest materials within compositions 2422, 2424, and 2426 from migrating to undesired regions.

In another embodiment, the guest material(s) do not significantly intermix with the charge-transport layer 2840. However, significant amount(s) of the guest material(s) still intermix with the organic active layer.

In a further embodiment (not illustrated), liquid compositions, including guest materials, may be placed on the first electrodes 2320 before the organic layer 2330 is formed. The liquid medium within the liquid compositions may be evaporated to become substantially solid before the organic layer 2330 is formed over the first electrodes 2320. The organic layer 2330 can include a liquid medium that can form a solution, dispersion, emulsion, or suspension with the guest materials.

In yet a further embodiment (not illustrated), the guest materials may be introduced into a layer other than an organic active layer. Referring to FIG. 30, the organic active layer 2350 may be replaced by the same material used to form the electron-blocking layer 2650. More specifically, after forming the substantially fully cross-linked electron-blocking layer 2650, the same material(s) as the fully cross-linked electron-blocking layer 2650 can be deposited to a thickness no greater than approximately 100 nm over the electron-blocking layer 2650.

The layer of same material(s) can be partially cross linked. Skilled artisans that the degree of cross linking can be determined in any one or more different empirical methods. The layer may be deposited onto different test substrates. After depositing, the thickness, volume, or mass may be measured. The substrates with the layer can be exposed to different amounts of energy (temperatures, times, radiation or any combination thereof. A solvent can be used to wash away the portion of the layer that is not significantly cross-linked without washing away a significant portion of the cross-linked layer. Selection of the solvent is conventional to skilled artisans. Measurements are then performed. In one embodiment, the amount of the layer remaining is in a range of approximately 50-90% of the initial measurement (before partial cross linking), regardless whether the both sets of measurements were based on thickness, volume, or mass. The amounts of radiation corresponding to that level of cross linking may be used to achieve a partially cross-linked layer for the workpieces within which electronic components are being formed.

The liquid compositions 2422, 2424, and 2426 can be placed over the partial cross-linked layer. The partial cross linking allows the liquid medium to form a solution, dispersion, suspension or emulsion to form; however the substantially completed cross linking within the electron-blocking layer 2650 substantially prevents any one or more of the liquid compositions 2422, 2424, and 2426 from intermixing with the electron-blocking layer 2650, into the charge-transport layer 2340, reaching the first electrodes 2320, or any combination thereof. The fabrication process continues as previously described to form the intermixed regions and substantially completed electronic devices.

In still a further embodiment, other materials and other types of densifications can be performed in forming a layer similar to the electron-blocking layer 2650 to substantially stop or otherwise define a lower boundary of the intermixed regions. The densification helps to render the material(s) into a state in which a layer, member, or structure formed from the material(s) are less susceptible to interactions with the liquid compositions that include the guest materials. Densification can include annealing, cross linking or other polymerization, curing, passivating (reducing the number of dangling bonds), or any combination thereof.

In still another embodiment, a filter layer can lie between an organic active layer and a user side of the organic electronic device. The filter allows radiation at a wavelength or spectrum of wavelengths to be transmitted through the filter layer. The filter layer does not allow a significant amount of radiation outside such wavelength or spectrum of wavelengths to be transmitted. Therefore, the filter layer can "block" radiation at undesired wavelengths.

Figure 34:
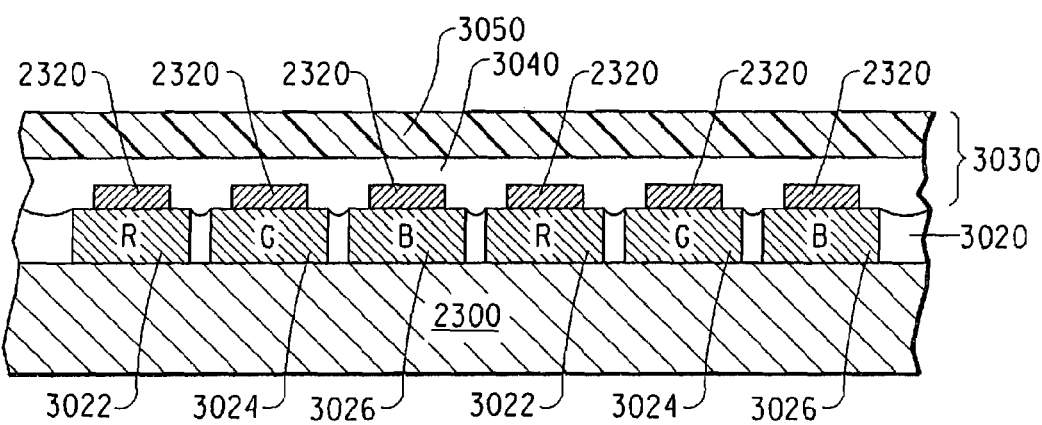
FIG. 34 includes an illustration of a cross-section view of a portion of a workpiece including a filter layer within an electronic device, when the filter layer is formed at least in part using a printing apparatus described herein.

An organic layer 3020 can be formed over the substrate 2300 as illustrated in FIG. 34. The organic layer 3020 may include one or more layers of nearly any organic material (e.g., a polymeric film). The organic layer 3020 may theoretically have nearly any thickness (1 nm to several hundreds of microns or more). However, when the thickness is too thin, the filter layer may not be sufficient to provide a good quality filter layer. At the other end of the range, as the filter layer becomes thicker, the intensity of radiation to be transmitted through the filter layer is reduced. In one embodiment, the organic layer 3020 has a thickness in a range of approximately 1 to 10 microns.

The organic layer 3020 can be formed by one or more of any number of different techniques including spin coating, vapor deposition (chemical or physical), printing (ink-jet printing, screen printing, solution dispense, or any combination thereof), other depositing technique, or any combination thereof for an organic material. Alternatively, the organic layer 3020 can be formed over the substrate 2300 using a mechanical process. One mechanical process may include using an adhesive layer (not illustrated) on the substrate 2300 or organic layer 3020 and placing the organic layer 3020 near the substrate 2300 so that the adhesive layer lies between the organic layer 3020 and substrate 2300. Alternatively, the organic layer 3020 can be placed over the substrate 2300 and heated to allow the organic layer 3020 and substrate 2300 to fuse together. The processes described are only two of potentially may other mechanic processes that may be used.

Any one or more of the processes as previously described regarding the liquid compositions can be used to introduce guest materials into the organic layer 3020. Red-intermixed regions 3022 include a red guest material, green-intermixed regions 3024 include a green guest material, and the blue-intermixed regions 3026 include a blue guest material.

Formation of the rest of the organic electronic device is similar to any of the processes previously described above except that guest materials may or may not be added to organic layer 3030. In one embodiment, the organic layer 3030 includes a charge-transport layer 3040 and an organic active layer 3050 that may emit substantially white light. The red-intermixed regions 3022 may allow red light, and not green light or blue light, to be transmitted through the organic layer 3020 to the user side of the organic electronic device.

The green-intermixed regions 3024 and blue-intermixed regions 3026 perform similar functions for green light and blue light, respectively.

If the organic electronic device includes radiation-responsive components, the red-intermixed regions 3022 may allow red light, and not green light and blue light, to be transmitted through the organic layer 3020 to the organic active layer 3050. The green-intermixed regions 3024 and blue-intermixed regions 3026 perform similar functions for green light and blue light, respectively.

In a further embodiment (not illustrated), fabrication of the filter layer may be performed separate from substrate 2300. The fabrication process for the organic layer 3020 may be performed and the organic layer 3020 with filter regions 3022, 3024, and 3026 are attached to the substrate 2300 before, during or after the formation of electronic components. In one embodiment, driver or other circuits may be formed over substrate 2300 before the filter layer is attached. After the filter layer is attached, the other organic layers (e.g., organic active layer) for organic electronic components may be formed. In this manner, the organic active layer may not be exposed to relatively higher temperatures that may be used to attach the organic layer 3020 to the substrate 2300.

In another embodiment not illustrated, the charge-transport layer 2340 and not the organic active layer 2350 may include the guest materials. Although the charge-transport layer 2340 is a filter layer in theory, the guest material in the charge-transport layer 2340 can help to get color emission or reception by the organic active layer 2350 closer to the wavelengths as specified in the Commission Internationale de l'Éclairage ("CIE") standards. In still other embodiments, a charge-injection layer, a charge-blocking layer, or a combination thereof may be used in place of or in conjunction with the charge-transport layer 2340.

d. Segment-On-Segment Printing

Figure 35:
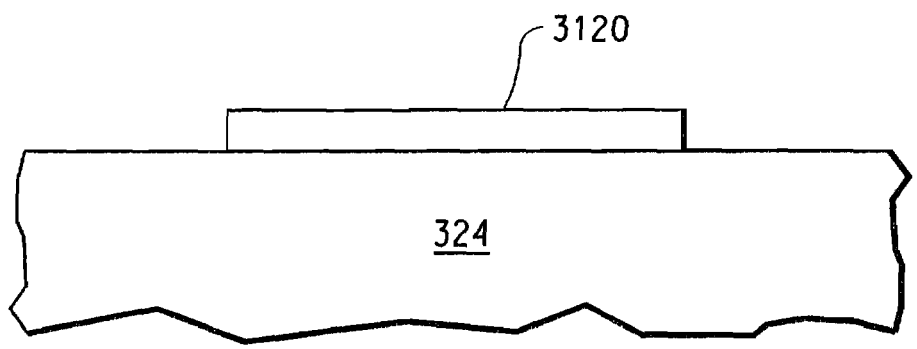
FIGS. 35 to 37 include illustrations of cross-sectional views of a portion of a workpiece during segment-on-segment printing using a printing apparatus described herein.
Figure 36:
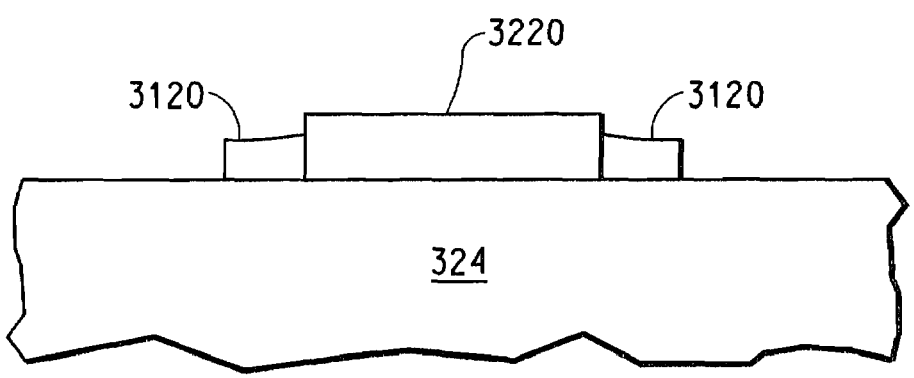
Figure 37:
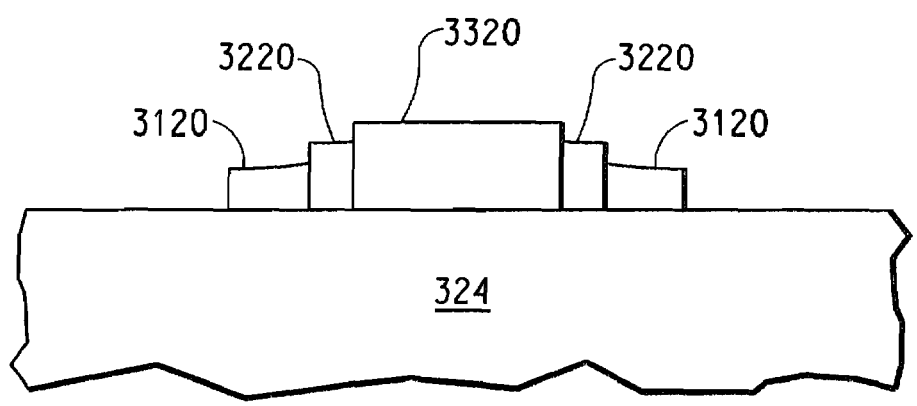

A specific application of hybrid printing is the use of segment-on-segment (also called line-on-line) printing to form segments of progressively narrower widths as illustrated in FIGS. 35 to 37. In FIGS. 35 to 37, the same liquid composition is printed over the workpiece three times using substantially the same printing conditions. On the first pass, the liquid composition is printed as a first segment and allowed to dry to form layer 3120 as illustrated in FIG. 35. The layer 3120 has a width in a range of approximately 70 to 150 microns and a thickness in a range of approximately 5 to 100 nm.

On the second pass, the liquid composition is printed as a second segment and allowed to dry to form layer 3220 as illustrated in FIG. 36. The liquid medium within the liquid composition helps to form a solution, dispersion, suspension, or emulsion with the layer 3120. Because the amount of solids/volume is significantly higher than when forming the layer 3120, the viscosity for layer 3220 rises significantly faster than the viscosity rose during the formation of the layer 3120. The faster increase in viscosity constrains the liquid composition on the second pass so that the segment is narrower than layer 3120 when formed. The layer 3220 has a width in a range of approximately 25 to 100 microns and a cumulative thickness in a range of approximately 10 to 200 nm. The width of the layer 3220 is in a range of 40% to 70% of the width of the layer 3120.

On the third pass, the liquid composition is printed as a third segment and allowed to dry to form layer 3320 as illustrated in FIG. 37. The liquid medium within the liquid composition helps to form a solution, dispersion, suspension, or emulsion with the layer 3220. Because the amount of solids/volume is significantly higher than when forming the layers 3220 and 3120, the viscosity for layer 3320 rises significantly faster than the viscosities rose during the formation of the layers 3220 and 3120. The faster increase in viscosity constrains the liquid composition on the second pass so that the segment is narrower than each of the layers 3220 and 3120 when formed. The layer 3320 has a width in a range of approximately 10 to 60 microns and a cumulative thickness in a range of approximately 15 to 300 nm. The width of the layer 3320 is in a range of 40% to 70% of the width of the layer 3220. In another embodiment, an individual thickness, the cumulative thickness, or any combination thereof can be thinner or thicker than those described.

In one embodiment, any combination or all of the first, second, and third layers 3120, 3220, and 3320 extend in substantially the same direction. The lengths of the first, second, and third layers 3120, 3220, and 3320 may or may not have substantially the same length. Any combination or all of the first, second, and third layers 3120, 3220, and 3320 may or may not have a common starting point and ending point.

In another embodiment, different liquid compositions, different printing parameters, or a combination thereof may be used for printing segments over one or more underlying segments. For example, when forming a blue light-emitting layer, a first layer and a second layer of substantially the same composition may be used. The first layer may be formed to a thickness of approximately 10 to 30 nm, and the second layer may be formed to a cumulative thickness of approximately 40 to 70 nm.

7. EXAMPLE

The invention will be further described in the following example, which does not limit the scope of the invention described in the claims. The example below highlights one or more of the features of the printing apparatus 200, one or more alternatives available for liquid composition(s) or operating the printing apparatus 200, or any combination thereof. Note that one or more aspects of the example are not solely limited to the printing apparatus 200 and may be used on another printer, such as an ink-jet printer.

This example demonstrates that the printing apparatus 200 can be used in forming electronic devices, such as an active matrix OLED display.

Figure 38:
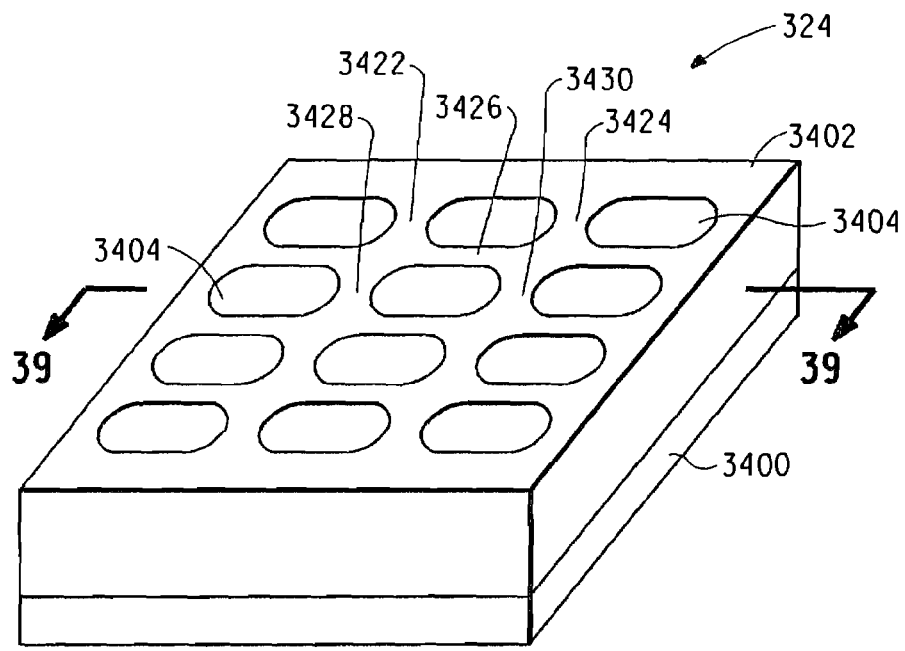
FIGS. 38 to 44 include illustrations of a perspective view, cross-sectional views, and a plan view of portions of a workpiece during a further alternative fabrication sequence for an electronic device, wherein at least one layer within the electronic device is formed using a printing apparatus described herein.
Figure 39:
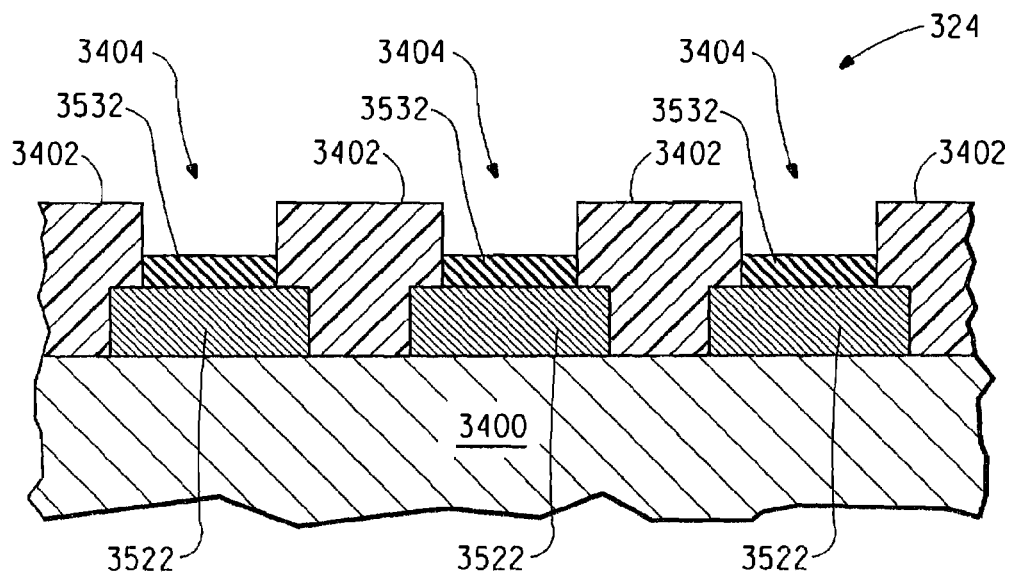

FIGS. 38 to 44 include illustrations during the formation of an exemplary electronic device including the workpiece 342. FIGS. 38 and 39 include illustrations of perspective and cross-sectional views, respectively, during an early portion of a fabrication sequence. First electrodes 3522 are formed over a substrate 3400. The substrate 3400 is conventional, can include an organic or inorganic material, and may be rigid or flexible. The substrate 3400 may or may not include one or more electronic components. In one embodiment, the first electrodes 3522 are anodes for the electronic components illustrated. In one embodiment, the substrate 3400 and first electrodes 3522 are formed using one or more conventional techniques. Each of the layer(s) within the first electrodes 3522 is deposited and may or may not need to be patterned. In one embodiment, the first electrodes 3522 are substantially transparent to the targeted radiation wavelength or spectrum (spectra) of wavelengths to which the electronic component emits or responds.

A substrate structure 3402 is formed and overlies the substrate 3400 and portions of the first electrodes 3522. The substrate structure 3402 is configured to define an array of openings 3404. In one embodiment, the substrate structure 3402 is a well structure. The array of openings 3404 includes vectors of openings 3404 that expose portions of the first electrodes 3522. Each vector can be a row or a column of openings 3404. Locations of the substrate structure 3402, between openings 3404 along a particular vector, have heights that are substantially equal to one another. For example, the substrate structure 3402 can be formed such that along a row, heights at locations between openings 3404, such as locations 3422 and 3424, are substantially equal to one another.

In one exemplary embodiment, the heights at locations between openings along a first vector, such as a row (e.g., locations 3422 and 3424), are substantially equal to heights at locations along a second vector, such as a column (e.g., location 3426). In alternative embodiments, the heights at locations along the second vector may be different from those at locations along the first vector. For example, heights at locations (e.g., locations 3422 and 3424) along a first vector, such as a first row, are substantially equal to one another. Heights at locations along a second vector (e.g., locations 3428 and 3430), such as a second row, are also substantially equal to one another. However, the heights at the locations along the first vector (e.g., locations 3422 and 3424) can be different from the heights at the locations along the second vector (e.g., locations 3428 and 3430).

In a specific embodiment, the substrate structure 3402 includes an inorganic (e.g., silicon dioxide, silicon nitride, aluminum oxide, aluminum nitride, etc.), an organic material (e.g., photoresist, polyimide, etc.), or any combination thereof. In another embodiment, the structures 3402 can include a black material (e.g., carbon) in order to increase contrast to ambient light while the electronic device is being operated. In one exemplary embodiment, the substrate structure 3402 may be formed from one or more resist or polymeric layers. The resist may, for example, be a negative resist material or positive resist material. The resist may be deposited over the substrate 3400 and first electrodes 3522 using a conventional technique. The substrate structure 3402 may be patterned as deposited or may be deposited as a blanket layer and patterned using a conventional lithographic technique. In one particular embodiment, the substrate structure 3402 has a thickness between approximately 2 to 10 microns as viewed from a cross-sectional view. In one exemplary embodiment, openings 3404 are in a range of approximately 50 to 100 microns wide and in a range of approximately 100 to 500 microns long when viewed from a plan view. The slope of the substrate structure 3402 at the openings 3404 may be less than 90°, approximately 90°, or more than 90° with respect to the surface of the first electrodes 3522.

In one embodiment, the substrate structure 3402 may or may not receive a surface treatment before forming an organic layer. A conventional fluorination surface treatment may be performed to reduce the surface energy of the substrate structure 3402.

An optional layer 3532, such as a charge-injecting layer, a charge-blocking layer, a charge-transport layer, or a combination thereof is deposited to overlie the first electrodes 3522. In one embodiment, the optional layer 3532 includes a hole-injecting layer, a hole-transport layer, an electron-blocking layer, or any combination thereof. The optional layer 3532 is formed by one or more conventional techniques. For example, the optional layer 3532 is deposited and may or may not need to be patterned. In one embodiment, the optional layer 3532 may be formed from a liquid composition using the printing apparatus 200 as previously described.

At this point in the process, one or more layers can be formed using the printing apparatus 200. The printing apparatus 200 can print one or more lines having the same or different compositions. In one embodiment, the printing apparatus 200 prints a liquid composition in the form of a line that comprises an organic layer. Exemplary organic layers include organic active layers, charge-injecting layers, charge-transport layers, charge-blocking layers, or a combination thereof. Liquid compositions used for forming such layers have been previously described.

Figure 40:
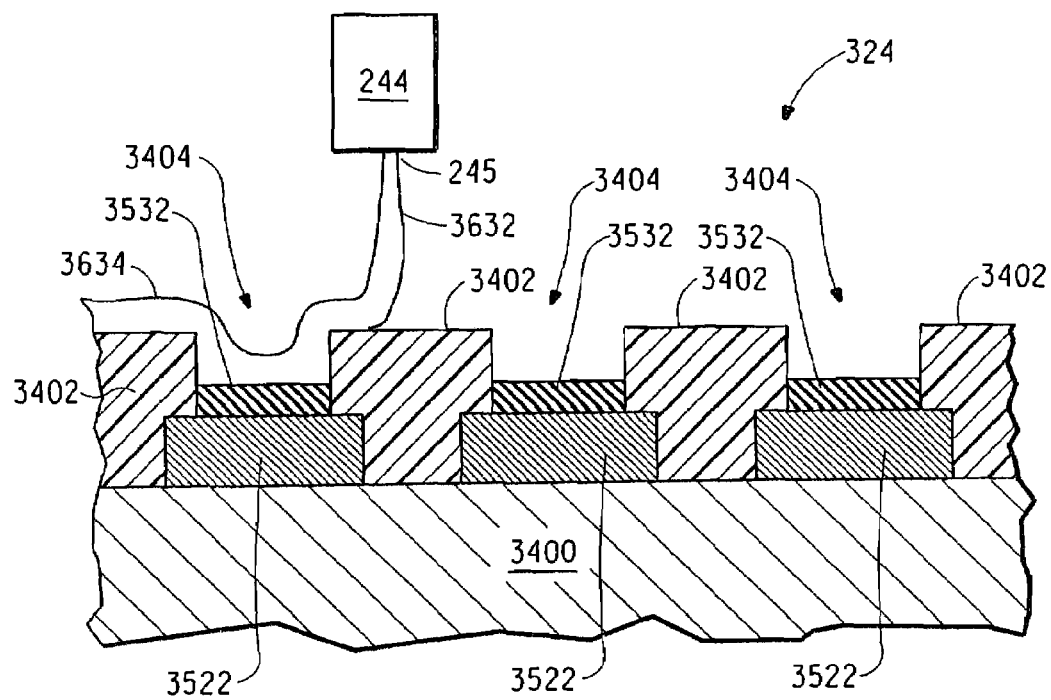

The printing apparatus 200 continuously prints a segment 3634 over the substrate structure 3402 and within the openings 3404 in the form of a line as illustrated in FIG. 40. In one exemplary embodiment, a printing apparatus 200 continuously prints the liquid composition within the openings 3404 along a vector and at least in part over the substrate structure 3402 at locations between the openings 3404 and along the vector.

The printing head 244 includes the nozzle 245 through which a continuous stream 3632 of the liquid composition is dispensed. In one embodiment, the printing head 244 is configured to continuously print the liquid composition onto the workpiece 342 including the substrate 3400 and the substrate structure 3402. The nozzle 245 has an opening that can be at least 10 microns wide. In one embodiment, the opening is in a range of approximately 10 to 30 microns wide. In one specific embodiment, the opening is approximately 18 microns wide. In another specific embodiment, the opening is approximately 12 microns wide or approximately 14 microns wide.

In one exemplary embodiment, the continuous stream 3632 of liquid composition is printed along a vector (e.g., a row or a column) of openings 3404. The printing head 244 is directed along the vector of openings 3404, depositing the continuous stream 3632 of liquid composition over the optional layer 3532 within the openings 3404 and, at least partially over the substrate structure 3402 at locations between the openings 3404 and along the vector. The viscosity of the liquid composition increases as its liquid medium evaporates from a segment 3634.

The printing apparatus 200 can be configured to print the continuous stream 3632 of the liquid composition over the substrate 3400 at a rate of at least 0.1 m/s. In another embodiment, the printing apparatus 200 may be configured to print the segment 3634 at a rate of at least 1 m/s, at least 3 m/s, or at least 6 m/s along the segment 3634. In a particular embodiment, the liquid composition is deposited at a rate in a range of approximately 1 m/s to 3 m/s.

The printing head 244 may be configured to dispense the liquid composition at a rate of at least 10 microliters per minute, such as approximately 50 microliters/min., approximately 100 microliters/min. or higher. For example, the printing head 244 may dispense the liquid composition at a rate between approximately 50 to 400 microliters/min. The size of the opening for the nozzle 245 may be selected based on one or more conditions, one or more parameters of the continuous printing or any combination thereof. In one particular embodiment, the liquid composition is dispensed from printing head 244 at a rate of approximately 100 microliters/min. through an opening of approximately 18 microns wide (e.g., diameter).

Figure 41:
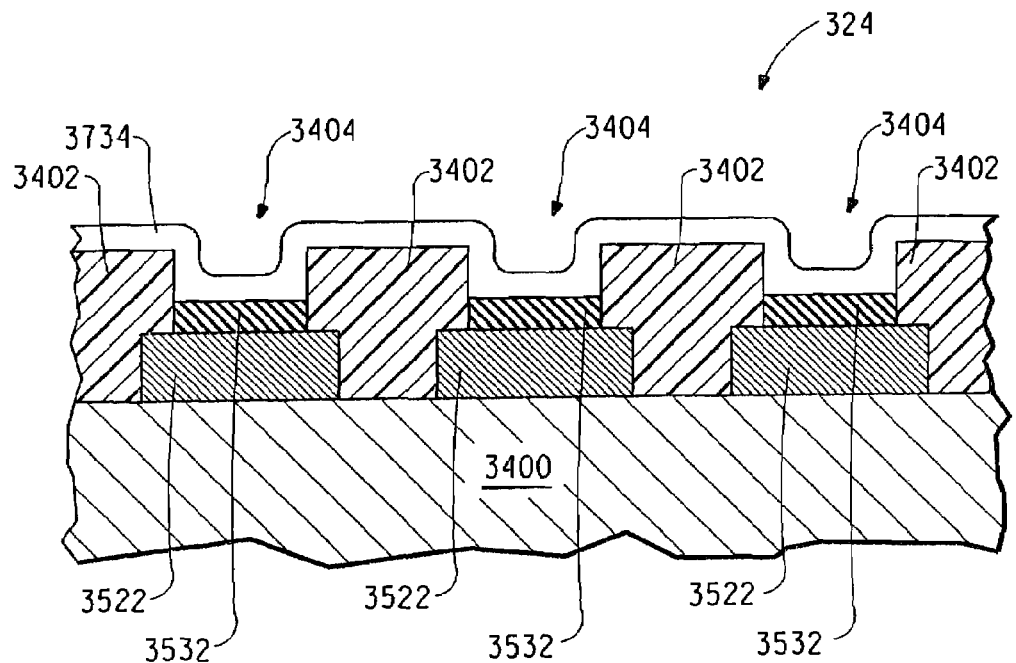
Figure 42:
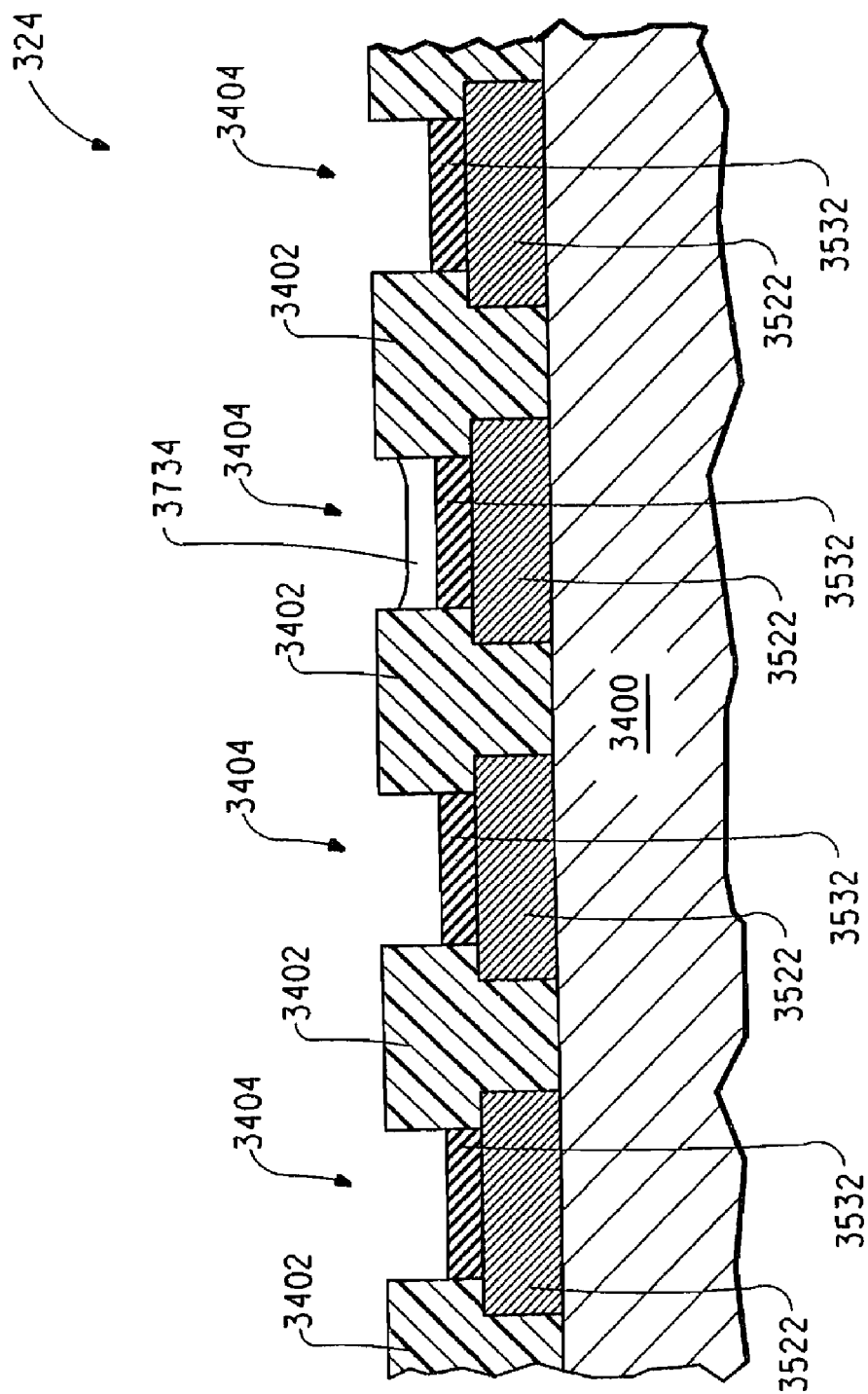

The liquid medium within the liquid composition (of segment 3634) evaporates to leave a first organic active layer 3734 in a shape of a line as seen from a plan view. As illustrated in FIG. 41, the first organic active layer 3734 lies over the optional layer 3532 and first electrodes 3522, within the openings 3404 and, in part, over the substrate structure 3402. FIG. 42 illustrates a cross-sectional view of the substrate structure 3402 and substrate 3400 in a direction substantially perpendicular to the cross-sectional view in FIG. 41. For example, the cross-sectional view in FIG. 41 may be along a vector, such as a row, and the cross-sectional view in FIG. 42 may be along a different vector, such as a column.

As can be seen from FIGS. 41 and 42, the first organic active layer 3734 is formed within the openings 3404 located along a row. However, the first organic active layer 3734 does not spill into openings located along adjacent rows. Along other rows, one or more other layers (not illustrated) including one or more organic layers may be subsequently formed from other liquid compositions. Those other layer(s) can be formed as segments within the openings 3404 located along their respective rows and over the substrate structure 3402 between the openings 3404 located along that respective row without spilling into openings located along adjacent rows.

Figure 43:
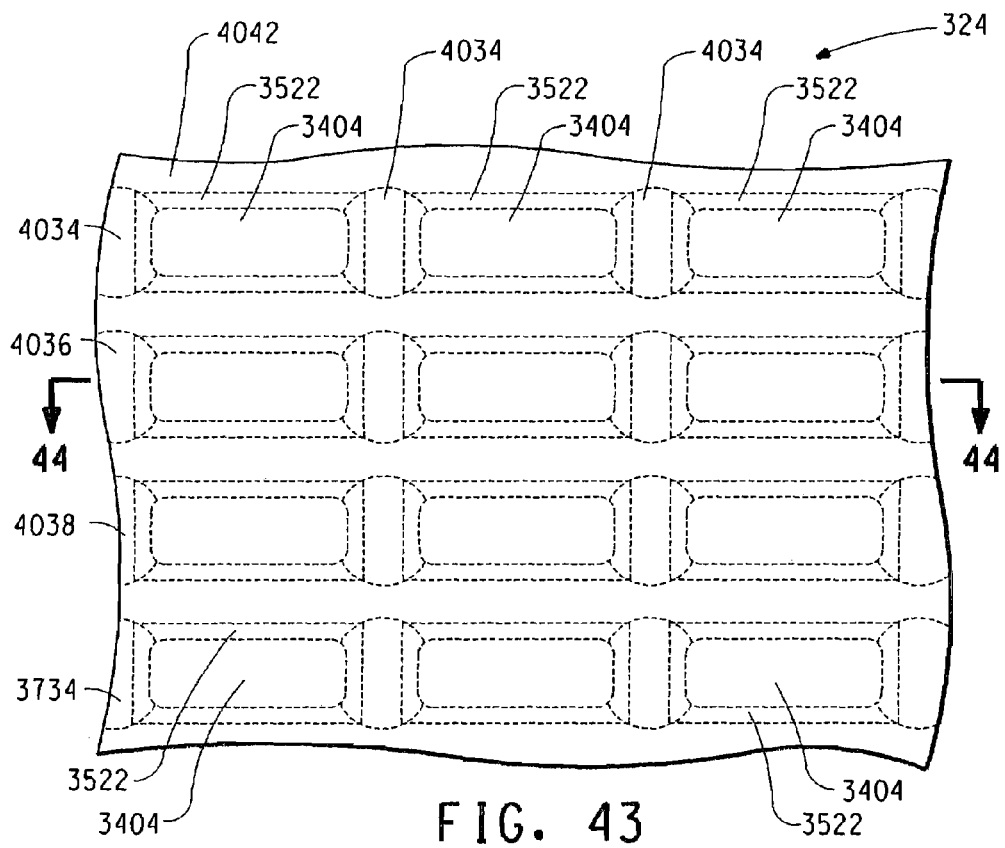
Figure 44:
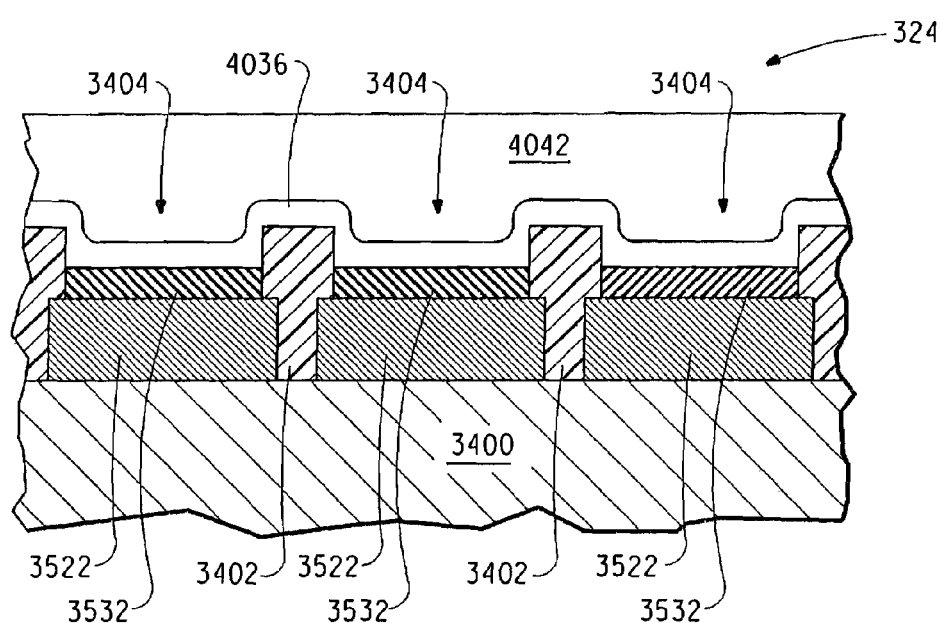

A second electrode 4042 is formed over the substrate structure 3402 and first electrodes 3522 as illustrated in FIGS. 43 and 44. In one embodiment, additional organic active layers 4034, 4036, and 4038 have been printed. Each of the organic active layers 4034, 4036, and 4038 can be formed using the printing apparatus 200 and procedure previously described with respect to the first organic active layer 3734. In one specific embodiment, organic active layers 3734 and 4034 have substantially the same composition, and each of organic active layers 4036 and 4038 have different compositions compared to the other layers illustrated in FIG. 43. For example, organic active layers 3734 and 4034 may include a blue light-emitting layer, a second organic active layer 4036 can include a green light-emitting layer, and a third organic active layer 4038 can include a red light-emitting layer. Over the substrate structure 3402, any one or more of the organic active layers 3734, 4034, 4036, or 4038 may contact, underlie or overlie a different organic active layer. As long as any specific organic active layer does not lie along the bottom of an opening of an adjacent row, the electronic device can operate properly.

In one embodiment, the organic active layers 3734, 4034, 4036, 4038, or any combination thereof have a thickness in a range of approximately 10 to 100 nm as measured within a center of an opening within the well structure. The organic active layer 3734, 4034, 4036, 4038, or any combination thereof may be formed by printing a segment during a single pass or by using more than one pass. For example, if the solids concentration within the liquid composition is at least 2 weight %, the organic active layer can be formed by printing a segment on a single pass. If the solids concentration within the liquid composition is approximately 1 weight %, the organic active layer can be formed by printing more than one line on top of another segment using more than one pass. In one specific embodiment, the first organic active layer 3734 can be formed by printing a first segment to a thickness of approximately 20 nm, and printing a second segment to a cumulative thickness of approximately 50 nm over the first segment. After reading this specification, skilled artisans will appreciate that other combinations of thicknesses can be used.

The organic active layer 3734, 4034, 4036, 4038, or any combination thereof can be cured after printing one or more of the layers. In one embodiment, the organic active layers 3734, 4034, 4036, 4038 can lie within an array of electronic components. The array comprises a first set of first electronic components lying closest to a first side of the array, and a second set of second electronic components lying closest to a second side of the array, wherein the second side is opposite the first side. The organic active layer 3734, 4034, 4036, 4038, or any combination thereof includes segment(s) that extend continuously from one of the first electronic components to one of the second electronic components.

Although not illustrated, a hole-blocking layer, an electron transport layer, an electron-injecting layer, or a combination thereof can be formed over the organic active layers 3734, 4034, 4036, 4038, or any combination thereof before forming the second electrode 4042. The hole-blocking, electron transport, or electron-injecting layer can include one or more conventional materials, and may be formed using a conventional deposition technique. In one embodiment, the hole-blocking, electron transport layer, or electron injecting layer can be formed by printing the layer using the printing apparatus 200.

A second electrode 4042 overlies a set of organic active layers 3734, 4034, 4036, and 4038. In one embodiment, the second electrode 4042 is a common cathode for the electronic components being formed. The second electrode 4042 includes materials conventionally used for cathodes within OLEDs. The second electrode 4042 is formed using a conventional deposition technique.

Application of an electrical potential(s) across any one or more of the first electrodes 3522 and the second electrode 4042 can result in radiation emission from one or more organic active layers (e.g., layer 3734, 4034, 4036, 4038, or any combination thereof) located between the first electrode(s) 3522 and the second electrode 4042. In one embodiment, the array is substantially free of a stitching defect.

Other circuitry not illustrated in FIGS. 43 and 44 may be formed using one or more of the previously described or additional layers. Although not illustrated, additional insulating layer(s) and interconnect level(s) may be formed to allow for circuitry in peripheral areas (not illustrated) that may lie outside the array. Such circuitry may include row or column decoders, strobes (e.g., row array strobe, column array strobe), or sense amplifiers. Alternatively, such circuitry may be formed before, during, or after the formation of any one or more of the layers as illustrated in FIGS. 39 and 40.

A lid (not illustrated) with a desiccant (not illustrated) is attached to the substrate 3400 at locations (not illustrated) outside the array to form a substantially completed device. A gap (not illustrated) may or may not lie between the second electrode 4042 and the desiccant. The materials used for the lid and desiccant and the attaching process are conventional.

In another embodiment, the optional layer 3532 can be a conductive polymer, such as a sulfonated form of PANI, PEDOT, polypyrrole, or any combination thereof. The optional layer 3532 may be formed over at least portions the substrate structure 3402, such as the transverse portions. The organic active layer 3734, 4034, 4036, 4038, or any combination thereof can be printed, such that it substantially prevents contact between the second electrode 4042 and the optional layer 3532, including over one or more of the transverse portions, to substantially prevent an electrical short or leakage path from forming.

8. Alternative Embodiments

The descriptions above can be performed using the printing apparatus 200. In another embodiment, at least one printing technique, or an equipment configuration, or any combination thereof previously described can be implemented with an ink-jet printer or the ink-jet printer can be modified to perform such printing techniques.

Other electronic devices may be formed in a similar manner, for example, the concepts described herein may be used to form a passive matrix display, an active matrix display, a sensor arrays, an array of photovoltaic cells, or any combination thereof. In addition, the concepts may be extended to the formation of another type of electronic component in which a layer is printed and lateral spreading of that printed layer is a concern.

The embodiments described herein can be extended to another type of printing, including printing using drops, such as ink-jet printing, or another discontinuous type of printing. The pattern for the printing may be linear, in more than one direction, or may even include a curved line a sharp bend, or a combination thereof as seen from a plan view of the substrate. The heating, cooling, or a combination of the two, as described above, can be implemented relatively easily within a printing apparatus, and in one embodiment, does not increase the process complexity of printing onto the substrate.

Note that not all of the activities described above in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining what activities can be used for their specific needs or desires.

In the foregoing specification, the invention has been described with reference to specific embodiments. However, one of ordinary skill in the art appreciates that one or more modifications or one or more other changes can be made without departing from the scope of the invention as set forth in the claims below. Accordingly, the specification and figures are to be regarded in an illustrative rather than a restrictive sense and any and all such modifications and other changes are intended to be included within the scope of invention.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

It is to be appreciated that certain features of the invention which are, for clarity, described above and below in the context of separate embodiments, may also be provided in combination in a single embodiment. Conversely, various features of the invention that are, for brevity, described in the context of a single embodiment, may also be provided separately or in any subcombination. Further, reference to values stated in ranges include each and every value within that range.

What is claimed is:

1. A process for forming an electronic device comprising:
   forming at least one first electrode over a workpiece;
   depositing a first layer over the at least one first electrode, wherein the first layer comprises a buffer layer, a charge-injecting layer, a charge-transport layer, a charge-blocking layer, or a combination thereof;
   placing the workplace onto a chuck with a printing apparatus;
   maintaining the chuck at a temperature in a range of approximately 5 to 80° C.;
   continuously printing a first liquid composition onto the first layer along a first segment while the chuck is at the temperature in the range of approximately 5 to 80° C.;
   curing the first liquid composition to form a first organic active layer;
   continuously printing a second liquid composition onto the first layer along a second segment while the chuck is at the temperature in the range of approximately 5 to 80° C., wherein:
      the second liquid composition is different from the first liquid composition; and
      the second segment is substantially parallel to the first segment;
   curing the second liquid composition to form a second organic active layer;
   continuously printing a third liquid composition onto the first layer along a third segment while the chuck is at the temperature in the range of approximately 5 to 80° C., wherein:
      the third liquid composition is different from each of the first and second liquid compositions; and
      the third segment is substantially parallel to the first segment;
   curing the third liquid composition to form a third organic active layer; and
   forming at least one second electrode over the first, second, and third organic active layers and the at least one first electrode.

2. The process of claim 1, further comprising continuously printing the first liquid composition onto the first segment along a fourth segment while the chuck is at the temperature in the range of approximately 5 to 80° C., wherein the first and fourth segments have lengths that are substantially parallel to each other.

3. The process of claim 2, wherein the first liquid composition has a solids content in a range of approximately 0.5 to 1.5 weight %.

4. The process of claim 2, wherein the first segment has a thickness in a range of approximately 10 to 30 nm, and the fourth segment has a thickness equal to or greater than the thickness of the first segment.

5. The process of claim 1, wherein the first liquid composition has a solids content of at least 2 weight %.

6. The process of claim 5, wherein forming the first organic active layer consists essentially of the first segment.

7. The process of claim 1, wherein the first liquid composition has a viscosity no greater than 5 centipoise.

8. The process of claim 1, wherein the first liquid composition comprises a liquid medium, wherein the liquid medium includes at least two solvents.

9. The process of claim 1, wherein the first liquid composition has a viscosity of at least 15 centipoise.

10. The process of claim 1, further comprising dispensing the first liquid composition through a nozzle having an opening with a diameter of at least 10 microns.

11. The process of claim 10, wherein:
    dispensing is performed at a volumetric flow rate in a range of approximately 50 to 300 microliters/min.; and
    during continuously printing the first liquid composition, a printing head travels at a velocity of at least 2 m/s.

12. The process of claim 11, wherein during continuously printing the first liquid composition, the first liquid composition is at a pressure in a range of approximately 100 to 350 KPa within the printing head.

13. The process of claim 1, wherein:
    the printing apparatus has a printing head; and
    during continuously printing the first liquid composition, a space between the printing head and the substrate is in a range of 0.9 micron to 2 mm.

14. The process of claim 1, wherein:
    the printing apparatus further comprises a printing head; and during continuously printing the first liquid composition, the printing head and the chuck are both moving.

15. The process of claim 1, wherein:

the printing apparatus further comprises a printing head; and during continuously printing the first liquid composition, the printing head, the chuck, or both are configured to allow motion along two different axes.

16. The process of claim 1, wherein during continuously printing the first liquid composition, the workpiece does not include a liquid containment structure.

17. The process of claim 1, wherein during continuously printing the first liquid composition, the workpiece comprises a liquid containment structure.

18. The process of claim 17, further comprising surface treating the liquid containment structure before during continuously printing the first liquid composition.

19. The process of claim 17, wherein the liquid containment structures does not receive a surface treatment before during continuously printing the first liquid composition.

20. The process of claim 1, further comprising continuously printing onto the chuck.

21. The process of claim 1, wherein curing the first liquid composition, curing the second liquid composition, and curing the third liquid composition are performed at substantially a same time.

22. The process of claim 1, wherein depositing the first layer comprising depositing the first layer over substantially all of the workpiece.

23. The process of claim 1, wherein depositing the first layer comprises continuously printing the first layer.

24. The process of claim 1, wherein:

forming the at least one first electrode comprises forming a plurality of first electrodes, wherein each electronic component within an array include one of the first electrodes; and forming the at least one second electrode comprising forming a common second electrode for the electronic components within the array.

25. The process of claim 1, wherein the first layer comprises a conductive polymer.

26. The process of claim 1, wherein:

the process further comprises forming a well structure over the workpiece after forming the at least one first electrode, wherein openings within the well structure expose portions of the at least one first electrode;

depositing the first layer comprises depositing the first layer the first layer comprises a conductive organic material within the openings and over portions of the well structure between the openings; and continuously printing the first, second, and third liquid compositions is performed such that the at least one second electrode does not contact the first layer.

27. The process of claim 1, wherein the electronic device is a bottom emission electronic device.

28. The process of claim 1, wherein the electronic device is a top emission electronic device.

29. The process of claim 28, further comprising forming power transmission lines that are connected to the at least first electrode, the at least one second electrode, or a combination thereof, wherein forming the power transmission lines is performed after forming the at least one first electrodes.

* * * * *